US007233713B2

(12) United States Patent
Blauvelt et al.

(10) Patent No.: US 7,233,713 B2
(45) Date of Patent: *Jun. 19, 2007

(54) ETCHED-FACET SEMICONDUCTOR OPTICAL COMPONENT WITH INTEGRATED END-COUPLED WAVEGUIDE AND METHODS OF FABRICATION AND USE THEREOF

(75) Inventors: Henry A. Blauvelt, San Marino, CA (US); David W. Vernooy, Sierra Madre, CA (US); Joel S. Paslaski, Alhambra, CA (US); Charles I. Grosjean, Pasadena, CA (US); Hao Lee, Arcadia, CA (US); Franklin G. Monzon, Temple City, CA (US); Katrina H. Nguyen, San Jose, CA (US)

(73) Assignee: Xponent Photonics Inc., Monrovia, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/328,406

(22) Filed: Jan. 9, 2006

(65) Prior Publication Data

US 2006/0110100 A1 May 25, 2006

Related U.S. Application Data

(63) Continuation of application No. 10/759,858, filed on Jan. 16, 2004, now Pat. No. 6,985,646.

(60) Provisional application No. 60/442,288, filed on Jan. 24, 2003, provisional application No. 60/462,600, filed on Apr. 11, 2003, provisional application No. 60/466,799, filed on Apr. 29, 2003.

(51) Int. Cl.
*G02B 6/00* (2006.01)
*G02B 6/12* (2006.01)
*G02B 6/13* (2006.01)

(52) U.S. Cl. .......................... 385/14; 385/15; 385/31; 385/129; 438/31

(58) Field of Classification Search ................ 385/14, 385/15, 31, 43, 49, 129–132; 372/7, 108, 372/164; 257/98, 432; 438/31
See application file for complete search history.

(56) References Cited

U.S. PATENT DOCUMENTS

| 3,948,583 | A | 4/1976 | Tien |
|---|---|---|---|
| 4,811,352 | A | 3/1989 | Suzuki et al. |
| 4,969,712 | A | 11/1990 | Westwood et al. |
| 5,032,219 | A | 7/1991 | Buchman et al. |
| 5,103,493 | A | 4/1992 | Buchman et al. |
| 5,259,049 | A | 11/1993 | Bona et al. |
| 5,265,177 | A | 11/1993 | Cho et al. |
| 5,402,511 | A | 3/1995 | Malone et al. |
| 6,040,246 | A | 3/2000 | Goldstein et al. |
| 6,064,783 | A | 5/2000 | Congdon et al. |
| 6,157,760 | A | 12/2000 | Fujita et al. |
| 6,163,631 | A | 12/2000 | Kawanishi et al. |
| 6,212,323 | B1 | 4/2001 | Harpin et al. |
| 6,243,517 | B1 | 6/2001 | Deacon |
| 6,266,468 | B1 | 7/2001 | Rickman et al. |
| 6,282,219 | B1 | 8/2001 | Butler et al. |
| 6,293,688 | B1 | 9/2001 | Deacon |
| 6,321,011 | B2 | 11/2001 | Deacon |
| 6,324,204 | B1 | 11/2001 | Deacon |
| 6,341,189 | B1 | 1/2002 | Deacon |
| 6,373,872 | B2 | 4/2002 | Deacon |
| 6,393,185 | B1 | 5/2002 | Deacon |
| 6,393,186 | B1 | 5/2002 | Deacon |
| 6,483,968 | B2 | 11/2002 | Fuse et al. |
| 6,917,636 | B2 | 7/2005 | Blauvelt et al. |
| 6,985,646 | B2 * | 1/2006 | Blauvelt et al. .............. 385/14 |
| 2002/0154848 | A1 | 10/2002 | Shimonaka et al. |
| 2003/0081902 | A1 | 5/2003 | Blauvelt et al. |
| 2003/0128907 | A1 | 7/2003 | Kikuchi et al. |
| 2004/0037342 | A1 | 2/2004 | Blauvelt et al. |
| 2004/0165812 | A1 | 8/2004 | Blauvelt et al. |
| 2005/0207464 | A1 | 9/2005 | Blauvelt et al. |
| 2005/0213889 | A1 | 9/2005 | Blauvelt et al. |

FOREIGN PATENT DOCUMENTS

| JP | 62269907 A | 11/1987 |
|---|---|---|
| JP | 182882 A | 7/1988 |

OTHER PUBLICATIONS

, International Search Report and Written Opinion fr App. No. PCT/US04/01207, , p. 13 pages total.

Ahn et al, Uniform and High Coupling Efficiency Between InGaAsP-InP Buried Heterostructure Optical Amplifier and Monolithically . . . , IEEE Photonics Technology Letters, Feb. 1996, pp. 200-202, vol. 8, No. 2.

Bazylenko et al, Fabrication of Light-Turning Mirrors in Buried-Channel silica Waveguides for Monolithic and Hybrid Integration, Journal of Lightwave Technology, Jan. 1997, pp. 148-153, vol. 15, No. 1.

Bona et al, Beam Properties of AlGaAs Power Lasers with High-Quality Etched Mirrors, IEEE Photonics Technology Letters, May 1991, pp. 412-414, Vol. 3, No. 5.

Bouadma et al, Integration of laser Diode With a Polymer-Based Waveguide for Photonic Integrated Circuits, IEEE Photonics Technology Letters, Oct. 1994, pp. 1188-1190, vol. 6, No. 10.

Buus et al, Spot Size Expansion for Laser-to-Fiber Coupling Using an Integrated Mutilmode Coupler, Journal of Lightwave Technology, Apr. 1993, pp. 582-588, vol 11, No. 4.

Dalgoutte et al, Externally mounted fibers for integrated optics, Applied Optics, Aug. 1, 1975, pp. 1860-1865, vol. 14, No. 8.

Horst et al, High-Reflectance Dielectric Mirrors Deposited by PECVD on GaAs-AlGaAs Semiconductor Lasers with IC Plasma Etched Facets, IEEE Phototonics Technology Letters, Oct. 2000, pp. 1325-1327, vol. 12, No. 10.

Karouta et al, Fabrication of Short GaAs Wet-Etched Mirror Lasers and Their Complex Spectral Behavior, IEEE Journal of Quantum Electronics, Aug. 1998, pp. 1474-1479, vol. 34, No. 8.

Laurent-Lund et al, PECVD Grown Multiple Core Planner Waveguides with Extremely Low Interface Reflections and Losses, IEEE Photonics Technology Letters, Oct. 1998, pp. 1431-1433, vol. 10, No. 10.

Soldano et al, Optical Multi-Mode Interference Devices Based on Slef-Imaging; Principles and Applications, Journal of Lightwave Technology, Apr. 1995, pp. 615-627, vol. 13, No. 4.

Uchida et al, An AlGaAs Laser with High-Quality Dry Etched Mirrors Fabricated Using UHV In Situ Dry Etching and Deposition . . . System, IEEE Journal of Quantum Electronnics, Nov. 1988, pp. 2170-2177, vol. 24, No. 11.

Vettiger et al, Full-Wafer Technology—A New Approach to Large-Scale Laser Fabrication and Integration, IEEE Journal of Quantum Electronics, Jun. 1991, pp. 1319-1331, vol. 27, No. 6.

Alferov et al, Monolithically-integrated hybrid heterostructure diode laser with dielectric-film waveguide DBR, IEEE J Quantum Electronics, vol. QE-23, No. 6, p. 869 (Jun. 1987).

* cited by examiner

*Primary Examiner*—Michelle Connelly-Cushwa
(74) *Attorney, Agent, or Firm*—David S. Alavi; Christie Parker & Hale LLP

(57) ABSTRACT

An optical apparatus comprises a semiconductor optical device waveguide formed on a semiconductor substrate, and an integrated end-coupled waveguide formed on the semiconductor substrate. The integrated waveguide may comprise materials differing from those of the device waveguide and the substrate. Spatially selective material processing may be employed for first forming the optical device waveguide on the substrate, and for subsequently depositing and forming the integrated end-coupled waveguide on the substrate. Spatially selective material processing enables accurate spatial mode matching and transverse alignment of the waveguides, and multiple device waveguides and corresponding integrated end-coupled waveguides may be fabricated concurrently on a common substrate on a wafer scale. The integrated end-coupled waveguide may be adapted for fulfilling one or more functions, and the device waveguide and/or integrated waveguide and/or spatially selective material processing steps may be adapted in a variety of ways for achieving the needed/desired degree of end-coupling.

78 Claims, 27 Drawing Sheets

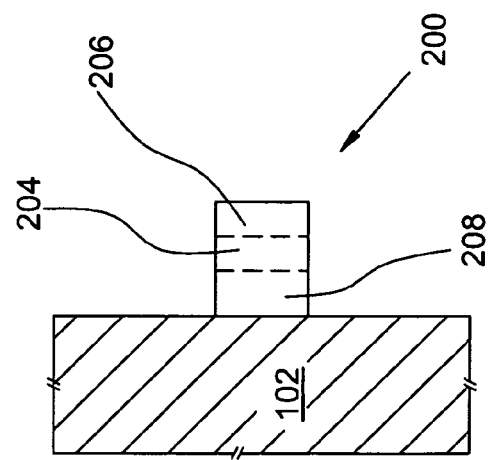
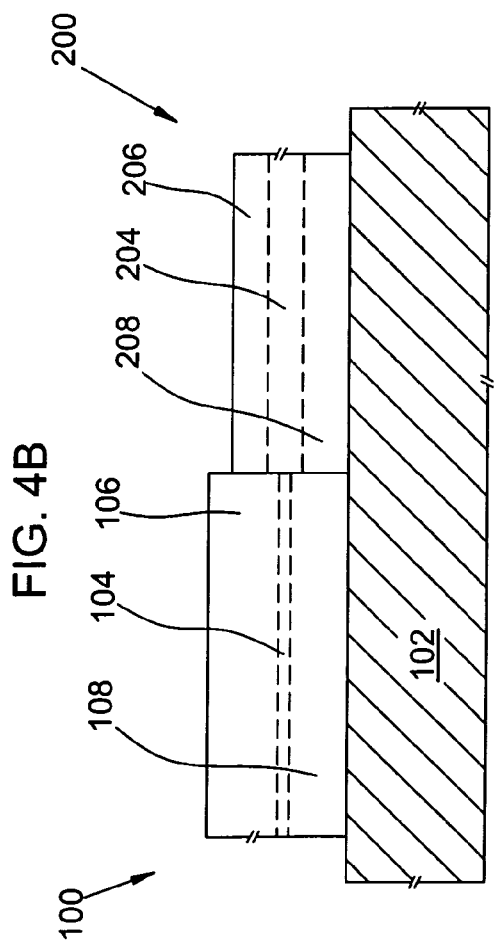
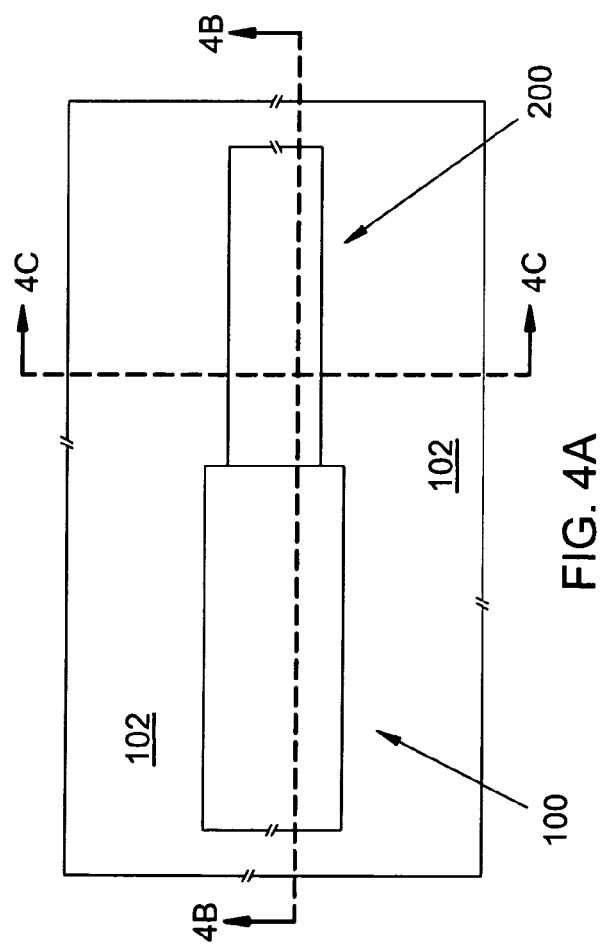

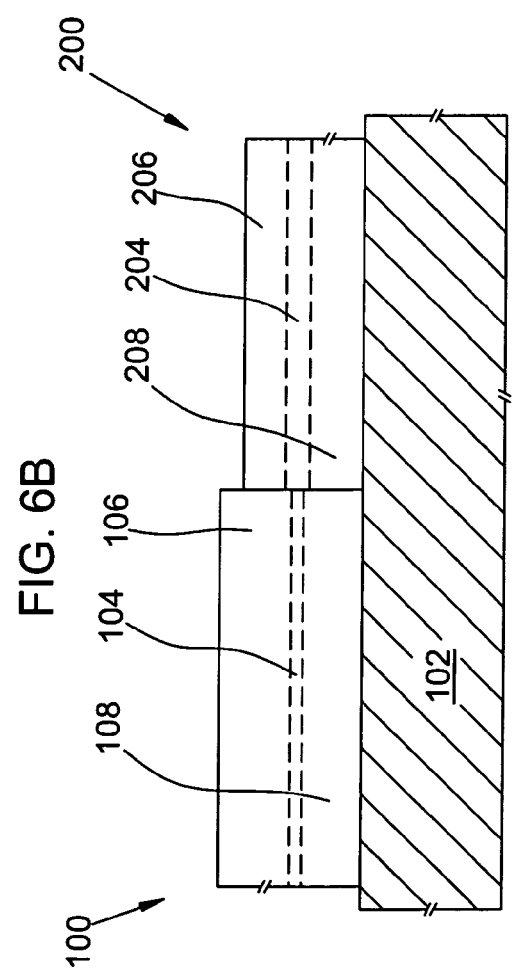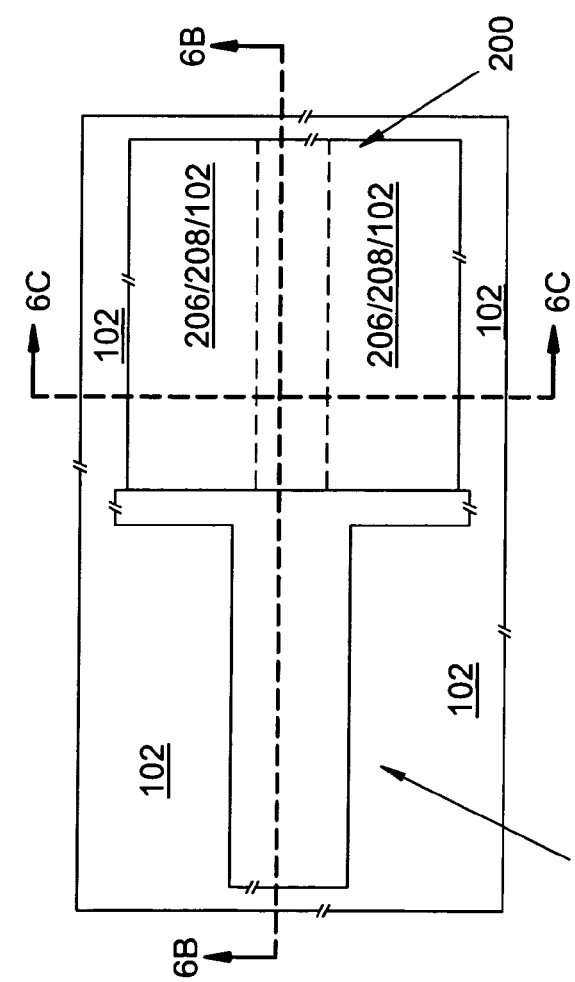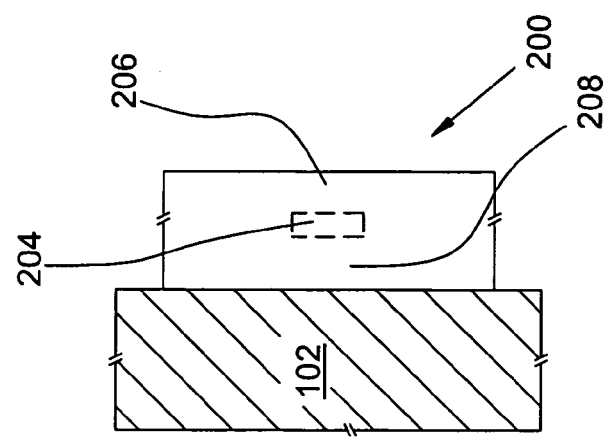

ETCHED-FACET SEMICONDUCTOR OPTICAL COMPONENT WITH INTEGRATED END-COUPLED WAVEGUIDE AND METHODS OF FABRICATION AND USE THEREOF

RELATED APPLICATIONS

This application is a continuation of U.S. non-provisional application Ser. No. 10/759,858 filed Jan. 16, 2004 (now U.S. Pat. No. 6,985,646 issued Jan. 10, 2006), which in turn claims benefit of (i) U.S. provisional App. No. 60/442,288 filed Jan. 24, 2003, (ii) U.S. provisional App. No. 60/462,600 filed Apr. 11, 2003, and (iii) U.S. provisional App. No. 60/466,799 filed Apr. 29, 2003, each of said non-provisional and provisional applications being hereby incorporated by reference as if fully set forth herein.

BACKGROUND

The field of the present invention relates to semiconductor optical devices. In particular, etched-facet semiconductor optical devices including integrated optical waveguides are described herein.

Various optical devices might include a semiconductor optical device and an integrated end-coupled waveguide formed on a common substrate. Spatially selective material processing is typically employed to form the semiconductor optical device on a semiconductor substrate. Additional spatially selective material processing steps are typically employed for forming the integrated waveguide (which may comprise different materials, such as silica or other low-index materials) on the semiconductor substrate. The accuracy that may be achieved using spatially selective material processing enables sufficiently accurate spatial mode matching and transverse alignment for achieving end-coupling efficiency at or above operationally acceptable levels for many optical device applications. Set forth hereinbelow are a variety of structures, and spatially selective material processing sequences for forming them, for optical devices and integrated end-coupled waveguides. Spatially selective material processing may be employed for forming concurrently multiple optical devices with corresponding integrated waveguides on a common device substrate.

SUMMARY

An optical apparatus comprises a semiconductor optical device waveguide formed on a semiconductor substrate, and an integrated end-coupled waveguide formed on the semiconductor substrate. The integrated waveguide may typically comprise materials differing from those of the device waveguide and the substrate, including silica, silica-based materials, other glasses, silicon nitride and oxynitrides, polymers, other low-index materials, and so on. Spatially selective material processing may be employed for first forming the optical device waveguide on the substrate, and for subsequently depositing and forming the integrated end-coupled waveguide on the substrate. Spatially selective material processing techniques enable sufficiently accurate spatial mode matching and transverse alignment of the device waveguide and integrated waveguide. Multiple device waveguides and corresponding integrated end-coupled waveguides may be fabricated concurrently on a common substrate by spatially selective material processing on a wafer scale.

The integrated end-coupled waveguide may be adapted for fulfilling one or more functions, including (but not limited to): transfer of optical power between the optical device and an optical transmission component through the integrated waveguide, by end-coupling or side-coupling; spatial mode matching; modal index matching; adiabatic side coupling; spatial mode control/modification; optical frequency control/modification; and so on. The end face of the device waveguide and/or the proximal portion of the integrated waveguide, and/or spatially selective material processing steps for forming the same, may be adapted in a variety of ways for achieving the needed/desired degree of end-coupling between the device waveguide and the integrated waveguide. Such adaptations may include (but are not limited to): providing a laterally expanded device waveguide end face for enhanced optical surface quality; providing a curved and/or tilted device waveguide end face; providing optical coating(s) for the device waveguide end face; providing a transversely flared device waveguide end segment for increasing transverse mode size and thereby decreasing diffractive loss; providing reflective coating layer(s) between the substrate and the integrated waveguide for reducing optical leakage into the substrate; reducing or substantially eliminating segments of the waveguides lacking substantially complete transverse optical confinement; reducing or substantially eliminating any integrated waveguide material deposited on the device waveguide end face; and so on.

Objects and advantages associated with etched-facet optical components with integrated end-coupled waveguides may become apparent upon referring to the disclosed exemplary embodiments as illustrated in the drawings and disclosed in the following written description and/or claims.

BRIEF DESCRIPTION OF THE DRAWINGS

FIGS. 2A and 2B are side and top views, respectively, illustrating exemplary spatially selective material processing for forming an exemplary device waveguide, while

FIGS. 4A, 4B, and 4C are top, side cross section, an end cross section views of an exemplary optical device with an integrated waveguide.

FIGS. 6A, 6B, and 6C are top, side cross section, an end cross section views of an exemplary optical device with an integrated waveguide.

It should be noted that the relative proportions of various structures shown in the Figures may be distorted to more clearly illustrate the present invention. Relative dimensions of various optical devices, optical waveguides, optical fibers, optical components, optical modes, alignment/support members, grooves, and so forth may be distorted, both relative to each other as well as in their relative transverse and/or longitudinal proportions. In many of the Figures the transverse dimension of an optical element is enlarged relative to the longitudinal dimension for clarity, which will cause variations of transverse dimension(s) with longitudinal position to appear exaggerated.

The embodiments shown in the Figures are exemplary, and should not be construed as limiting the scope of the present invention as disclosed and/or claimed herein.

DETAILED DESCRIPTION OF EMBODIMENTS

Figure 1A:
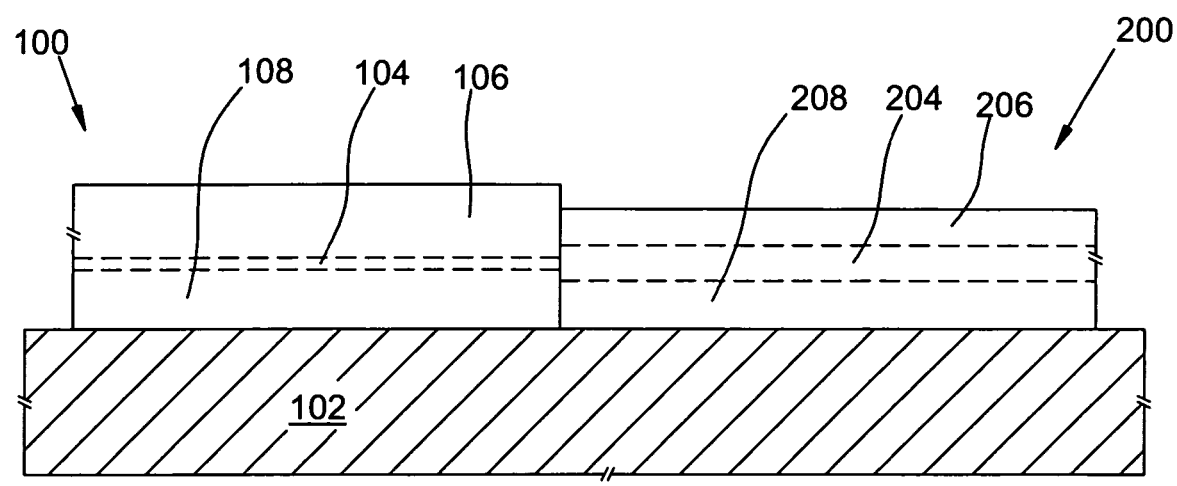
FIGS. 1A and 1B are side and top views, respectively, of an exemplary embodiment of an optical device and integrated waveguide.
Figure 1B:
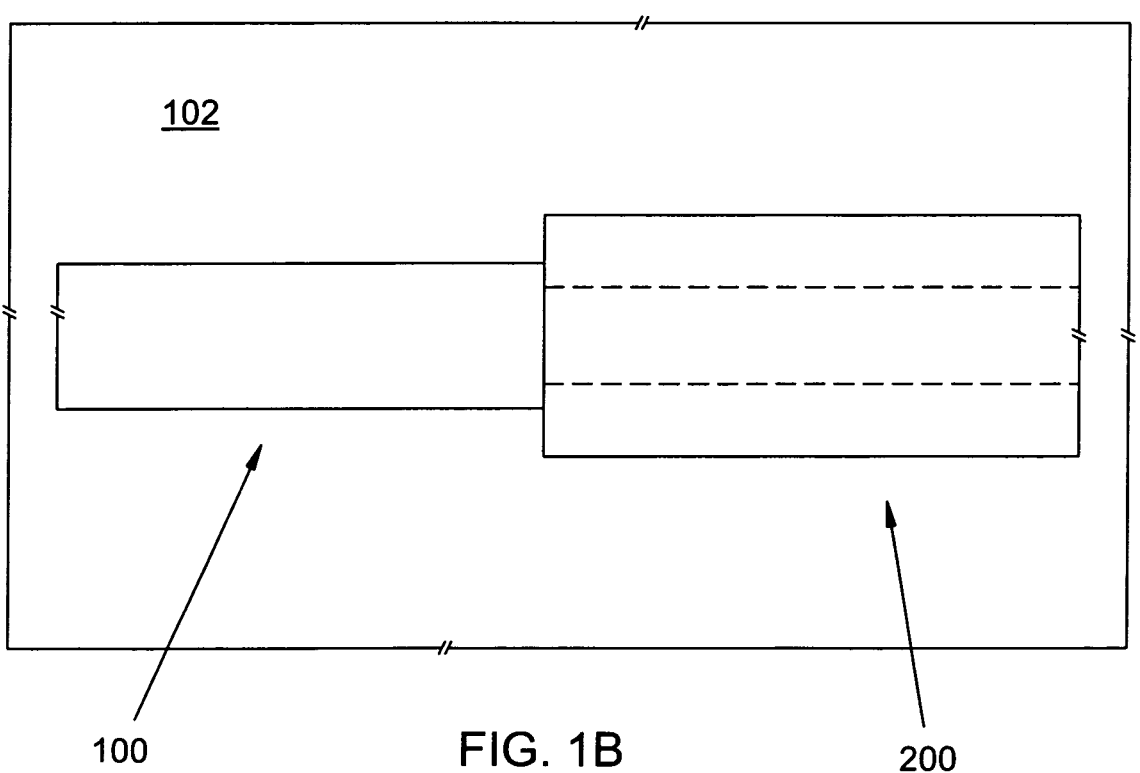

An exemplary embodiment of a semiconductor optical device and an integrated end-coupled optical waveguide 200 is shown in FIGS. 1A/1B. The optical device and waveguide 200 are each shown as a planar waveguide on semiconductor substrate wafer 102. For forming the semiconductor optical device, a series of semiconductor layers are deposited, grown, and/or otherwise formed on a semiconductor substrate wafer 102. These layers may include a device functional layer 104 between upper device layer 106 and lower device layer 108. Device functional layer 104 may provide active and/or passive optical device functionality. Upper device layer 106 and lower device layer 108 may each include one or more semiconductor layers adapted in any suitable manner for providing substantial optical confinement of device optical modes in vertical directions, and for applying drive or control signals to device functional layer 104 for providing active optical device functionality (if such active functionality is present). In some instances lower device layer 108 may simply comprise substrate material, with no actual boundary between layer 108 and substrate 102. Substantial optical confinement in vertical directions may be achieved in a variety of ways, including but not limited to: index contrast between layer 104 and layers 106 and/or 108, single-layer and/or multi-layer reflection from layers 106 and/or 108, and so on. Upper and lower device layers 106/108 may be substantially identical, or may differ (in thickness, index, material(s), and/or structure) depending on the particular requirements for the optical device.

Figure 2A:
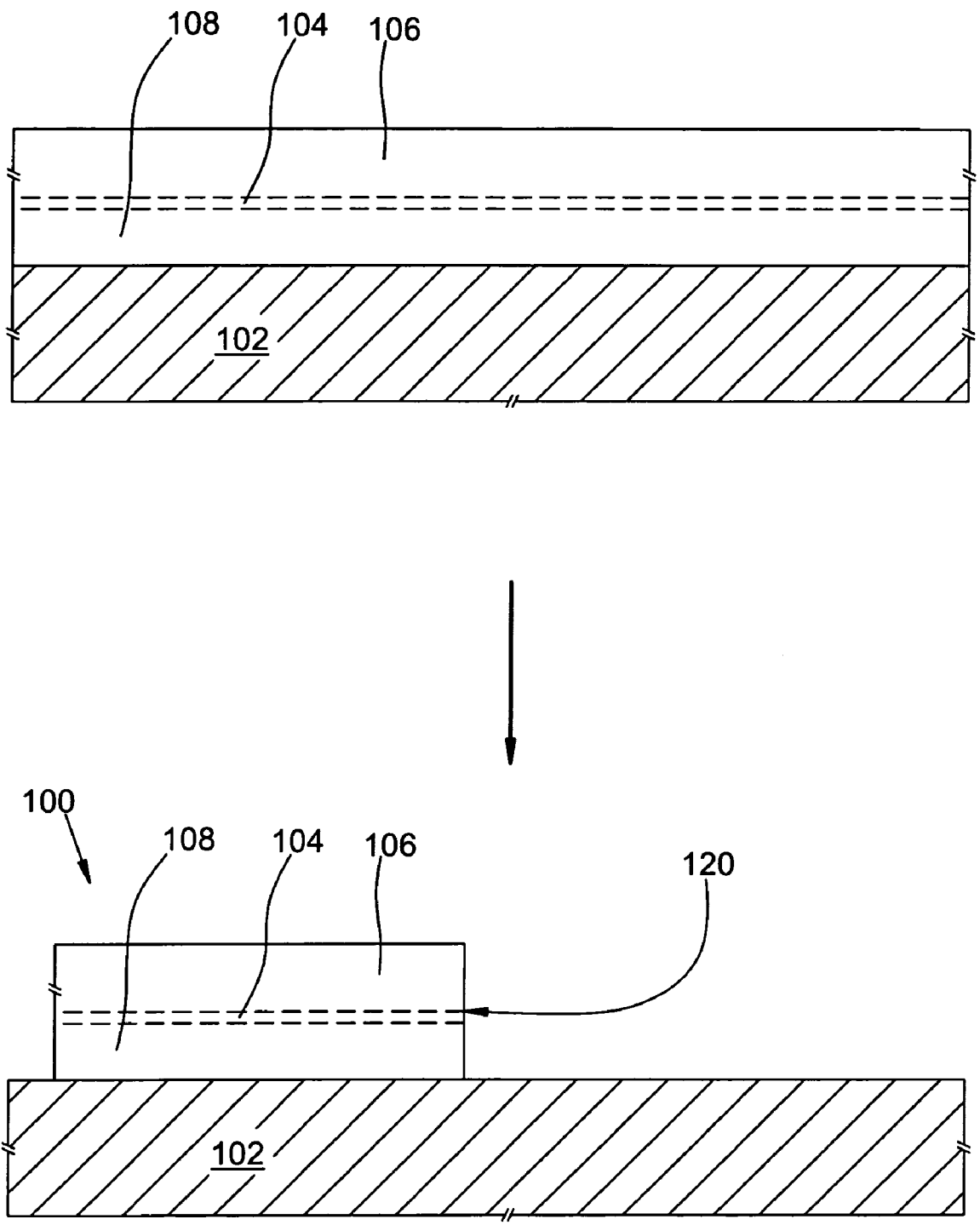
Figure 2B:
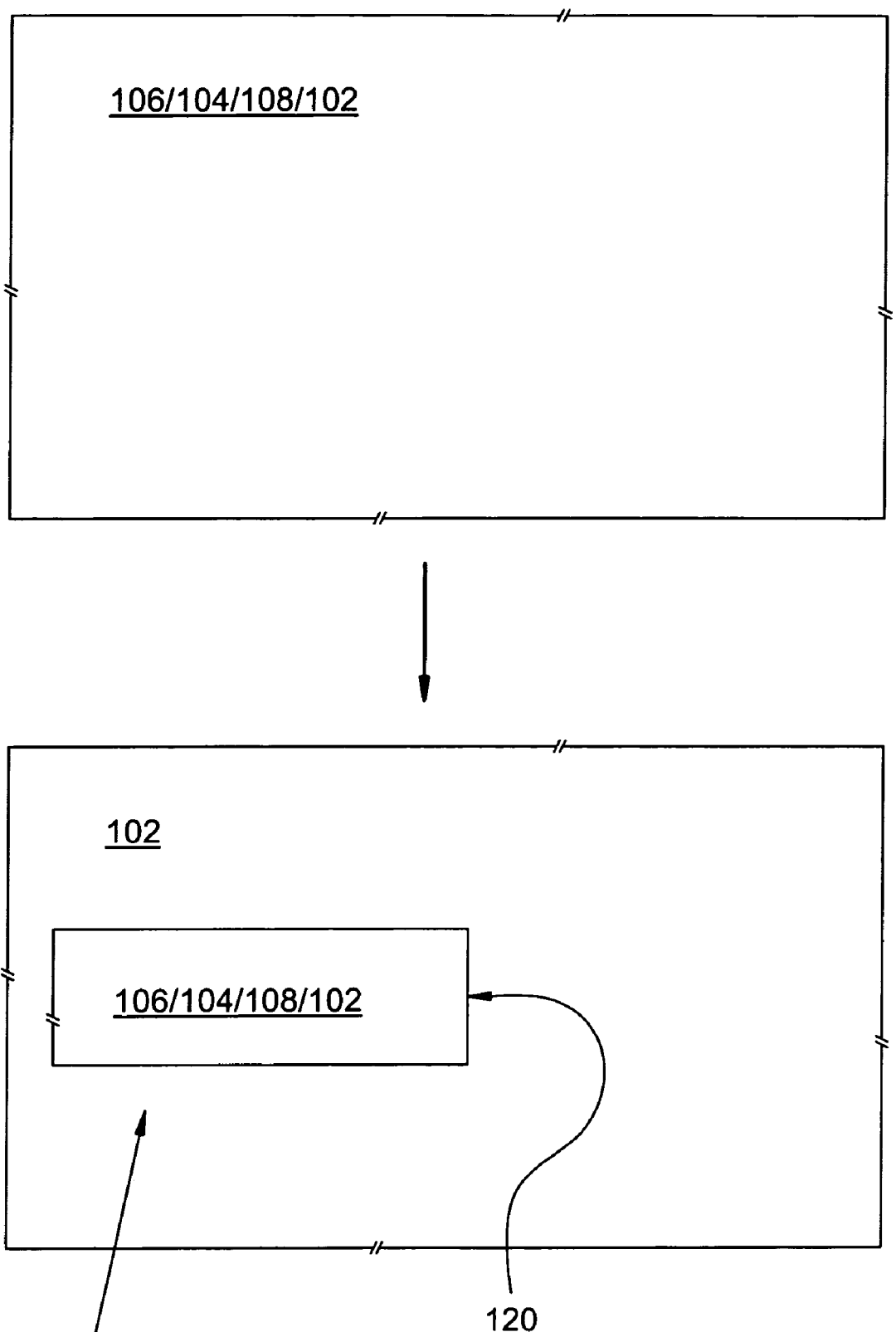
Figure 2C:
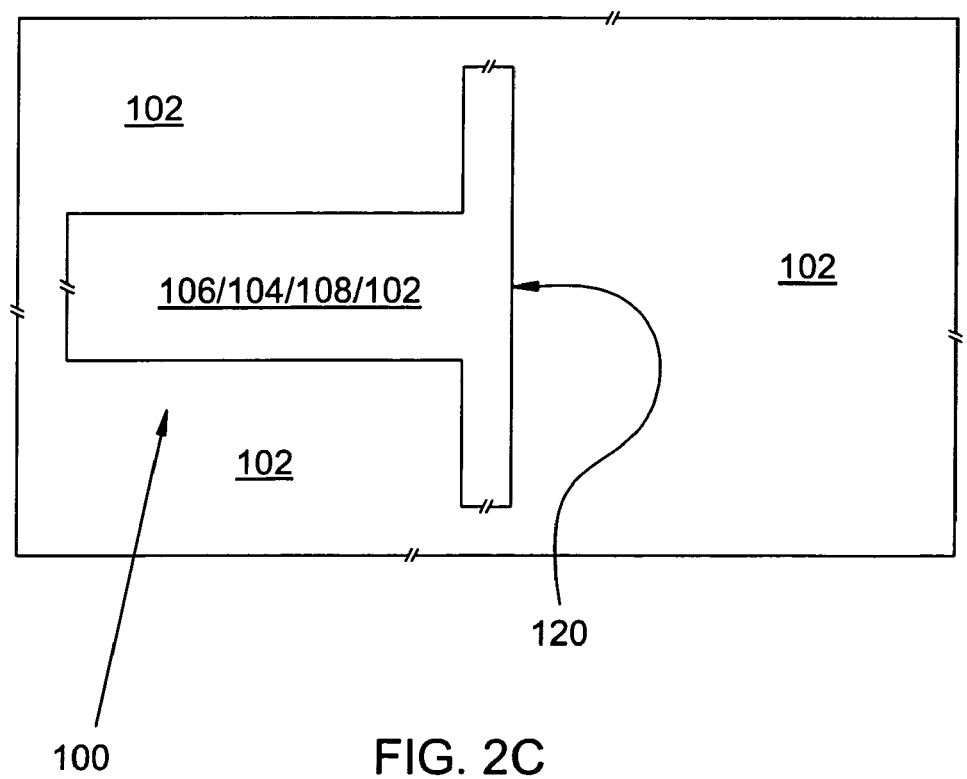
FIG. 2C is a top view of an alternative exemplary device waveguide.
Figure 5C:
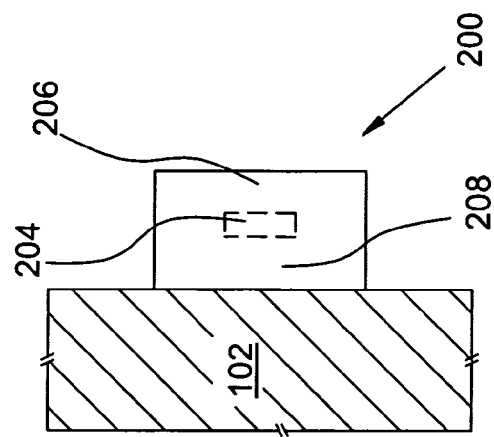
FIGS. 5A, 5B, and 5C are top, side cross section, an end cross section views of an exemplary optical device with an integrated waveguide.
Figure 5B:
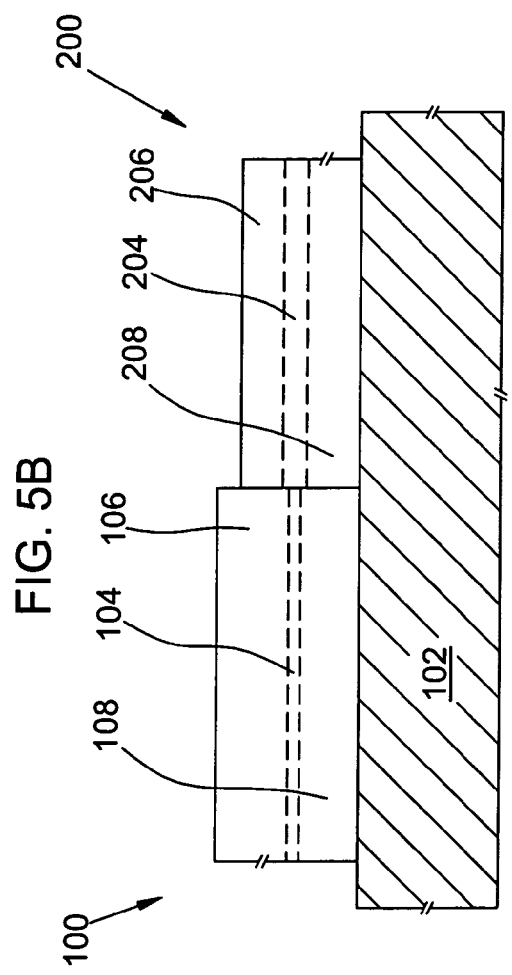
Figure 5A:
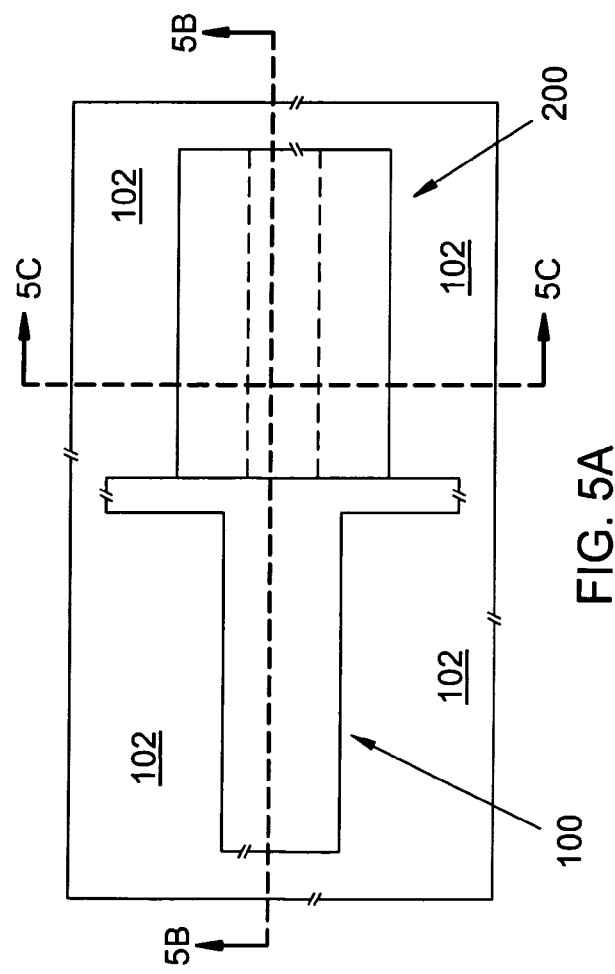

Spatially selective material processing steps of any suitable type are employed for providing substantial optical confinement of device optical modes in lateral directions, thereby forming a device planar waveguide structure 100. Substantial optical confinement in lateral directions may be achieved in a variety of ways, including but not limited to: index contrast between medial and lateral portions of layers 104, 106, and/or 108; physical and/or chemical modification of medial and/or lateral portions of layers 104, 106, and/or 108; removal of lateral portions of (i) an upper portion of layer 106, (ii) layer 106 and an upper portion of layer 104, (iii) layers 106 and 104 and an upper portion of layer 108, or (iv) all of layers 104, 106, and 108 (as in FIGS. 2A/2B/ 2C); replacement of lateral layer portions thus removed with lower-index lateral cladding material; single-layer and/or multi-layer reflection from coatings applied to lateral surfaces of the device waveguide 100; substantially surrounding portions of the device waveguide 100 with lower-index media (including vacuum, air, inert gas, encapsulation media, and so forth); gain guiding by spatially-selective current injection into a semiconductor laser gain medium; and other suitable means. Spatially selective material processing steps of any suitable type may be employed for forming an end face at one or both ends of the device waveguide 100 (only one end face is shown in FIGS. 1A/B and 2A/2B/2C). In FIGS. 2A and 2B, the end face 120 is shown formed by simple termination of the end of device waveguide 100. In FIG. 2C, the end face 120 is shown adapted for providing improved planarity. The spatially selective material processing steps employed for providing lateral optical confinement and for providing the device end face(s) may be concurrent or sequential. Multiple semiconductor optical devices may be fabricated concurrently on a common semiconductor substrate.

End face 120 of the device waveguide 100 is formed using spatially selective material processing steps, particularly such steps as may be implemented on a wafer scale prior to dividing the wafer into bars or into individual device chips. An end face thus formed may also be referred to herein as an etched facet or an etched end face, although etching processes may comprise only one group among many spatially selective material processing techniques suitable for forming the end face. Use of the terms "etched facet" or "etched end face" should not be construed as limiting the scope of the present disclosure and/or appended claims to only end faces formed by etching.

Figure 3A:
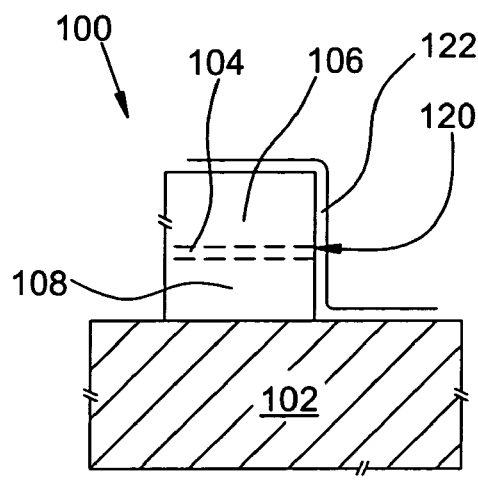
FIGS. 3A and 3B are side views of the ends of exemplary device waveguides including optical coatings.
Figure 3B:
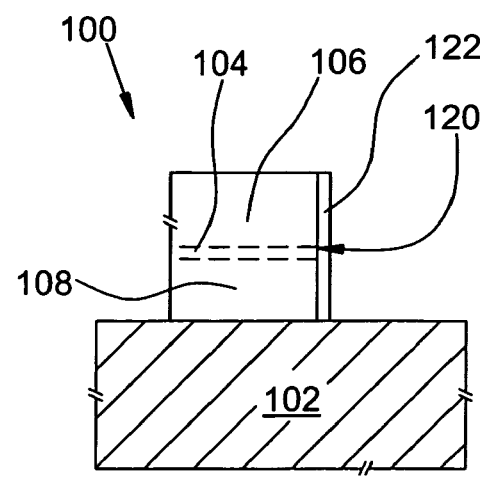

In some instances it may be necessary or desirable to provide an optical coating on end face 120, between device waveguide 100 and integrated end-coupled waveguide 200. Once end face 120 has been formed on device waveguide 100, one or more optical coating layers 122 may be applied thereto prior to fabrication of an integrated end-coupled waveguide 200. Such coating layers are applied using spatially selective material processing, and may be applied on a wafer scale to the end faces of many device waveguides simultaneously. Deposition of coating layer(s) 122 onto end face 120 typically results in deposition of coating material(s) on adjacent areas of substrate 102 and the top of the device waveguide 100 (FIG. 3A). If this is the case, it may be necessary or desirable in some circumstances to remove (by suitable additional spatially selective material processing steps) these adjacent areas of coating material (FIG. 3B) prior to fabrication of the integrated end-coupled waveguide 200, particularly coating material deposited on substrate 200. In other circumstances these additional coating areas may be left intact, and the coating material(s) on substrate 200 may be incorporated into a proximal end of the integrated end-coupled waveguide 200 upon its fabrication.

Once device waveguide 100 and end face 120 have been formed using spatially selective material processing techniques, and coating layer(s) 122 (if any) applied to end face 120, an integrated end-coupled planar optical waveguide 200 may be fabricated on semiconductor substrate wafer 102 (exemplary embodiments are shown in FIGS. 1A/1B, 4A/4B/4C, 5A/5B/5C, and 6A/6B/6C). Integrated waveguide 200 comprises waveguide core 204 and upper and lower waveguide cladding layers 206/208. Upper and lower waveguide cladding layers 206/208 may each include one or more layers adapted in any suitable way for providing substantial optical confinement of waveguide optical modes in vertical directions. Substantial optical confinement in vertical directions may be achieved in a variety of ways, including but not limited to: index contrast (between core 204 and cladding layers 206 and/or 208), single-layer and/or multi-layer reflection from layers 206 and/or 208, and so on. Upper and lower cladding layers 206/208 may be substantially identical, or may differ (in thickness, index, material(s), and/or structure) depending on the particular requirements for waveguide 200. Spatially selective material processing steps of any suitable type are employed for providing substantial optical confinement of waveguide optical modes in lateral directions. Substantial optical confinement in lateral directions may be achieved in a variety of ways, including but not limited to: index contrast between medial and lateral portions of layers 204, 206, and/or 208; physical and/or chemical modification of medial and/or lateral portions of layers 204, 206, and/or 208; removal of lateral portions of (i) an upper portion of layer 206, (ii) layer 206 and an upper portion of layer 204, (iii) layers 206 and 204 and an upper portion of layer 208, or (iv) all of layers 204, 206, and 208; replacement of lateral layer portions thus removed with lower-index lateral cladding material; single-layer and/or multi-layer reflection from coatings applied to lateral surfaces of the end-coupled waveguide 200; surrounding (at least in part) portions of the end-coupled waveguide 200 with lower-index media (including vacuum, air, inert gas, encapsulation media, and so forth); and other suitable means.

The accuracy and precision of spatially selective material processing techniques enable substantial spatial mode matching of device-supported and waveguide-supported optical modes, and enable sufficiently accurate alignment of optical waveguide 200 with respect to the device waveguide 100 in both vertical and horizontal directions. The required end-coupling efficiency (i.e., end-coupling efficiency at or above an operationally acceptable level) determines to what extent the device and waveguide optical modes must be spatially mode matched. The device waveguide 100 and the end-coupled waveguide 200 may be designed to support optical modes that are substantially spatially mode matched to within the accuracy limits of the spatially selective material processing steps employed for their fabrication (typically on the order of 0.2 µm or better horizontally and 0.1 µm or better vertically for many such process steps). The accuracy required for relative lateral and vertical alignment is determined by the respective device and waveguide transverse mode sizes, and the operationally acceptable optical coupling level required for a particular use of the device and integrated waveguide. Alignment accuracy on the order of 0.1 µm may be required for alignment of the device waveguide 100 and the integrated waveguide 200 under the most stringent circumstances (i.e., under operational conditions requiring near-unity end-coupling efficiencies), and such alignment accuracy is readily attained using spatially selective material processing techniques. Moreover, spatially selective material processing techniques may be employed for achieving the required alignment accuracy on a wafer scale for multiple semiconductor optical device waveguides 100 and corresponding integrated end-coupled optical waveguides 200 on a common substrate wafer 102.

In an exemplary process for forming an integrated end-coupled optical waveguide (FIG. 7), a lower waveguide cladding layer 208 is first deposited (after forming waveguide 100 and end face 120). This typically results in deposition of the lower cladding material(s) also on the end face 120 (or on any coating layer(s) thereon) and on the top of at least an end portion of the device waveguide 100. Directional properties of the deposition process and the orientation of substrate 102 relative to the deposition source determine the thickness of the lower cladding material deposited on the device end face 120 relative to the thickness of the lower waveguide cladding layer 208. For example, the thicknesses may be substantially equal in thickness for a substantially conformal deposition process on a substrate oriented substantially perpendicularly relative to the deposition source, while the thicknesses may substantially differ for a highly directional deposition process. The thickness of the lower waveguide cladding layer 208 is chosen to achieve substantial vertical alignment, within operationally acceptable tolerances, between a device-supported optical mode and a corresponding waveguide-supported optical mode (once fabrication of waveguide 200 is complete). The thickness of lower waveguide cladding layer 208 therefore may or may not correspond to the thickness of lower device layer 108, depending on the structural details and optical design of device waveguide 100 and integrated waveguide 200.

After deposition of lower waveguide cladding layer 208, waveguide core 204 may be deposited over layer 208. This typically results in deposition of the waveguide core material(s) also on the end face 120 and on the top of at least an end portion of the device waveguide 100 (over lower cladding material(s) already deposited). As described in the preceding paragraph, directional properties of the deposition process and the orientation of substrate 102 relative to the deposition source determine the thickness of the core material deposited on the device end face 120 relative to the thickness of the waveguide core layer 204. An upper waveguide cladding layer 206 is deposited over core 204. This typically results in deposition of the upper cladding material(s) also on the end face 120 and on the top of at least an end portion of the device waveguide 100 (over the lower cladding and core material(s) already deposited). As described in the preceding paragraph, directional properties of the deposition process and the orientation of substrate 102 relative to the deposition source determine the thickness of the upper cladding material deposited on the device end face 120 relative to the thickness of the waveguide upper cladding layer 206. Upper waveguide cladding layer 206 need only be thick enough (or otherwise suitably adapted) for ensuring substantial optical confinement of waveguide optical modes from above. Portions of layers 208, 204, and/or 206 deposited on device waveguide end face 120 results on a proximal end segment 201 of integrated waveguide 200 that may lack substantially complete transverse optical confinement of an optical mode. Such a waveguide segment may result in diffractive optical loss, and may require structural adaptations of device waveguide 100 and/or integrated waveguide 200, and/or adaptations of spatially selective material processing procedures used to form the same (described further hereinbelow).

Spatially selective material processing is employed, at one or more stages during the deposition of layers 204, 206, and/or 208 for providing lateral optical confinement of waveguide optical modes as described hereinabove. Vertical and lateral dimensions, positions, and structural details of layers 204, 206, and/or 208 at and near the proximal end of waveguide 200 (i.e., the end-coupled end adjacent the optical device waveguide 100) are chosen so as to result in the required degree of transverse alignment and spatial mode matching, within operationally acceptable tolerances, between device and waveguide optical modes (once the waveguide fabrication is complete).

Variations on the generic structure of the semiconductor optical device waveguide 100 and integrated end-coupled optical waveguide 200 as described hereinabove, and variations on the generic methods for fabricating the same, are manifold, and choice of a particular structure and/or fabrication method depends on the particular structural and/or performance requirements, design constraints, cost and/or other manufacturing restrictions, and so forth that may apply for a given semiconductor optical device and/or its fabrication and/or its use. A sampling of various exemplary semiconductor optical devices, uses thereof, and corresponding variations in structure and/or fabrication methods thereof, is set forth hereinbelow. Variations of structure and/or fabrication of a semiconductor optical device and integrated end-coupled optical waveguide not explicitly set forth hereinbelow may nevertheless fall within the scope of the present disclosure and/or the appended claims.

Figure 31:
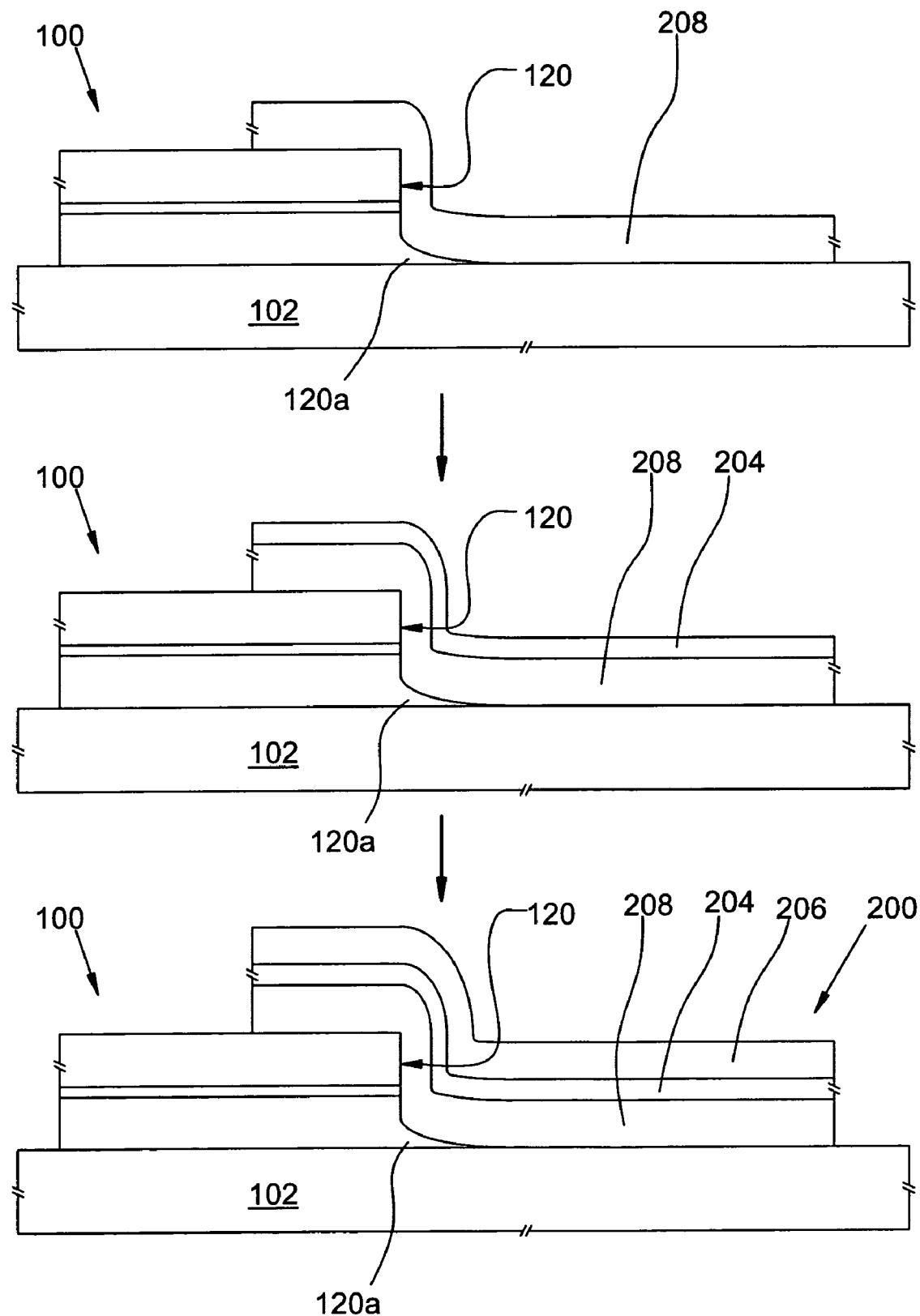
FIG. 31 illustrates an exemplary spatially selective material processing sequence for forming an integrated waveguide.

Various spatially selective material processing procedures used to form end face 120 may not typically yield a substantially flat substantially vertical end face, but may instead leave a protrusion or "foot" 120a at the base of the end face, as shown schematically in FIG. 31. In some instances a trench may instead be formed in the substrate near the base of end face 120, or a combination of a trench and a foot may be formed. The particular size and/or shape of the foot and/or trench depends on the particular spatially selective material processing technique(s), and the particular parameters thereof, employed for forming the end face. Such dependencies of the size/shape of a foot/trench may be readily characterized and reproduced by those skilled in the art of spatially selective material processing. The presence of such a foot and/or trench at or near the base of the end face 120 may complicate the accurate deposition of layers for forming integrated end-coupled waveguide 200, particularly at the proximal end thereof. As seen in the bottom portion of FIG. 31, the proximal portion of waveguide core 204 may not line up properly with device waveguide 100 when a foot 120a is present.

Figure 32:
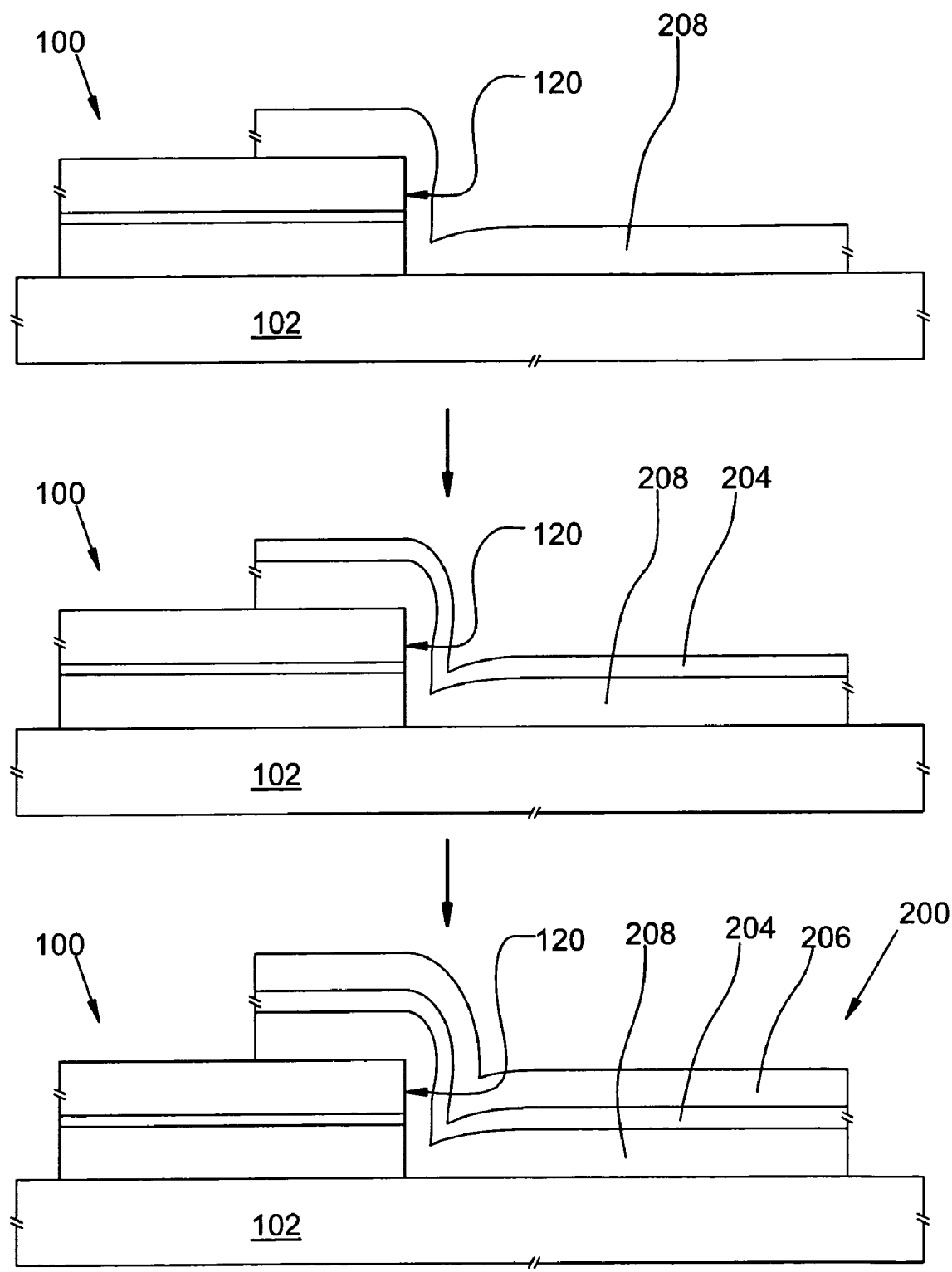
FIG. 32 illustrates an exemplary spatially selective material processing sequence for forming an integrated waveguide.

Various spatially selective material processing procedures may not typically yield deposited layers of substantially uniform thickness near end face 120. Many such procedures yield material layers that decrease in thickness toward the base of the end face, as shown schematically in FIG. 32. The decrease in layer thickness may become more pronounced as the spatially selective material processing deviates from substantial conformality. The particular size and/or shape of the decreasing layer thickness depends on the particular spatially selective material processing technique(s), and the particular parameters thereof, employed for forming the layer. Such dependencies of the decreasing layer thickness may be readily characterized and reproduced by those skilled in the art of spatially selective material processing. A lower cladding layer 208 that decreases in thickness near end face 120 may complicate the accurate deposition of subsequent layers for forming integrated end-coupled waveguide 200, particularly the proximal end thereof. As seen in the bottom portion of FIG. 32, the proximal portion of waveguide core 204 may not line up properly with device waveguide 100 if the waveguide layer thicknesses decrease near the end face 120.

Figure 33:
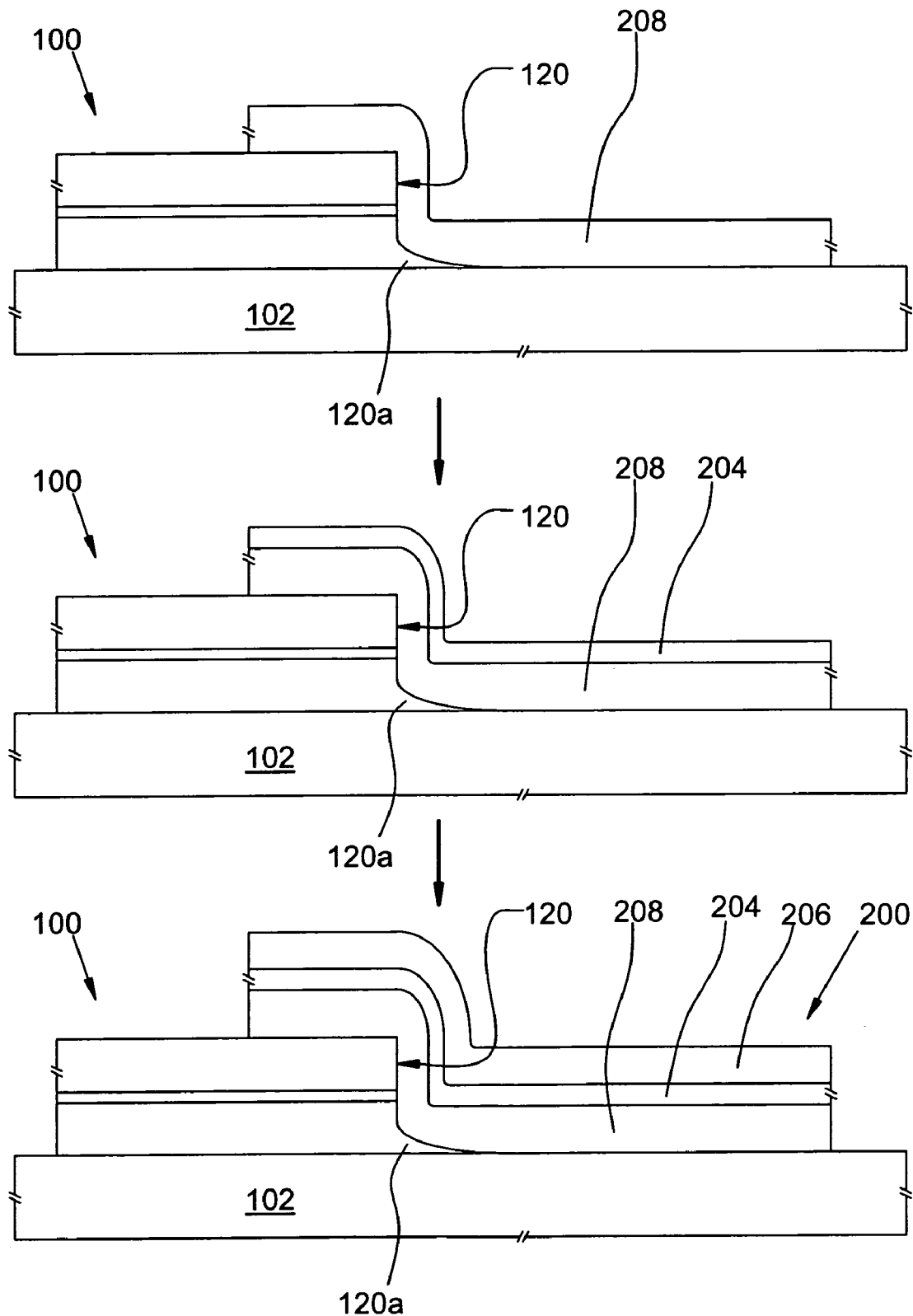
FIG. 33 illustrates an exemplary spatially selective material processing sequence for forming an integrated waveguide.

These complications in a fabrication procedure for integrated end-coupled waveguide 200 may be suitably adapted to mitigate the effects of one another. A suitably configured foot 120a may be intentionally formed and shaped at the base of the end face 120 of device waveguide 100, so as to substantially compensate for non-uniform layer deposition near the end face. Conversely, a deposition process may be intentionally contrived to yield a non-uniform layer thickness near end face 120, so as to substantially compensate for the size and shape of the foot 120a. Alternatively, the size and shape of a foot 120a at the base of end face 120 and the non-uniformity of the deposition process may be optimized together so as to substantially compensate for each other. FIG. 33 illustrates such an adapted procedure, in which the upper surface of lower waveguide cladding layer 208 is substantially flat as a result of a) the presence of foot 120a at the base of the end face 120 of the device waveguide 100, and b) decreasing deposited layer thickness of lower waveguide cladding layer 208 near the end face. If the size and shape of the foot 120a are properly chosen and formed, based on the behavior of the deposition process used to form layer 208 and the desired thickness of layer 208, the upper surface of layer 208 may be made substantially flat up to a point closer to the end face than if the entire end face were substantially flat and vertical. Conversely, if the deposition process for end-coupled waveguide 200 is suitably contrived, based on the size and shape of the foot 120a and the desired thickness of layer 208, the upper surface of layer 208 may be made substantially flat up to a point closer to the end face than if the layer deposition were substantially uniform. The size and shape of foot 120a and the layer deposition process may be optimized together for achieving a substantially flat upper surface of layer 208. Such compensation facilitates fabrication of integrated end-coupled waveguide 200 for achieving operationally acceptable levels of spatial mode-matching, optical power end-transfer efficiency, and so forth.

Figure 34:
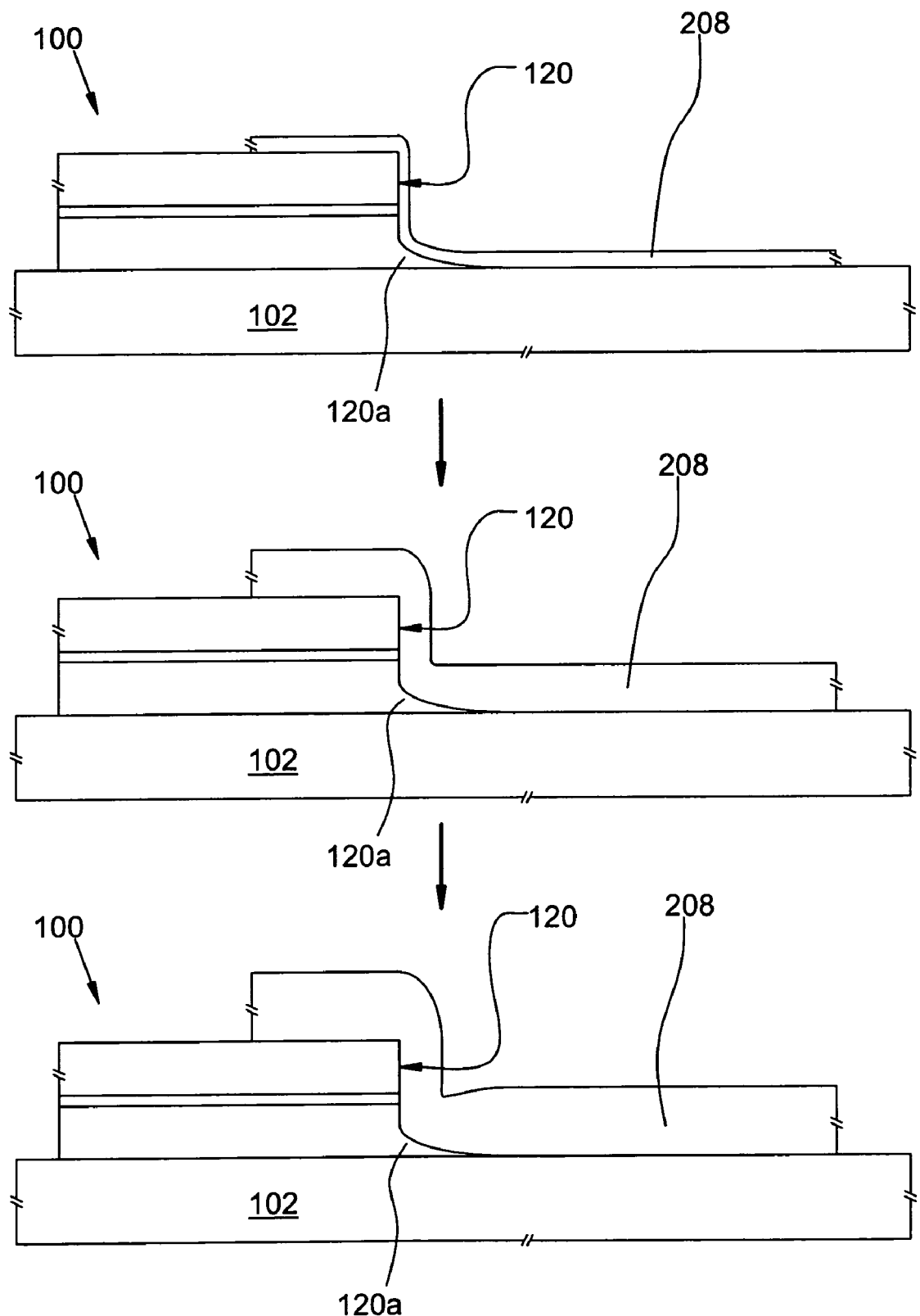
FIG. 34 illustrates an exemplary spatially selective material processing sequence for forming an integrated waveguide.

FIG. 34 illustrates schematically the formation of lower waveguide cladding layer 208 over foot 120a of the device waveguide end face 120. Early in the deposition (before the optimum layer thickness is reached; the first stage of the deposition process shown in FIG. 34), the presence of foot 120a dominates over the thinner deposition near the end face, and the upper surface of layer 208 curves upward near the end face. Late in the deposition process (beyond the optimum layer thickness; the last stage of the deposition process shown in FIG. 34), the non-uniformity of the deposition process near the end face 120 dominates over the presence of foot 120a, and the upper surface of layer 208 curves downward near the end face. At some intermediate point (i.e., the optimum layer thickness; the middle stage of the deposition process shown in FIG. 34), the upper surface of layer 208 is substantially flat as it approaches the end face 120. The size and shape of foot 120a may be suitably formed, the deposition of layer 208 may be suitably adapted, and/or the device waveguide 100 may be suitably formed, so that the optimum thickness for layer 208 (i.e., the thickness that yields a substantially flat upper surface thereof) corresponds to the desired thickness for layer 208 to substantially align the integrated end-coupled waveguide 200 (once it is formed) with device waveguide 100.

Among numerous exemplary types of spatially selective material processing techniques that may be employed within the scope of the present disclosure for forming end face 120 are dry etching techniques, such as ion etching, reactive ion etching, and so forth. In these techniques, an edge of an etch mask typically defines end face 120, and bombardment by ions removes material from the adjacent unmasked area to form the end face. These techniques typically do not yield a substantially perpendicular intersection between the substantially vertical end face and a substantially flat adjacent portion of the substrate surface, but may instead may form a trench near the base of the end face, a protruding foot near the base of the end face, or both (as described hereinabove). The particular size and/or shape of the trench and/or foot is determined by the particular processing conditions and the particular etching tools employed, and these may be readily characterized and reproduced by those skilled in the art. Examples of processing conditions that may be varied and/or calibrated for controlling the formation by etching of end face 120 and foot 120a may include one or more of, but are not limited to: reactive and/or non-reactive ion species (identity of single ion species; identity and composition of ion mixtures); ion density(ies); ion energy(ies); gas flow rate(s); chamber pressure; substrate temperature; geometry of ion source(s) and target substrate; and so forth. In addition to these exemplary etching processes, other suitable types of spatially selective material processing, and varying processing conditions therefor, may be employed for forming end face 120 and foot 120a and for controlling the size and/or shape thereof, while remaining within the scope of the present disclosure.

Among numerous exemplary types of spatially selective material processing techniques, that may be employed within the scope of the present disclosure for forming layers 204/206/208 of waveguide 200, are various material deposition techniques, such as vacuum evaporation, sputter deposition (reactive and non-reactive), molecular beam epitaxy, chemical vapor deposition, plasma-enhanced chemical vapor deposition, photochemical vapor deposition, laser chemical vapor deposition, metal-organic chemical vapor deposition, and so forth. The particular set of deposition conditions employed for these techniques may be varied and/or calibrated for controlling the conformality of the deposition (or deviation therefrom). Many of these deposition techniques typically produce layers of decreasing thickness near the base of a vertical end face (as described hereinabove), even when optimized for maximal conformality. The degree of layer non-uniformity, and the distances from the end face over which the layer thickness may vary, are typically dependent on the particular deposition technique used and processing conditions employed therefor. These may be readily characterized and reproduced by those skilled in the art. Examples of processing conditions that may be varied for controlling the formation of end face 120 and foot 120a include one or more of, but are not limited to: chemical precursor species employed (identity of single precursor species; identity and composition of precursor mixtures); gas flow rate(s); chamber pressure; deposition substrate temperature; RF power(s) and/or frequency(ies) for plasma-enhanced processes; sputtering ion source(s); sputtering ion energy(ies); sputtering target composition; sputtering target temperature; reactive ion density(ies) and/or energy(ies); geometry of deposition substrate, deposition source(s), sputtering target, and/or sputtering source(s); and so forth. In addition to these deposition processes, other suitable types of spatially selective material processing, and varying processing conditions therefor, may be employed for forming layers 204, 206, and/or 208, and for controlling the thickness variation(s) thereof, while remaining within the scope of the present disclosure.

A given implementation of the compensation scheme described in the preceding paragraphs is typically dependent on the particular spatially selective material processing techniques employed, the processing conditions employed for those techniques, and may even vary among individual fabrication apparatus used for those techniques. Accordingly, implementation of the compensation scheme by those skilled in the art of spatially selective material processing may typically involve a significant degree of characterization of the processes used, the processing conditions thereof, and the size and shape of structures formed thereby. For example, an etching process used to form end face 120 and foot 120a might be performed on test structures using a given apparatus under ranges of etching conditions, and the resulting structures examined to determine which set of conditions produced the most suitable size and shape for foot 120a. That set of conditions could then be used for producing end faces each having a foot of the selected size and shape. The characterization process may typically be repeated for another apparatus (even one performing nominally the same etching procedure as the first), or even for the first apparatus after a cleaning, overhaul, upgrade, or other modification. In an analogous example, a deposition process used for forming one or more of layers 204/206/208 might be performed on test structures using a given apparatus under ranges of deposition conditions, and the resulting structures examined to determine which set of conditions produced the most suitable layer thickness variation. That set of conditions could then be used for producing layers having the selected thickness variation. As with the etching of the end face 120, the characterization may typically be repeated for a different apparatus, or for the first apparatus after any significant change or maintenance thereof. In another example, the preceding characterization processes may be combined, with various sizes and shapes for foot 120a being subjected to varying deposition conditions, and selecting the combination of etching and deposition conditions yielding the most suitable overall structure for end face 120, foot 120a, and layers 204, 206, and/or 208. Any such characterization of spatially selective material processing techniques, and conditions therefor, for yielding suitable structures shall fall within the scope of the present disclosure.

While the foregoing exemplary procedures have shown adaptations for yielding a substantially flat upper surface for lower waveguide cladding layer 208, it may be desirable in some circumstances to instead optimize the overall fabrication procedure for waveguide 200 to yield a substantially flat upper surface for some other layer or structure, such as waveguide core 204 or upper waveguide cladding layer 206. Alternatively, it may be desirable in other circumstances to form one or more layer surfaces that are not substantially flat, but are curved to achieve some desired design characteristic and/or optical performance. The size and/or shape of foot 120a, and/or the deposition of one or more of layers 204/206/208, may be adapted in any suitable manner to yield a desired layer configuration for waveguide 200 while remaining within the scope of the present disclosure. It should be noted that the compensation scheme described in the preceding paragraphs (a foot on the etched facet and non-uniform layer deposition compensating for one another to form a substantially flat layer surface) may be combined with various other structures and/or fabrication techniques described herein.

Figure 8:
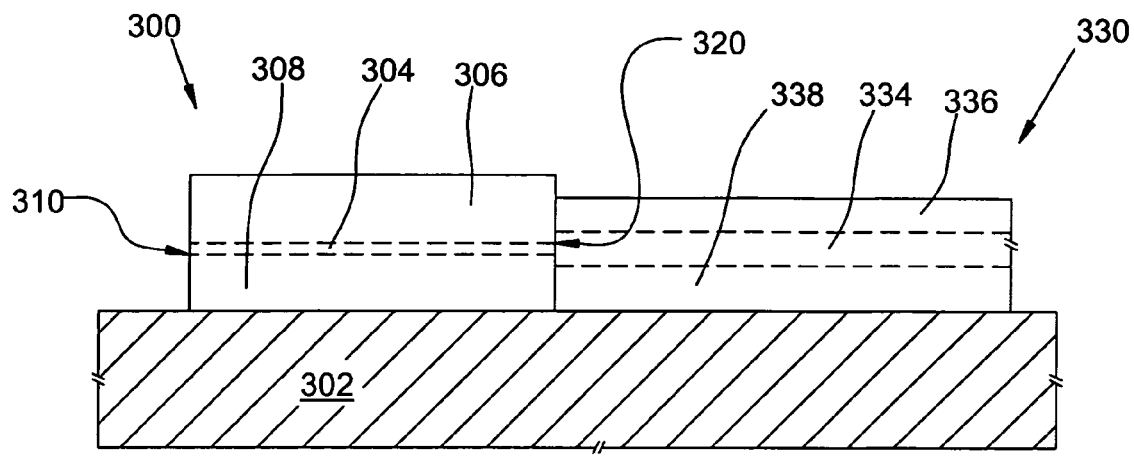
FIG. 8 is a side view of an exemplary semiconductor laser with an integrated waveguide.

A specific exemplary embodiment of a semiconductor optical device and integrated end-coupled optical waveguide is illustrated in FIG. 8. A semiconductor laser is shown comprising a planar laser waveguide 300 on semiconductor substrate 302, the planar laser waveguide 300 comprising upper and lower laser confinement layers 306 and 308, respectively, surrounding laser active layer 304. Laser confinement layers 306/308 may often provide both optical confinement of semiconductor laser optical modes as well as charge carrier confinement for localizing optical gain within the semiconductor laser. Semiconductor laser 300 may typically comprise a III–V semiconductor laser, with active laser layer 304 comprising a III–V semiconductor multi-quantum well. Many other suitable semiconductor materials and/or structures may be alternatively employed for layers 304, 306, and/or 308. After spatially selective material processing to form laser planar waveguide 300 with end face 320, and application of any optical coating(s) on end face 320 (if needed or desired; not shown in FIG. 8), an end-coupled integrated planar optical waveguide 330 may be formed comprising a silicon nitride core 334 and silica-based cladding layers 336/338. Other waveguide core and/or cladding materials may be alternatively employed for forming waveguide 330. The thickness of lower waveguide cladding layer 338 may be chosen so as to substantially align (within operationally acceptable tolerances) core 334 with active laser layer 304. Vertical and lateral dimensions of core 334 near the proximal end of waveguide 330 are chosen to achieve the required degree of spatial mode matching (within operationally acceptable tolerances). As an example, a transverse mode supported by a III–V semiconductor laser gain medium may be about 1 µm high by about 2–3 µm wide. A silicon nitride core about 50–200 nm thick by about 2–3 µm wide within silica-based cladding would support a transverse mode substantially spatial-mode matched with the mode of the semiconductor gain medium.

Semiconductor laser waveguide 300 may include at its other end a second end face 310. End face 310 of the semiconductor laser waveguide 300 may be formed using spatially selective material processing steps on a wafer scale, and may be formed concurrently or sequentially relative to end face 320. Alternatively, laser end face 310 may be formed by cleaving or otherwise dividing the semiconductor substrate wafer (into bars or into individual device chips; not shown in FIG. 8). However it is formed, end face 310 may serve as a laser resonator end mirror. In order to function as a laser end mirror, the reflectivity of end face 310 must be sufficiently large at the laser wavelength for enabling the semiconductor laser to reach threshold and achieve laser oscillation. Index contrast between laser waveguide 300 and its surroundings may provide sufficient reflectivity, or end face 310 may be provided with a coating sufficiently reflective for the laser wavelength. Transmission at the lasing wavelength results in laser output through end face 310 upon laser oscillation. This may be a primary or a secondary output of the semiconductor laser; if the secondary output, it may simply dissipate or it may be used for monitoring the operation of the semiconductor laser or for some other purpose. If the reflectivity of end face 310 is sufficiently large, laser output therethrough may be substantially eliminated. A reflective coating for end face 310 may be applied to all of the multiple semiconductor lasers formed on a common semiconductor substrate wafer 302 (wafer-scale coating), if end face 310 is also formed by wafer scale spatially selective material processing. Alternatively, any reflective coating on end face 310 (however it is formed) may be applied to rows of multiple semiconductor lasers after dividing the common substrate wafer into strips each having a single row of lasers thereon (i.e., at the "bar" level, as opposed to the "wafer" level), or may be applied to individual semiconductor lasers after dividing the common substrate wafer into individual laser chips.

Figure 9B:
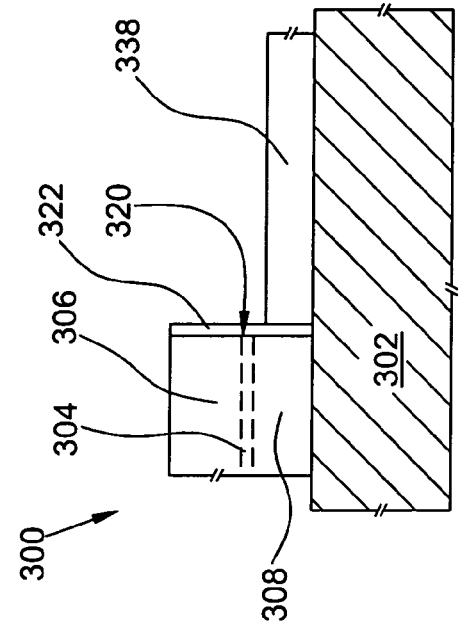
FIGS. 9A, 9B, 9C, and 9D are side views of the ends of exemplary optical device waveguides including optical coatings.
Figure 9D:
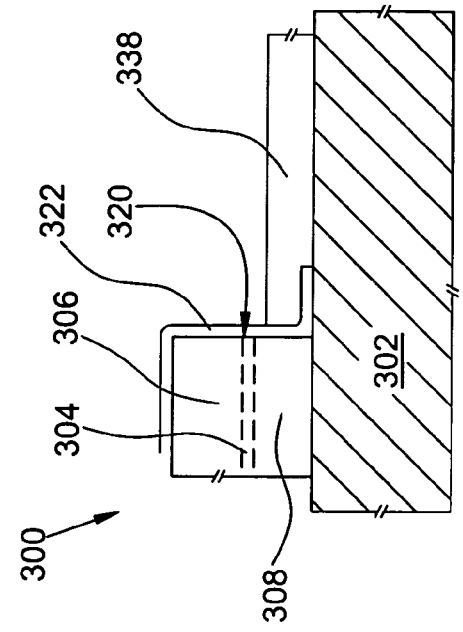
Figure 9A:
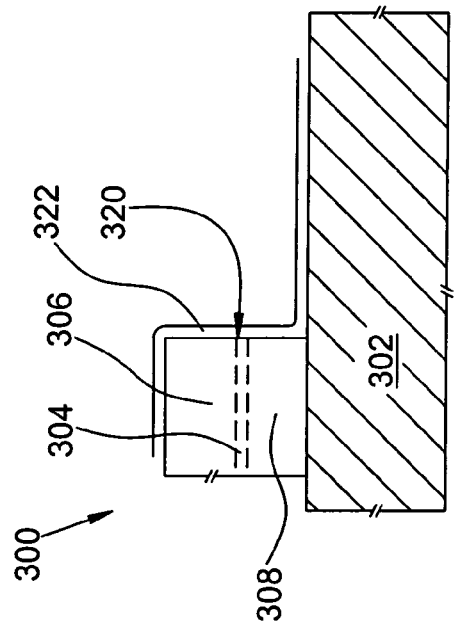
Figure 9C:
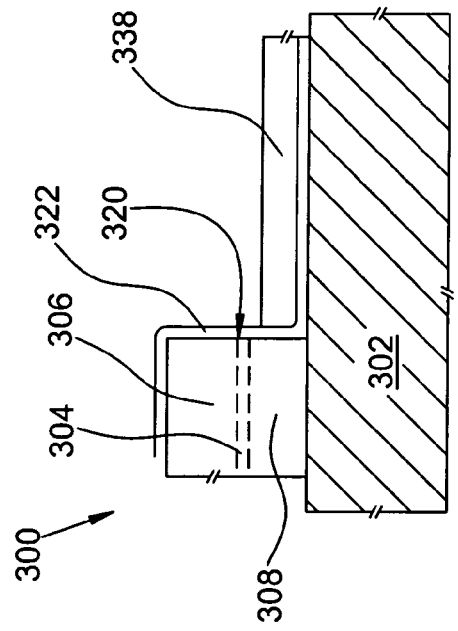

Prior to fabrication of end-coupled waveguide 330, end face 320 of semiconductor laser waveguide 300 may be coated in any suitable manner to achieve desired laser output and/or performance characteristics (coating layer(s) 322 shown in FIGS. 9A/9B/9C/9D). A partially reflective coating (at the laser wavelength) may be applied, so that end face 320 may serve as an output coupling mirror of a semiconductor laser resonator while transmitting laser output therethrough. End face 310 serves as the other laser resonator mirror, and the laser waveguide 300 comprises the entire semiconductor laser optical resonator. End-coupled waveguide 330 in this instance serves to receive the output of the semiconductor laser transmitted through end face 320 (either a primary or a secondary output of the laser), which propagates from the laser 300 through the waveguide 330 to its intended destination (described further hereinbelow). Any suitably reflective coating may be employed on end face 320. A series of alternating quarter-wave coating layers may be employed as a reflective coating for end face 320, for example. Other reflective coatings may be equivalently employed. Application of coating layers during wafer scale processing may typically also result in deposition of coating material on adjacent areas of the semiconductor substrate wafer 302 and/or the top of the laser waveguide 300 (FIG. 9A). One or more of these (presumably) unwanted areas of coating material may be removed prior to deposition of lower waveguide cladding layer 338 (using additional spatially selective material processing steps; FIG. 9B), or may be left in place (the reflective coating area on the substrate 302 therefore forming a portion of lower waveguide cladding layer 338 near end face 320 upon fabrication of waveguide 330; FIG. 9C or 9D).

Figure 10:
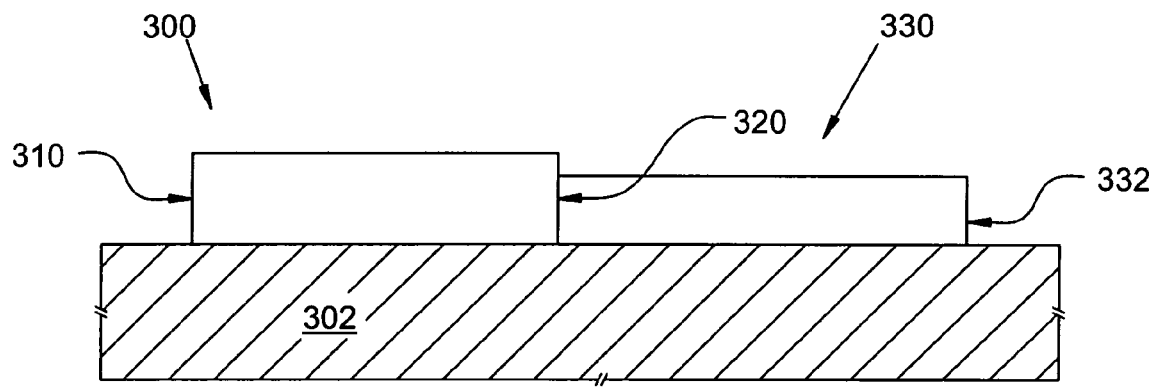
FIGS. 10 and 11 are side views of exemplary semiconductor lasers with integrated waveguides.
Figure 11:
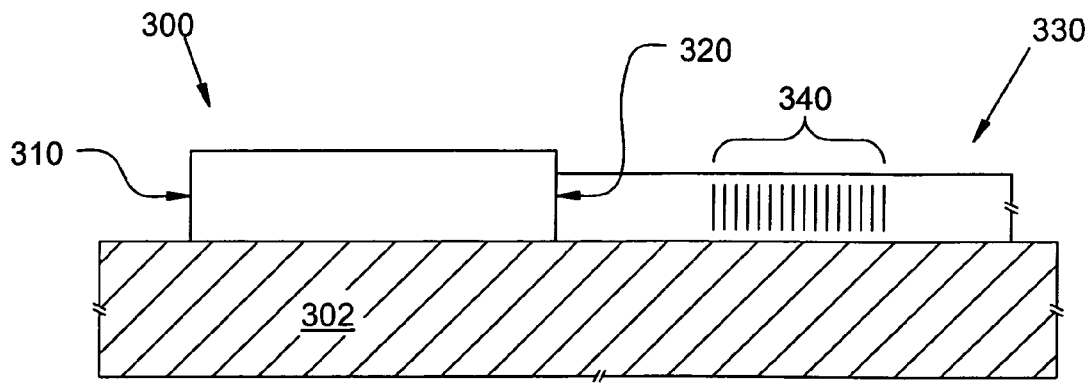

Instead of forming a substantially complete laser optical resonator (including laser resonator end mirrors on both of end faces 310 and 320), the laser waveguide 300 may instead form only a portion of the semiconductor laser optical resonator. The integrated end-coupled planar waveguide 330 may be configured so as to also form a portion of the laser optical resonator. End face 310 may function as one laser resonator end mirror, while a portion of the integrated end-coupled waveguide 330 is suitably adapted to serve as the other laser resonator end mirror. One such adaptation may include a partially or totally reflecting distal end face 332 of waveguide 330 (FIG. 10). Another such adaptation may include a waveguide grating 340 provided along at least a portion of waveguide 330 (FIG. 11). Such a waveguide grating provides wavelength selective reflectivity for the semiconductor laser resonator mirror, thereby stabilizing the output wavelength of the laser. Additional optical functionality for the semiconductor laser may be incorporated into waveguide 330, including but not limited to: modification, selection, suppression, control, and/or modulation of laser transverse modes; modification, control, and/or modulation of laser longitudinal mode frequencies; modification, control, and/or modulation of optical loss within the laser resonator; and so forth.

For laser embodiments in which waveguide 330 forms a portion of the laser resonator, end face 320 may be provided with an anti-reflection coating 322 (prior to fabrication of waveguide 330). An anti-reflection coating may serve to reduce or eliminate laser oscillation arising from reflection at end face 320. Such an anti-reflection coating may simply comprise a single quarter-wave-thickness layer of material having an index intermediate between that of the laser waveguide 300 and the integrated waveguide 330 (a silicon nitride λ/4 layer between a III–V semiconductor laser waveguide 300 and a silica-clad, silicon-nitride-core waveguide 330, for example). More complex anti-reflection coatings may be equivalently employed. As with the deposition of reflective coating layers described hereinabove, anti-reflection coating material is typically deposited on adjacent areas of the substrate 302 and the top of the laser waveguide 300 along with end face 320 (as in FIG. 9A). The coating material may be removed from substrate 302 prior to deposition of lower waveguide cladding layer 338 (using additional spatially selective material processing steps; FIG. 9B), or may be left in place and therefore form a portion of lower cladding layer 338 near end face 320 (upon fabrication of waveguide 330; FIG. 9C or 9D). For other laser embodiments in which waveguide 330 forms a portion of the laser resonator, some degree of reflection from end face 320, in addition to laser end mirror reflectivity provided by waveguide 330, may impart desirable laser output and/or operating characteristics. Such reflectivity may be simply provided by index contrast between laser waveguide 300 and integrated end-coupled waveguide 330, or may be provided in a more specifically designed manner by application of appropriate coating layer(s) 322 to end face 320 (prior to fabrication of waveguide 330). As with the deposition of reflective and anti-reflective coating layers described hereinabove, such coating layer(s) are typically deposited on adjacent areas of the substrate 302 and the top of the laser waveguide 300 along with end face 320 (FIG. 9A). The coating material may be removed from substrate 302 prior to deposition of lower waveguide cladding layer 338 (using additional spatially selective material processing steps; FIG. 9B), or may be left in place and therefore form a portion of lower cladding layer 338 near end face 320 (upon fabrication of waveguide 330; FIG. 9C or 9D).

The presence of lower cladding material between the proximal end of core 204 and the end face of device waveguide 100, and core material extending upward from the proximal end of the core (as in FIG. 7), may be suitably adapted to modify the overall effective reflectivity between the device waveguide and integrated waveguide 200. The depth and conformality of the deposition process for lower cladding 208 may be adjusted to provide a desired thickness for the lower cladding material between the device end face and the upwardly extending core material. If reduced reflectivity at the end face is desired, this desired thickness may be chosen so as to result in partial destructive interference between light reflected from the end face and light reflected from the upwardly extending core material. Conversely, if enhanced reflectivity is desired, the desired lower cladding material thickness may be chosen so as to result in partial constructive interference between the two reflections. In either case the interference typically would be only partial, since the reflected amplitudes may differ, and since the upwardly extending core material would not reflect light entering/exiting the lower portion of the device end face. Choosing the cladding material thickness for either minimizing or maximizing the effective reflectivity of the end face and core material also serves to reduce the variation of effective reflectivity with wavelength.

An integrated end-coupled waveguide may be provided for a semiconductor laser or other semiconductor optical device to serve a variety of purposes. For example, mode sizes within the typically high-index laser waveguide 300 are typically quite small (in at least the vertical dimension). End-coupled solutions (i.e., those not employing an integrated waveguide as disclosed herein) generally impose stringent tolerances (on the order of 0.1 µm) for accuracy and stability of relative alignment of the laser, transmission component, and any required intervening focusing optics, or else achieve low coupling efficiencies (less than 20% or even 10% in some cases). Side-coupled solutions (also referred to as transverse-transfer or evanescent optical coupling or directional coupling) between waveguides of widely differing modal indices (around 3 for a III–V semiconductor laser, around 1.5 for silica based optical waveguides and fibers) may be problematic due to modal index mismatch. An integrated end-coupled waveguide may mitigate these various difficulties and facilitate transfer of laser output power from a semiconductor laser into an optical transmission system.

For end-coupling between a semiconductor laser and an optical transmission component (FIGS. 12A/12B and 13A/13B), the integrated end-coupled waveguide 330 may be adapted at its proximal end to be substantially spatially mode matched with laser waveguide 300 (as described hereinabove), and adapted along its length for transverse expansion of the optical mode. Alignment between laser waveguide 300 and integrated waveguide 330 is pre-determined by the spatially selective material processing techniques employed for fabricating waveguide 330 (and is therefore typically well within operationally acceptable limits), while integration of waveguide 330 onto a common substrate 302 with laser waveguide 300 substantially eliminates issues of position stability therebetween. Waveguide 330 may be adapted along at least a portion of its length for transverse optical mode expansion, so that the laser output emerges from a distal end face 332 of waveguide 330 with decreased divergence and increased transverse extent relative to the optical mode at the proximal end of waveguide 330 (i.e., at end face 320 of semiconductor laser waveguide 300). Alignment tolerances and position stability requirements for end-coupling the semiconductor laser (via waveguide 330) to an optical transmission component, such as an optical fiber or optical waveguide, may therefore be considerably relaxed by suitable adaptation of waveguide 330, relative to tolerances currently required for achieving comparable coupling efficiency for a laser without a mode-expanding integrated waveguide.

Figure 12A:
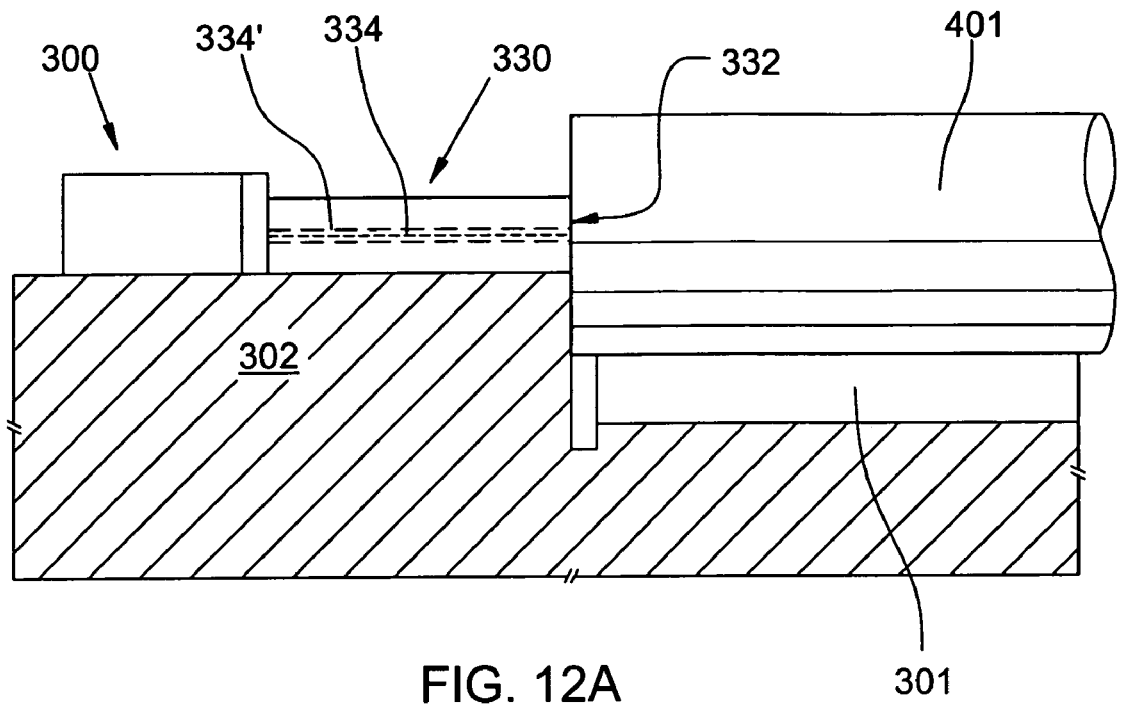
FIGS. 12A and 12B are side and top views, respectively, of an exemplary semiconductor laser with an integrated waveguide adapted for end-coupling to an optical fiber.
Figure 12B:
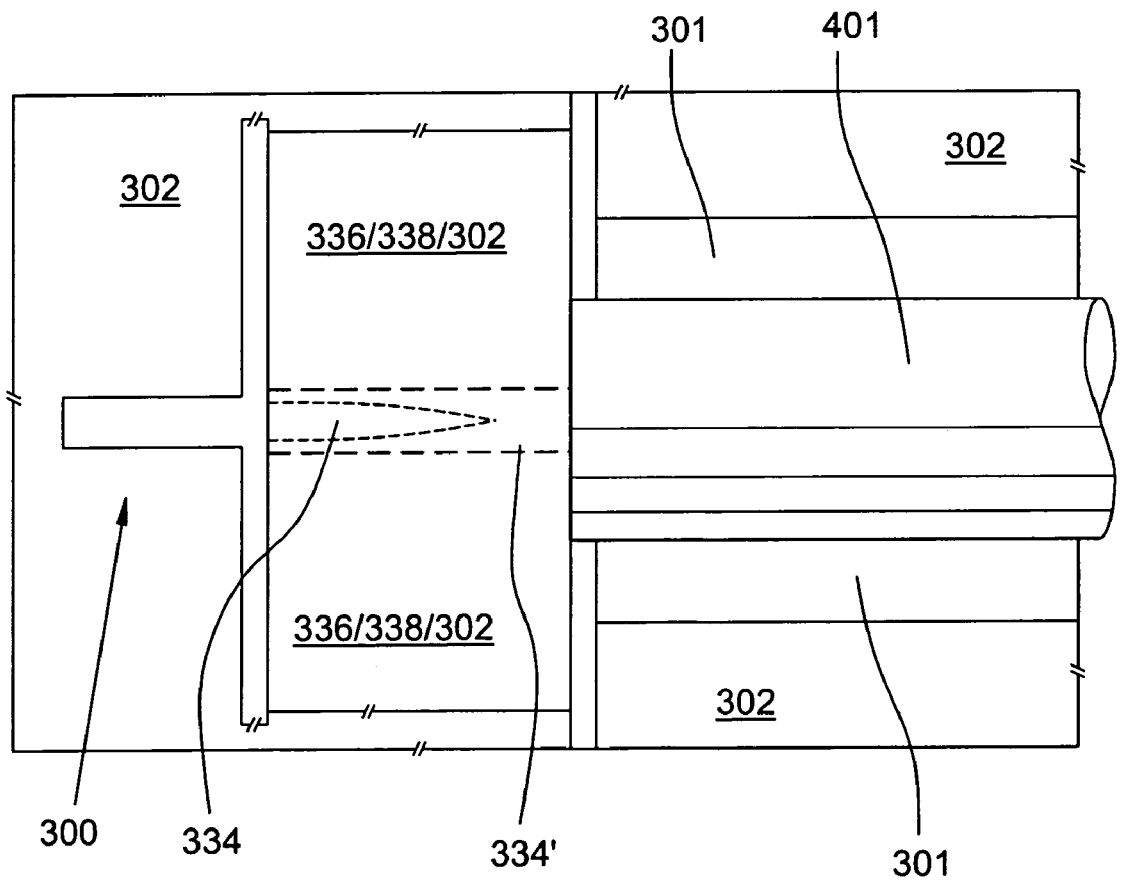
Figure 13A:
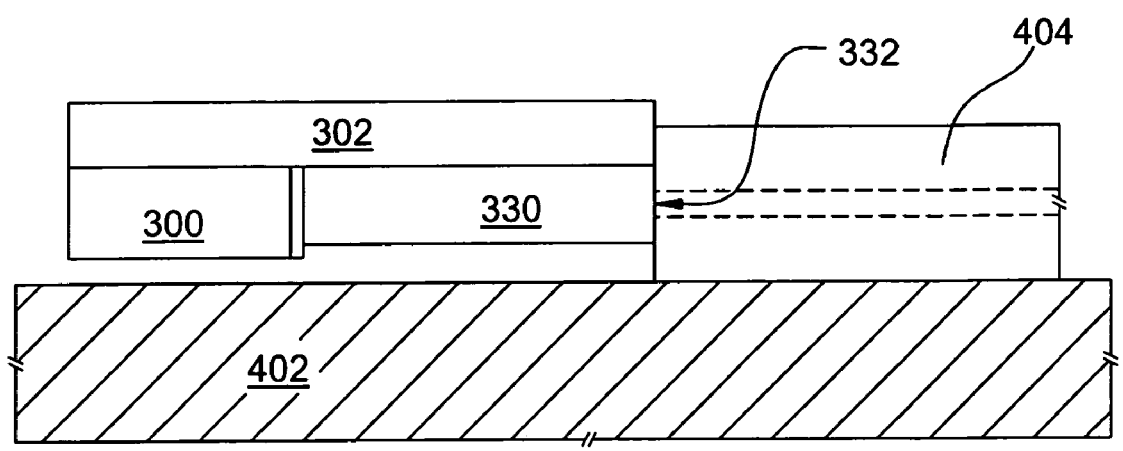
FIGS. 13A and 13B are side and top views, respectively, of an exemplary semiconductor laser with an integrated waveguide adapted for end-coupling to another optical waveguide.
Figure 13B:
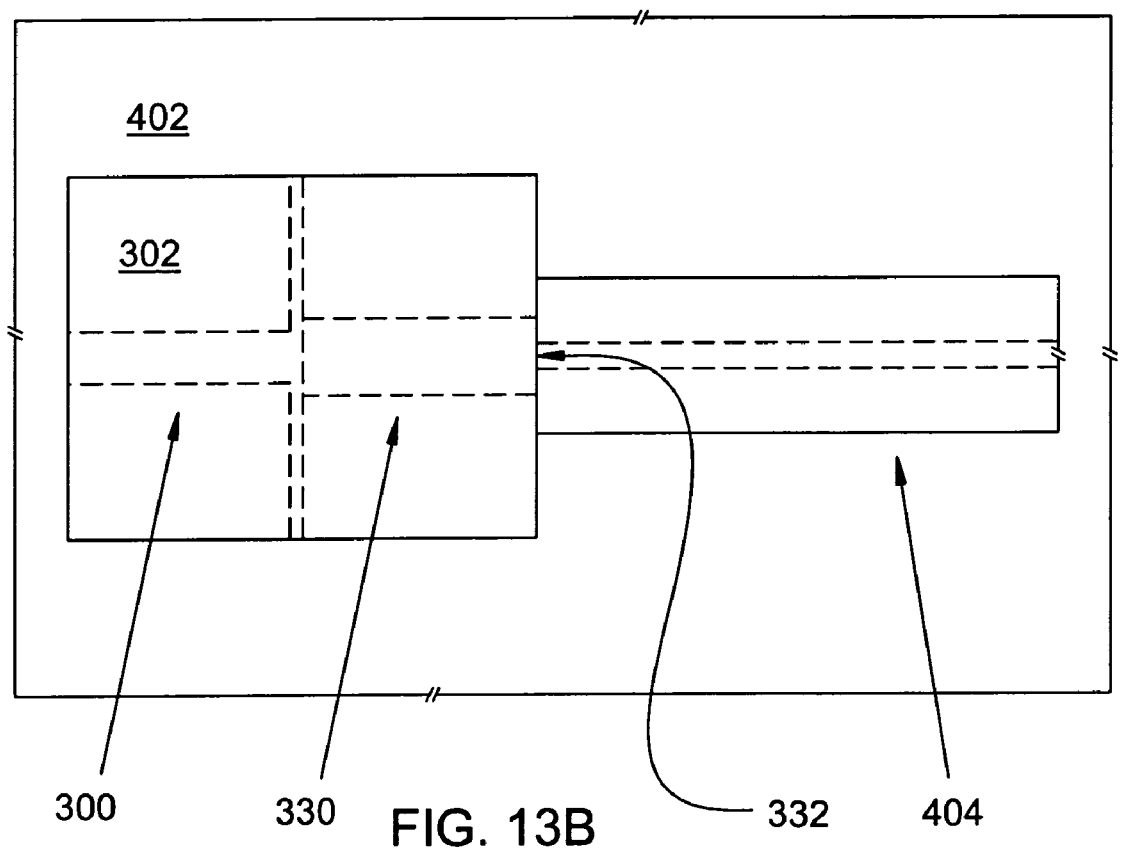

An exemplary semiconductor laser as shown in FIGS. 12A/12B and 13A/13B may include a III–V semiconductor laser waveguide 300 and an integrated waveguide 330 having a silicon nitride core 334 within or on a silica-based secondary core 334' and silica or silica-based cladding 336/338. A typical transverse mode size at end face 320 may range between about 1 μm and about 4 μm wide and between about 0.5 μm high and about 2 μm high. The transverse dimensions of silicon nitride core 334 at the proximal end of integrated waveguide 330 may be designed and fabricated to achieve an operationally acceptable degree of spatial mode matching between laser waveguide 300 and integrated waveguide 330. Silicon nitride core 334 may therefore range between about 50 nm and about 200 nm thick, typically between about 80 nm and about 120 nm thick, often about 100 nm thick, and may therefore range between about 1 μm wide and about 4 μm wide, typically between about 1.5 μm wide and about 3 μm wide, often about 2 μm wide. At least one transverse dimension of the silicon nitride core 334 (often the width) gradually decreases with the distance from end face 320 along waveguide 330 and the core eventually terminates. The transverse dimensions of secondary core 334' may be designed and fabricated to achieve an operationally acceptable degree of spatial mode matching at the distal end of waveguide 330 with fiber 401 (FIGS. 12A/12B) or waveguide 404 (on substrate 402; FIGS. 13A/13B; cores 334/334' not shown). The transverse dimensions of secondary core 334' may remain substantially constant along the length of waveguide 330. As the silicon nitride core gradually tapers away, the transverse mode size supported by waveguide 330 gradually increases from about 1 μm high by about 2 μm wide (for example), supported by the silicon nitride core 334 at the proximal end of waveguide 330, to about 2–3 μm high by about 4–6 μm wide or larger, supported by suitably-sized secondary core 334' at the distal end of waveguide 330 (a silica-based core about 0.5–1.5 μm high and about 4–8 μm wide within silica-based cladding, for example). Transverse mode sizes in this range may be more readily end-coupled to an optical fiber 401 (shown positioned in a V-groove 301 on substrate 302 in FIGS. 12A/12B), planar optical waveguide 404 on a waveguide substrate 402 (shown "flip-chip" mounted in FIGS. 13A/13B; alignment/support structures not shown), or other optical transmission component with relaxed alignment tolerances and/or greater coupling efficiency, as compared to a semiconductor laser lacking such a mode expander.

Such mode expansion functionality for end-coupling may be provided by waveguide 330 regardless of whether it forms part of the semiconductor laser resonator or not. If integrated waveguide 330 does form part of the semiconductor laser resonator, transverse mode expansion may be provided along a portion of waveguide 330 within the semiconductor laser resonator, along a portion of waveguide 330 outside the semiconductor laser resonator, or along portions both within and outside the semiconductor laser resonator. Distal end face 350 of waveguide 330 may be provided with an anti-reflection coating, if needed or desired, whether or not waveguide 330 forms a portion of the semiconductor laser resonator. Alternatively, if waveguide 330 does form a portion of the semiconductor laser resonator, and if resonator end-mirror reflectivity is not otherwise provided, distal end face 350 of waveguide 330 may be provided with a partially-reflective coating (at the laser wavelength), and may therefore serve as a semiconductor laser resonator output coupling mirror. A coating applied to distal end face 350 may be applied on a wafer scale to multiple waveguides 330 simultaneously (in a manner similar to coatings applied to end faces 310 and/or 320 on a wafer scale, as described hereinabove). Alternatively, coatings may be applied to end face 350 at the "bar" level or at the individual laser "chip" level.

Transverse mode expansion along waveguide 330 may result in leakage of a fraction of the transmitted optical power into substrate 302, particularly from low-index materials of waveguide 330 into a high-index semiconductor substrate 302. Such optical loss may be kept within operationally acceptable levels in a variety of ways within the scope of the present disclosure. It may be possible to provide a sufficiently thick lower cladding layer for waveguide 330 so that optical leakage therefrom into substrate 302 is sufficiently reduced or substantially eliminated. It may be possible to reduce the overall length of beam-expanded portion of waveguide 330 so as to reduce the total optical power lost into the substrate. Additional measures may be implemented for reducing the degree of optical power loss due to substrate leakage.

A reflective layer (metallic, multilayer, or other; described further hereinbelow) may be deposited on substrate 302 prior to deposition of the lower cladding layer 338. Optical power reaching the reflective layer is thereby substantially prevented from leaking into substrate 302. In some instances, instead of employing a reflective film, it may be possible to rely on reflection (at high or grazing angles of incidence) at the lower cladding/substrate interface to at least reduce the amount of optical power leakage into a higher-index substrate 302 (so-called "anti-guiding"). A two-level, two-core configuration (not shown) may be employed for waveguide 330, in which a proximal end portion of waveguide 330 and a lower proximal lower core thereof are adapted for end-coupling with a semiconductor laser 300, while a distal end portion of waveguide 330 and an upper distal core thereof are adapted for end-coupling to an optical fiber or to an other planar waveguide. Along an intermediate portion of the waveguide 300, both lower and upper cores are present, and are adapted for transverse-transfer or optical power therebetween (i.e., optical transverse-coupling, side-coupling, or directional coupling). The transverse transfer may be substantially modal-index-matched mode-interference transverse-coupling, or may be substantially adiabatic transverse-coupling. The distal core may be suitably adapted for providing the desired degree of beam expansion, presumably with less leakage of optical power into substrate 302 due to the thicker lower cladding layer. Stability of such a two-level, two-core arrangement is ensured by the monolithic formation of the two cores within a common waveguide. Other adaptations and/or configurations may be equivalently employed for reducing leakage of optical power from an integrated waveguide into an underlying semiconductor device substrate while remaining within the scope of the present disclosure.

Figure 14A:
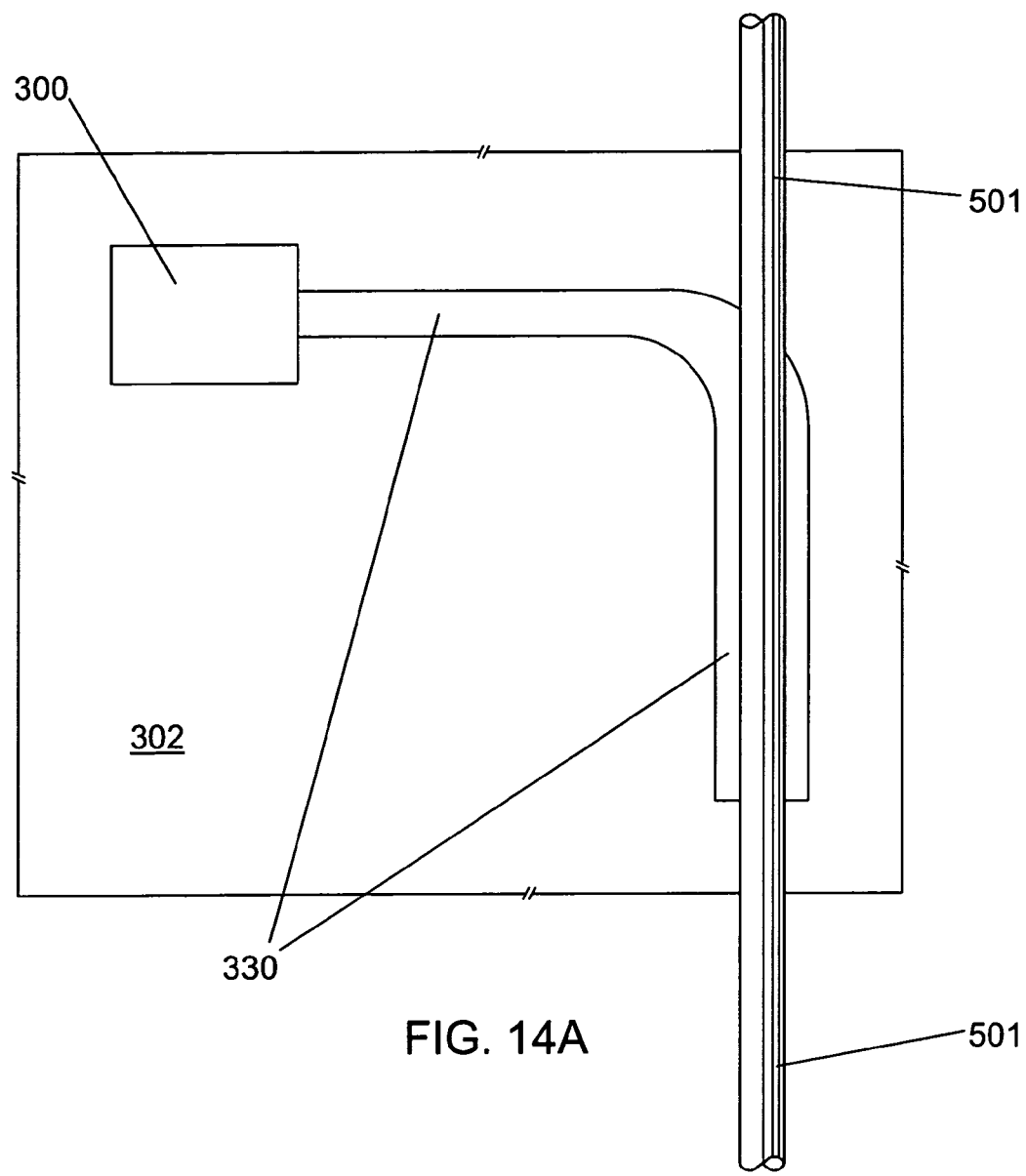
FIGS. 14A and 14B are side and top views, respectively, of an exemplary semiconductor laser with an integrated waveguide adapted for side-coupling to an optical fiber taper segment.
Figure 14B:
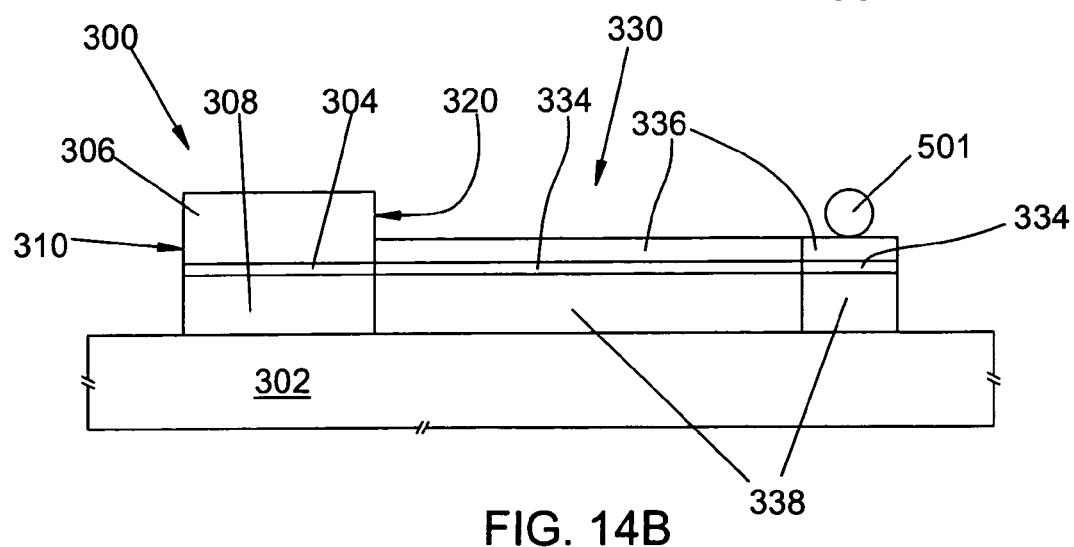
Figure 15A:
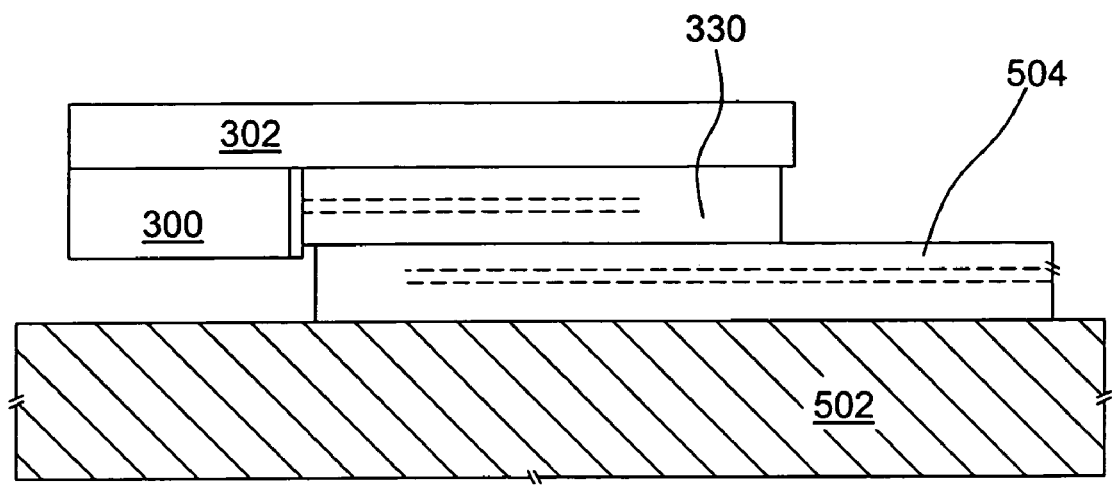
FIGS. 15A and 15B are side and top views, respectively, of an exemplary semiconductor laser with an integrated waveguide adapted for side-coupling to another optical waveguide.
Figure 15B:
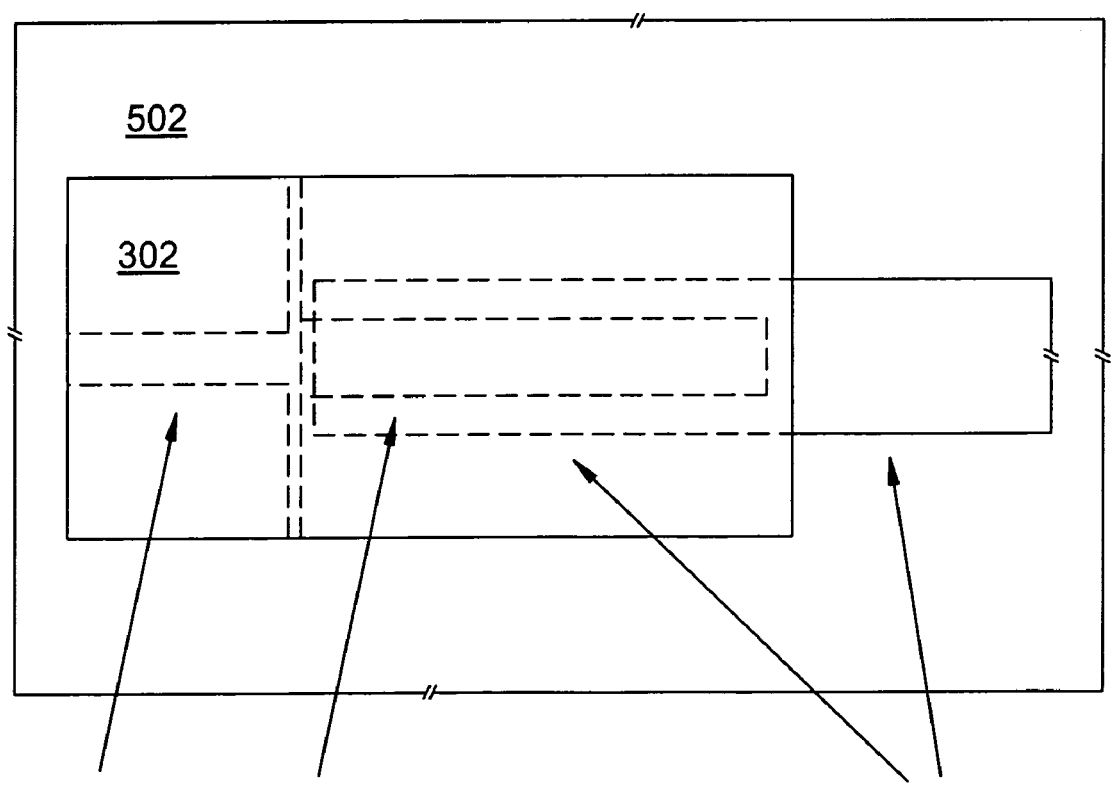

For side-coupling between a semiconductor laser and an optical transmission component, the integrated end-coupled waveguide 330 may be adapted at its proximal end to be substantially spatially mode matched with laser waveguide 300 (as described hereinabove), and suitably adapted along at least a portion of its length for facilitating transverse-transfer of optical power (as taught in U.S. patent application Pub. Ser. No. 2003/0081902). It is typically the case that adaptations required for efficient transverse-transfer of optical power may be more readily implemented for integrated waveguide 330 than for laser waveguide 300. For example, use of silica-based material(s) for fabricating waveguide 330 yields modal indices within waveguide 330 nearly matched to a corresponding modal index of a side-coupled silica-based optical transmission component, such as an optical fiber taper segment 501 (FIGS. 14A/14B), a silica-based planar waveguide 504 on a substrate 502 (laser shown "flip-chip" mounted in FIGS. 15A/15B; alignment/support structures not shown), or other low-index transmission component. Modal-index-matched (equivalently, mode-interference-coupled) transverse-transfer may therefore be more readily achieved than between such low-index optical transmission components and the III–V laser waveguide 300. Alternatively, a dispersion-engineered multi-layer reflector waveguide structure may be employed for waveguide 330, enabling modal index matching to low-index optical transmission components from III–V waveguide material. Incorporation of electro-optic, electro-absorptive, and/or non-linear optical materials into waveguide 330 may enable modification, control, and/or modulation of modal index matching (and therefore also transverse optical power transfer) between integrated end-coupled waveguide 330 and a side-coupled optical transmission component. In other exemplary embodiments, integrated waveguide 330 and/or the optical transmission component may be adapted for enabling substantially adiabatic transverse-transfer (FIGS. 14A/14B and 15A/15B). The variation in optical properties along the length of waveguide 330 for enabling adiabatic transverse-transfer may be more readily implemented on waveguide 330 than directly on laser waveguide 300.

If waveguide 330 forms a portion of the semiconductor laser resonator, then the portion of waveguide 330 adapted for transverse-coupling (modal-index-matched or adiabatic) may be positioned outside the semiconductor laser resonator (i.e., distal of the portion of waveguide 330 providing resonator end mirror reflectivity). Alternatively, a portion of the optical transmission component (typically a planar waveguide 504 as in FIGS. 15A/15B) may also form a portion of the semiconductor resonator and provide resonator end mirror reflectivity, in which case the portions of waveguide 330 and the planar transmission waveguide 504 adapted for transverse-coupling would be within the semiconductor laser resonator. In this latter example the semiconductor laser would not operate until sufficiently large (i.e., sufficiently low-loss) transverse-transfer is established between waveguide 330 and the planar transmission waveguide 504.

In some exemplary embodiments of a semiconductor laser including an integrated end-coupled waveguide, the integrated waveguide 330 may be present for modifying, controlling, and/or modulating the output of the semiconductor laser, while the primary laser output exits the semiconductor laser through end face 310 of semiconductor laser waveguide 300. In such embodiments the adaptations described hereinabove for distal end-coupling (to a transmission optical component), mode expansion, side-coupling, modal index matching, or adiabatic side-coupling typically would not be necessary. Those adaptations necessary for enabling at least a portion of waveguide 330 to form at least a portion of the semiconductor laser resonator and for modifying the laser output may be incorporated into waveguide 330, such adaptations including but not limited to: waveguide grating(s), reflective and/or anti-reflective coating(s), transverse mode selector(s) and/or suppressor(s), and so forth. In some of these embodiments a secondary laser output may exit the semiconductor laser via waveguide 330, which may simply dissipate or which may be used for monitoring the operation of the semiconductor laser or for some other purpose.

Figure 16A:
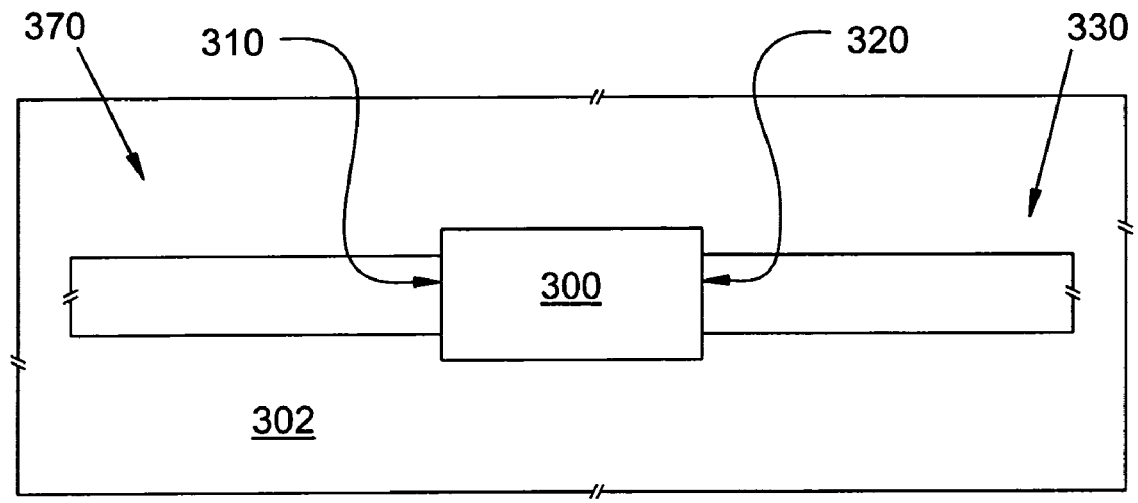
FIGS. 16A and 16B are top and side views, respectively, of an exemplary semiconductor laser with an integrated waveguide at each end thereof.
Figure 16B:
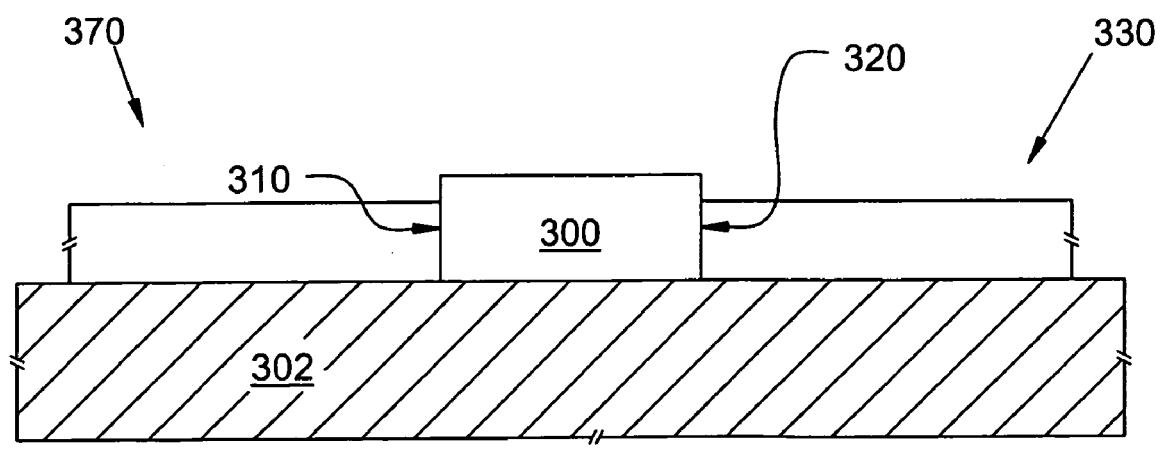

In some exemplary embodiments of a semiconductor laser including a first integrated end-coupled waveguide 330, a second integrated end-coupled waveguide 370 may be formed on semiconductor laser substrate 302 and end-coupled to semiconductor laser waveguide 300 at end face 310 (FIGS. 16A/16B). Spatially selective material processing may be employed for forming end face 310 and fabricating integrated waveguide 370 in manners similar to those employed for forming end face 320 and integrated waveguide 330, and end face 310 and/or integrated waveguide 370 may include suitable adaptations thereof for providing various functionalities and/or capabilities similar to those described above for end face 320 and/or integrated waveguide 330. The spatially selective material processing steps employed for forming laser waveguide 300, end faces 310 and 320, and waveguide 330 and 370, may be concurrent or sequential, and may be performed on a wafer scale for simultaneous fabrication of multiple sets of waveguides 300/330/370. In embodiments including integrated end-coupled waveguides at both ends of the semiconductor laser waveguide 300, the various adaptations, functionalities, and/or capabilities that may be provided for and/or by such waveguides may be divided between the two waveguides 330 and 370 in any suitable manner.

Integrated end-coupled waveguide(s) and adaptations thereof as described hereinabove for semiconductor lasers may be similarly implemented for a wide array of other active and/or passive semiconductor optical device types. Some of these devices may be single-port devices (including but not limited to photodetectors, receivers, single-output lasers, and so on; configured similar to the embodiment of FIG. 8), while others may be multi-port devices (including but not limited to multiple-output lasers, amplifiers, modulators, filters, splitters/combiners, add/drop filters, slicer/interleavers, phase shifters, and so on; configured similar to FIGS. 16A/16B). For any single- or multi-port semiconductor optical devices, one or more or all input/output ports may be provided with an integrated end-coupled waveguide as described hereinabove. For each such input/output port, a suitable array of adaptations, functionalities, and/or capabilities may be provided for/by the corresponding device waveguide end face and integrated end-coupled waveguide (as described in detail hereinabove for semiconductor lasers).

Fabrication of an integrated end-coupled waveguide on a device substrate along with semiconductor optical device waveguide using wafer scale spatially selective material processing techniques may require additional adaptations of the end face of the semiconductor device waveguide and/or the integrated waveguide, and may also require additional fabrication steps. For minimizing end-coupling optical loss due to diffraction, for example, transverse (vertical and lateral) optical confinement of device and waveguide modes should be substantially contiguous across the waveguide end faces, as shown in FIGS. 1A/1B, where a semiconductor device ridge waveguide 100 and ridge end-coupled waveguide 200 are shown integrated on semiconductor device substrate 102. However, various fabrication schemes for forming semiconductor device waveguide 100 and end face 120 thereof result in an end segment of the device waveguide that lacks complete transverse confinement. An examples is illustrated in FIGS. 2C. Some fabrication schemes for forming integrated end-coupled waveguide 200 result in waveguide material(s) deposited on end face 120, resulting in a proximal end segment 201 of waveguide 200 that lacks substantially complete transverse confinement (as in FIG. 7, for example). Elimination of either or both of these unconfined waveguide segments requires additional spatially selective material processing steps, adding to the cost and complexity of the manufacturing process. The diffraction loss induced by a gap in transverse confinement maybe tolerable in some device applications, but not in others. The extent to which diffractive loss at the waveguide end faces must be minimized (i.e., the operationally acceptable limits for diffractive loss for a given semiconductor optical device application) may determine what, if any, measures may be desirable, necessary, and/or warranted for its minimization. The added cost and complexity of such measures may be similarly determinative.

Figure 7:
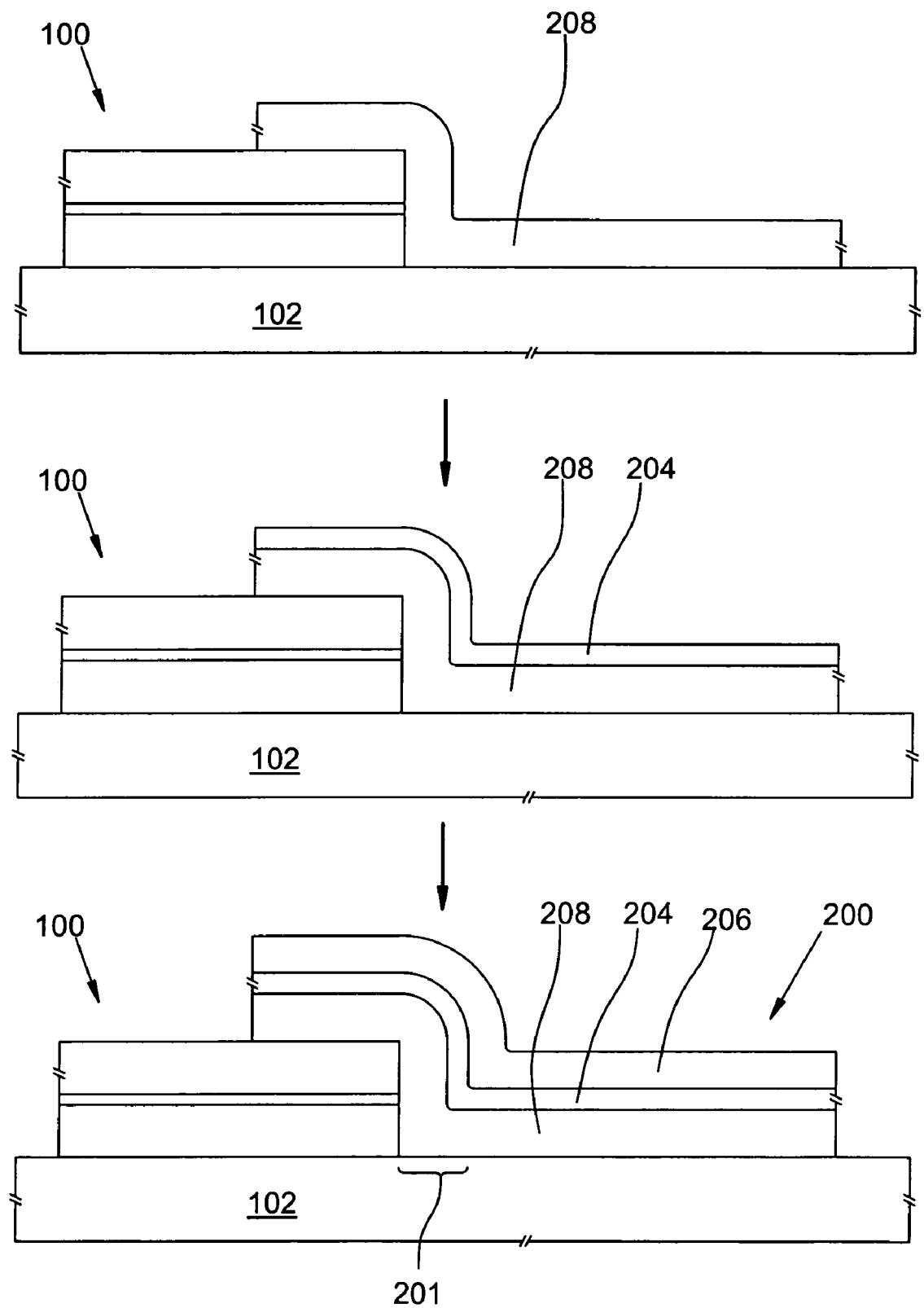
FIG. 7 illustrates an exemplary spatially selective material processing sequence for forming an integrated waveguide.

If relatively large end-coupling losses (up to 30% or even as much as about 50%) due to diffraction are tolerable, then fabrication of waveguide layers 204, 206, and 208 may be carried out using relatively non-directional deposition techniques (FIG. 7). The waveguide material(s) deposited on device waveguide end face 120 may be simply left in place, and the resulting diffractive loss at waveguide segment 201 tolerated. If the diffractive loss at waveguide segment 201 is too large for a given device, various adaptations and/or alternative processing schemes may be implemented for reducing it.

Figure 17:
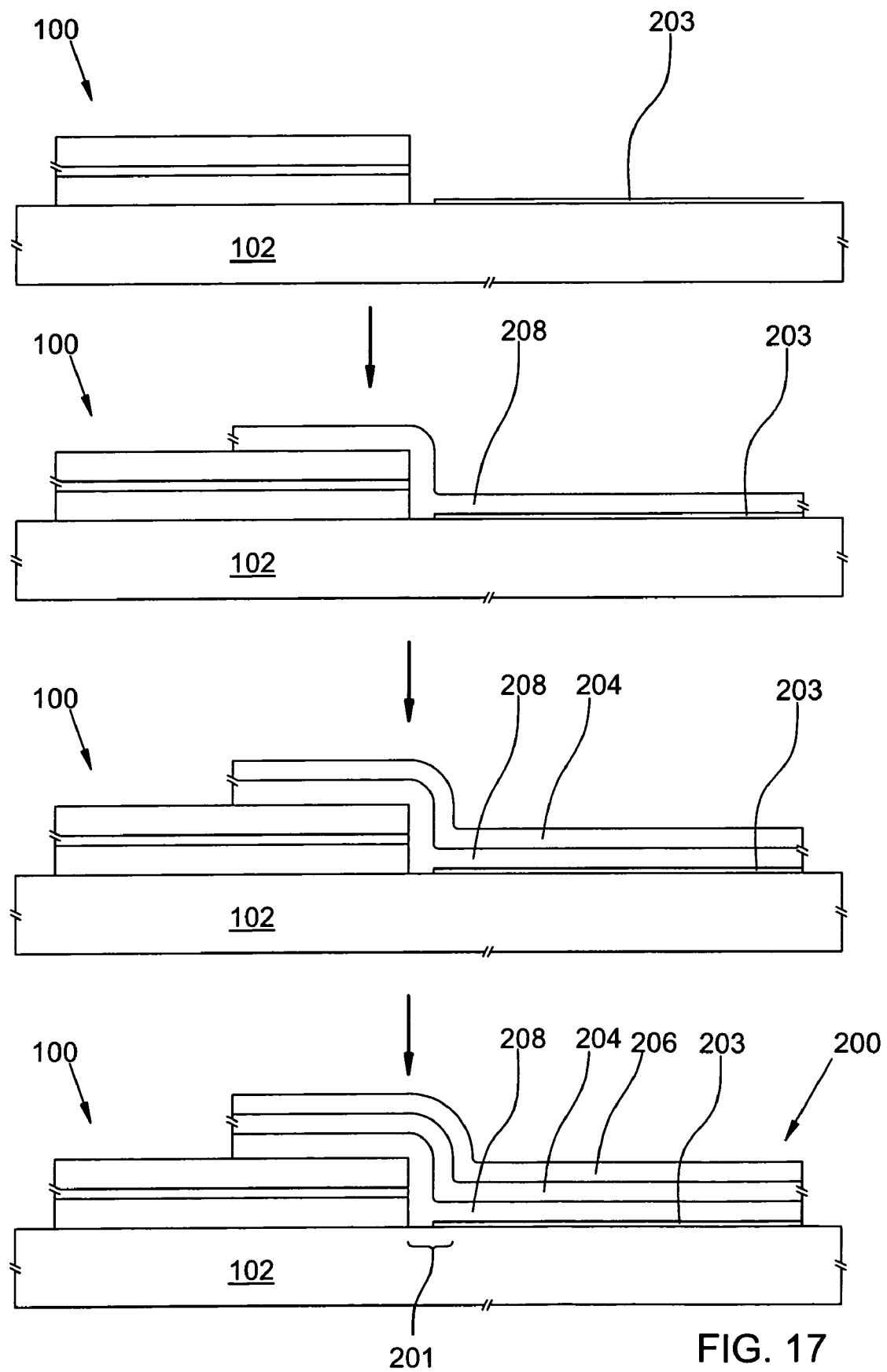
FIG. 17 illustrates an exemplary spatially selective material processing sequence for forming an integrated waveguide.
Figure 18:
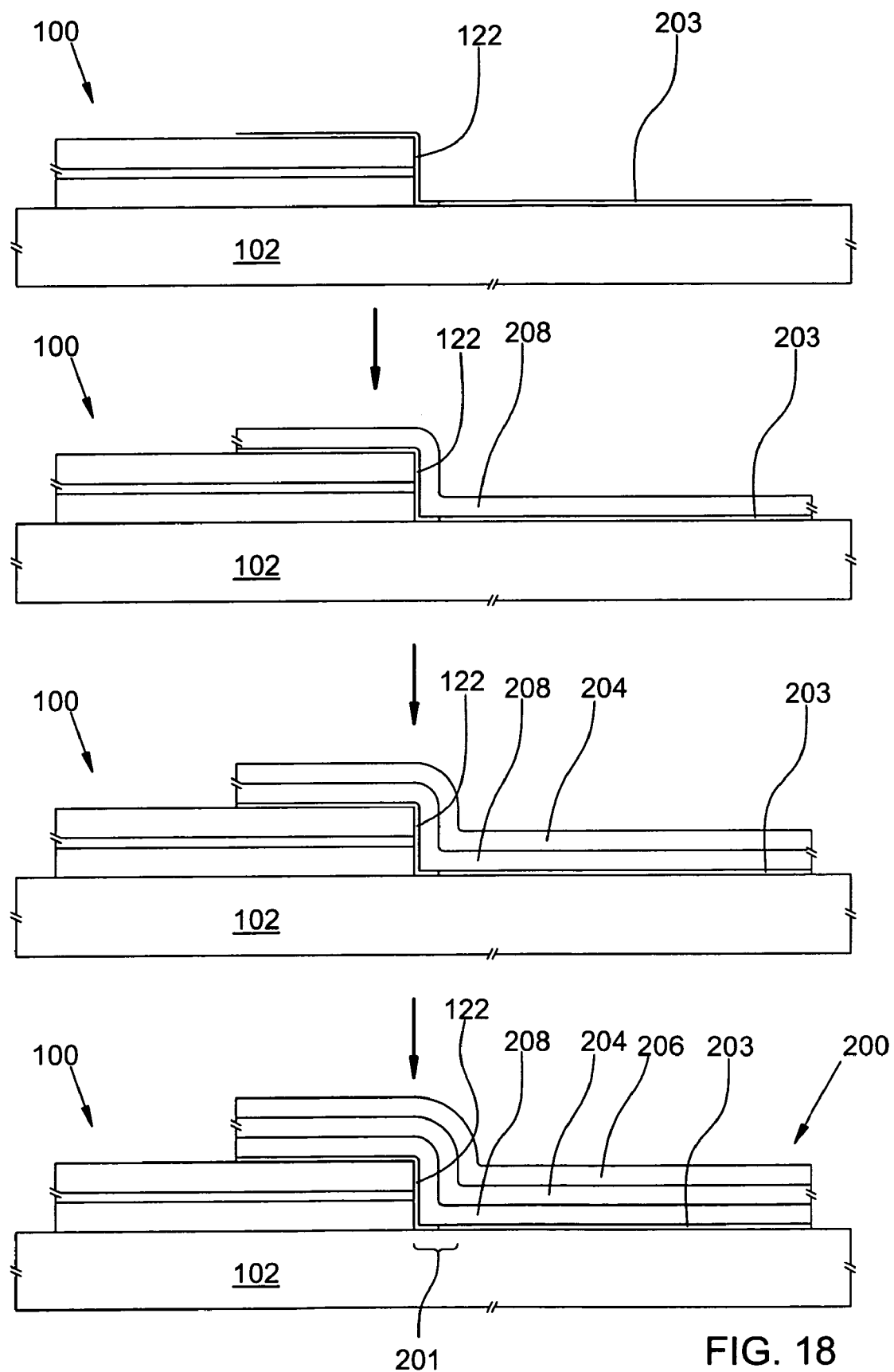
FIG. 18 illustrates an exemplary spatially selective material processing sequence for forming an integrated waveguide.

Diffractive loss at waveguide segment 201 may be reduced somewhat by reducing the thickness of lower cladding layer 208 of integrated waveguide 200, thereby also reducing the thickness of cladding material on end face 120 and the length of the unconfined waveguide segment 201. This reduction of the lower waveguide cladding layer may be sufficient to reduce the diffractive loss to an operationally acceptable level. However, if the lower cladding 208 is too thin, then an unacceptably large fraction of the optical power propagating through waveguide 200 may leak into semiconductor substrate 102 and be lost, the semiconductor substrate 102 typically having a refractive index larger than the core or cladding layers of integrated waveguide 200. A thin reflective film 203 (metal, multilayer, or other reflective film) may be deposited on the substrate 102 prior to deposition of waveguide lower cladding layer 208 (FIG. 17), thereby reducing or substantially eliminating optical loss due to substrate leakage. If the lower cladding layer 208 is too thin, however, the reflective coating 203 may itself cause optical loss along waveguide 200 (by optical absorption by a metal coating, for example). As an illustrative example, an optical mode about 1 µm high by about 2 µm wide supported by a thin silicon nitride core (about 100 nm thick) with a lower cladding layer about 2 µm thick results in optical loss though substrate leakage less than about 10 dB/cm (within operationally acceptable limits in many circumstances), but also results in a 2 µm thick layer of cladding material on the laser end face. Addition of a thin metal film reflector layer 203 and reduction of the lower cladding layer to about 1 µm thick also results in optical loss of about 10 dB/cm, but with only about a 1 µm thick layer of cladding material on the semiconductor end face (and correspondingly less diffractive loss). Further reduction in the lower cladding thickness results in further reduction of diffraction loss at the proximal end of waveguide 200, but increases the optical loss upon propagation along waveguide 200. Spatially selective material processing may be employed for depositing metal reflector layer 203 without deposition on device end face 120. As shown on FIG. 18, the thickness of metal reflective layer 203 may be chosen to substantially match the thickness of optical coating layer(s) 122 applied to end face 120 (and typical also to an adjacent portion of substrate 102), thereby providing a substantially flat surface on which to form integrated waveguide 200.

A thin film reflector may prove advantageous in other circumstances as well. In the transverse-coupled embodiments of FIGS. 14A/14B and 15A/15B, use of a tapered and terminated core is often employed for achieving substantially adiabatic transverse-transfer between an integrated waveguide and a fiber-optic taper segment or planar waveguide assembled therewith. Testing and "burn-in" of semiconductor optical devices (including semiconductor lasers) is typically carried out before assembly with the fiber-optical taper or waveguide, but without such a transverse-coupled component, once beyond the end of the core the laser power would typically diverge and be at least partially lost into the substrate. Monitoring and accurately measuring the optical output power under such circumstances is difficult, and dissipation of significant levels of laser power within substrate 302 may have undesirable consequences (such as damage to the semiconductor device). By adding a thin film reflector layer between the device substrate and the integrated waveguide, loss of optical power into the device substrate may be reduced or substantially eliminated, and a larger fraction of the optical power may be measured and monitored as it exits a distal end face of the integrated waveguide.

Figure 19A:
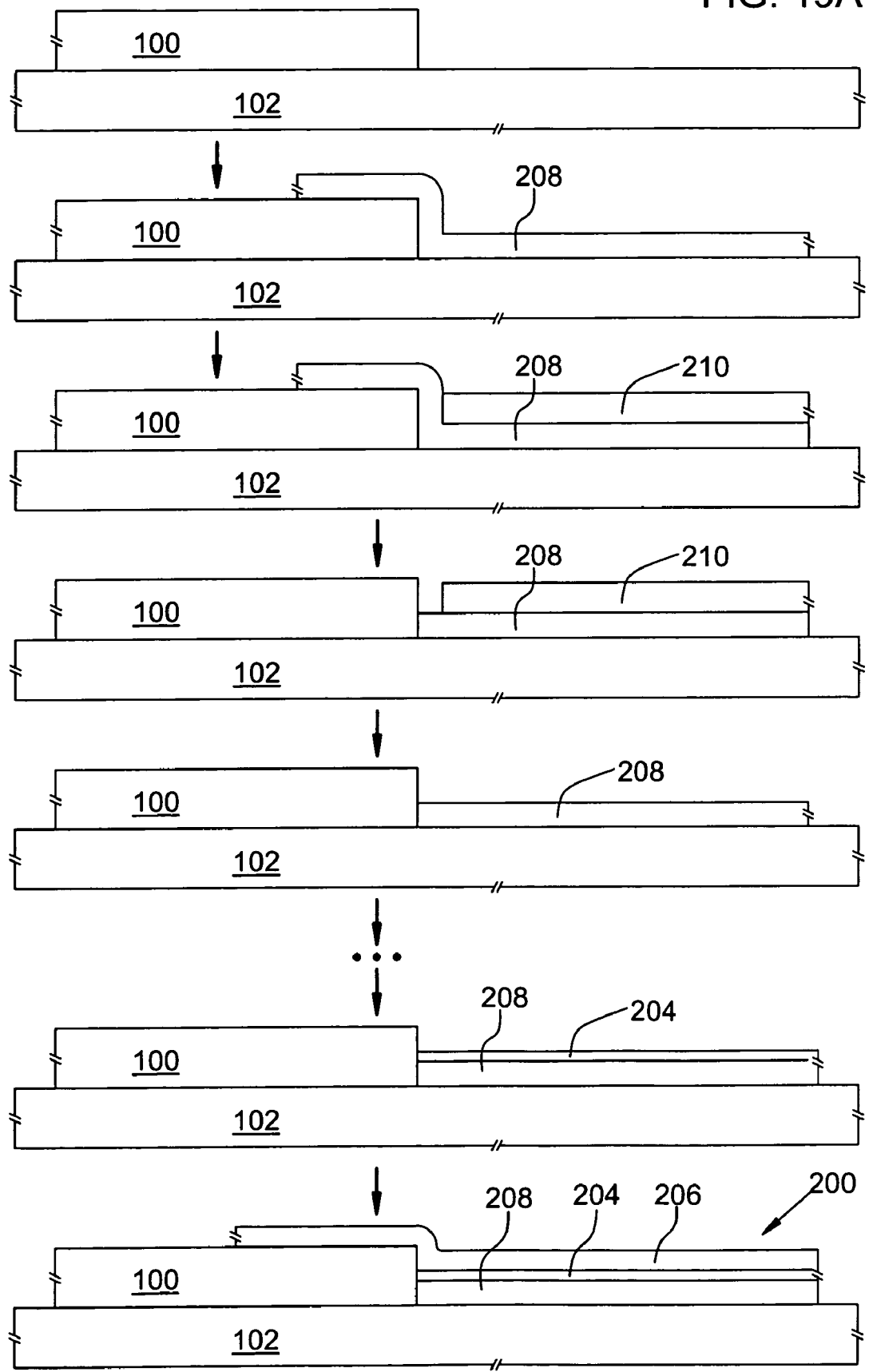
FIGS. 19A and 19B each illustrates an exemplary spatially selective material processing sequence for forming an integrated waveguide.

The end segment of waveguide 201 that lacks substantially complete transverse confinement may be substantially eliminated through additional spatially selective material processing steps. As shown in FIG. 19A, after formation of device waveguide end face 120, any needed/desired coating thereof (not shown), and any needed/desired metal reflective layer (not shown) on the substrate 102, lower cladding layer 208 is deposited as described hereinabove, with cladding material also deposited on end face 120. Etch mask layer 210 may be deposited over the lower cladding layer 208, while leaving exposed the cladding material on end face 120 (also typically leaving exposed cladding material deposited on top of device waveguide 100). The exposed cladding material is then etched down to a remaining thickness substantially matching the thickness of the masked cladding material. After mask removal, a substantially flat lower cladding layer 208 remains, with unwanted cladding material removed from end face 120. A similar sequence of deposition, masking, etching, and de-masking steps (represented by the three dots in FIG. 19A) may be employed for depositing waveguide core layer 204 while removing unwanted core material from the semiconductor device end face, and then upper waveguide cladding layer 206 may be deposited. The integrated end-coupled waveguide 200 thus formed provides substantial transverse optical confinement extending to device waveguide end face 120, thereby reducing or substantially eliminating diffractive optical loss. For an integrated end-coupled waveguide 200 having a relatively thin core layer 204 (on the order of a few hundred nm thick or less), it may be possible to leave core material on end face 120 without introducing substantial diffractive optical loss, owing to the thinness of the deposited layer.

Figure 35:
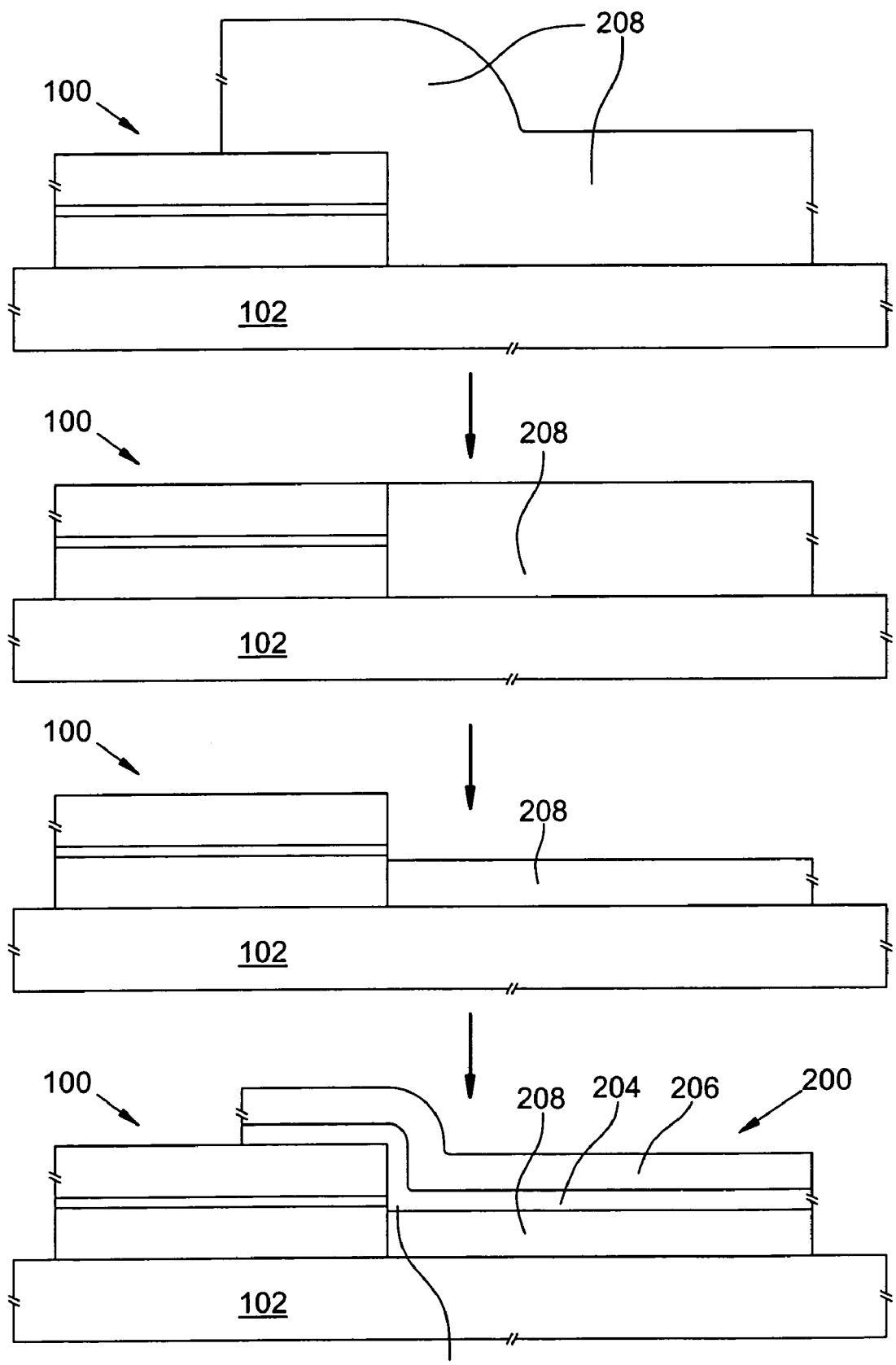
FIG. 35 illustrates an exemplary spatially selective material processing sequence for forming an integrated waveguide.

Another exemplary process for forming an integrated end-coupled waveguide for a semiconductor optical device is shown in FIG. 35. After forming semiconductor optical device 100, a layer of cladding material 208 is deposited on substrate 102 and over an end portion of device 100. The thickness of cladding layer 208 above the substrate should be at least as large as the height of device 100, as shown in the first stage of the process diagram of FIG. 35. Chemical-mechanical polishing (CMP) is then employed to remove cladding material and yield a cladding material upper surface substantially flush with the device upper surface (as shown in second stage of FIG. 35). Any suitable CMP process(es) may be employed. Such processes may be terminated when the top of device 100 is reached, or may in some instances remove some material from the top of device 100 in addition to cladding layer material. The remaining cladding material layer 208 has a substantially flat upper surface. A material-specific non-directional etch process may then be employed to reduce the thickness of the remaining cladding material layer 208 to a desired thickness for the lower cladding of waveguide 200, while exposing a portion of the etched device end face and maintaining a substantially flat upper surface for the cladding material layer up to the end face (as in the third stage of FIG. 35). Deposition of core material layer 206 and upper cladding layer 204 may then be performed as described hereinabove, with core and cladding material deposited on the lower cladding layer 208, the device end face, and an end portion of device 100. At one or more stages of the process of FIG. 35, one or more of layers 204, 206, and/or 208 and/or device 100 is spatially-selectively processed in any suitable manner for providing lateral optical confinement for optical device 100 and/or integrated waveguide 200.

By depositing waveguide core material layer 204 on a substantially flat upper surface of layer 208, the waveguide core material extends to the device end face. The segment 201 of integrated waveguide 200 lacking complete transverse optical confinement is reduced relative to an integrated waveguide produced by the procedure of FIG. 7 (wherein lower cladding material is deposited on the device end face and the core does not reach the end face). A non-confined segment 201 of an integrated waveguide 200 formed by the procedure of FIG. 35 will be about as long as the core material deposited on the end face is thick. For an integrated low-index waveguide having a low-profile or thin core, the core material layer on the device end face may be less than about 1 μm thick for silica-based cores, or only a few hundred μm or less for silicon nitride or silicon oxynitride cores. Diffractive optical loss associated with such short non-confined waveguide segments may be substantially reduced relative to diffractive optical loss from an integrated waveguide fabricated by the procedure of FIG. 7 having a non-confined segment several μm in length, at the expense of additional processing steps. If even smaller diffractive loss is needed or desired, CMP processing may be employed for forming core layer 204 to yield a substantially flat upper surface of the core extending to the device end face and removing excess core material from the device end face. Any non-confined segment 201 of waveguide 200 is thereby substantially eliminated (once again, at the expense of additional processing steps).

In some embodiments it may not be possible to completely eliminate the end segment 201 of the integrated end-coupled waveguide 200 that lacks substantially complete transverse optical confinement, or to reduce its length to a degree sufficient to reduce diffractive losses below an operationally acceptable level. Even if possible, it may be undesirable, impractical, and/or unjustified to do so due to the additional spatially selective material processing steps required and the attendant increased cost and complexity of fabrication involved. In addition, spatially selective material processing steps required to produce device waveguide end face 120 with a sufficiently accurate surface profile and/or with sufficiently high optical quality may necessitate a laterally extending end face segment of device waveguide 100 (as shown in FIG. 2C), and substantially complete transverse optical confinement would be lacking in such a segment of device waveguide 100. Diffractive optical loss from waveguide segment(s) lacking substantially complete transverse optical confinement may be reduced or substantially eliminated by suitable adaptation(s) of the surface profile of device waveguide end face 120 and/or the proximal end of the integrated waveguide 200.

Figure 19B:
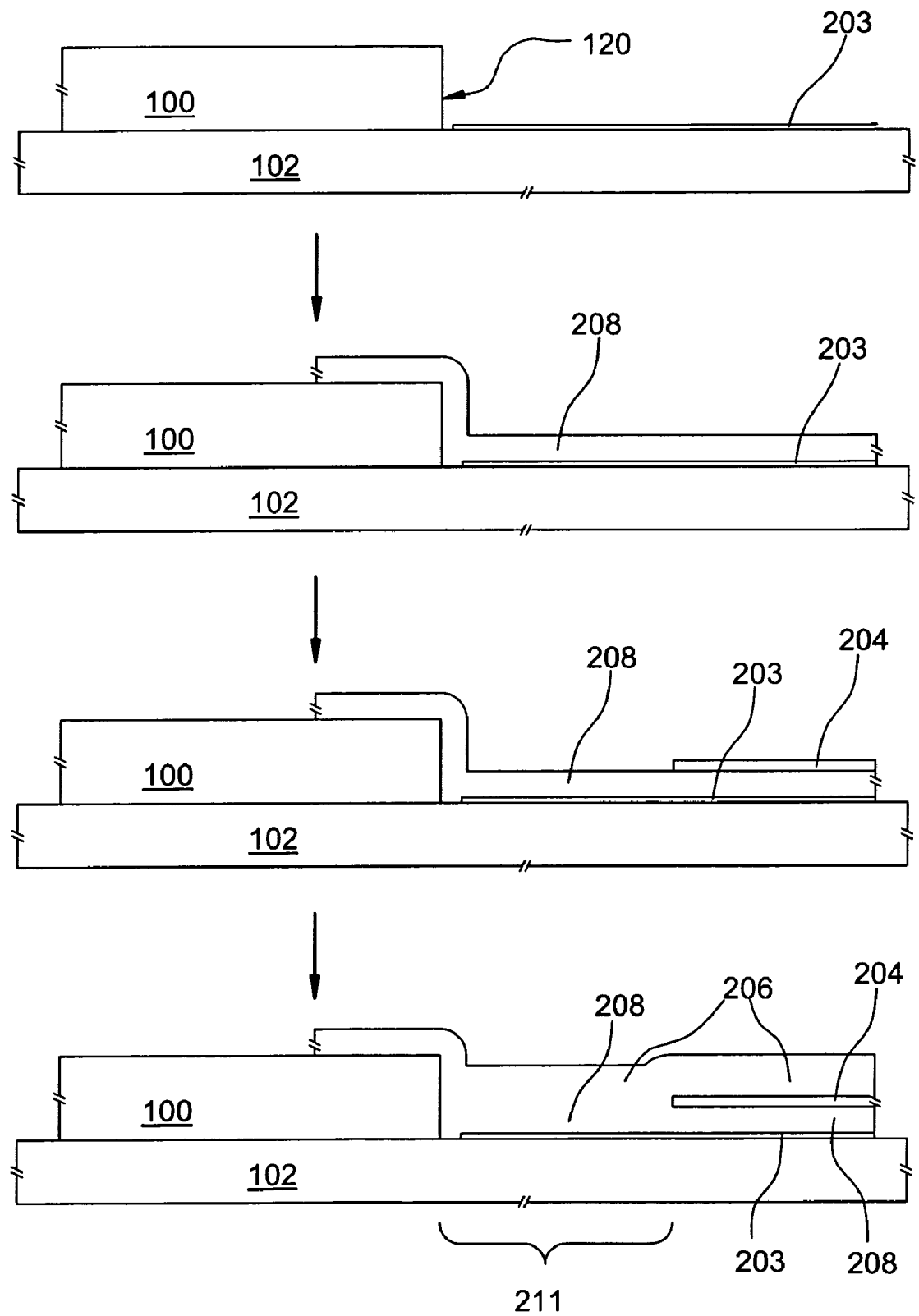

Diffractive optical loss from waveguide segment(s) lacking substantially complete transverse optical confinement may be reduced by suitable adaptation of the proximal segment of the integrated waveguide 200 to exploit the effect of multi-mode interference. FIG. 19B illustrates a fabrication sequence for forming integrated waveguide 200. After formation of device waveguide end face 120, any needed/desired coating thereof (not shown), and reflective layer 203 on the substrate 102, lower cladding layer 208 is deposited as described hereinabove, with cladding material also deposited on end face 120. Core 204 is then deposited; however, the proximal end of the core is displaced distally from the end face 120, leaving a waveguide segment 211 of length L between the end face 120 and the proximal end of core 204 with no core layer. Upper cladding layer 206 is then deposited, comprising substantially the same material as the lower cladding layer 208.

The thicknesses of layers 208 and 206 and the width of waveguide segment 211 are chosen so that the waveguide segment 211 forms a multi-mode waveguide segment (which lacks core 204), which differs from the remainder of the integrated waveguide (which includes core 204). The lowest order optical mode of each of the device waveguide 100 and the integrated waveguide 200 (including core 204) couple into respective superpositions of several of the lowest-order modes supported by multi-mode waveguide segment 211. Each of these lowest order modes propagates with its own effective index (or propagation constant), so that the relative phases of the modes vary substantially linearly with propagation distance along waveguide segment 211. This variation of relative phases results in evolution of the transverse profile of the superposition along the length of multi-mode waveguide segment 211, due to constructive and destructive interference of varying portions of the modes as their relative phases vary. Modes of a given superposition that start out substantially in phase at one end of waveguide segment 211 become substantially in phase again at a specific distance along the waveguide segment 211 (referred to herein as a recurrence distance, which may be calculated based on the modal indices of the modes of the superposition). Core 204 is fabricated so that the length L of the waveguide segment 211 substantially corresponds to this recurrence distance (or an integer multiple thereof. The superposition corresponding to the device waveguide mode at end face 120 recurs at the proximal end of core 204, while the superposition corresponding to the integrated waveguide mode at the proximal end of core 204 recurs at end face 120. The overall end-coupling efficiency between the device waveguide and the integrated waveguide is therefore substantially determined by the degree to which the respective waveguide modes are spatial mode matched, thereby enabling reduction or substantial elimination of diffractive optical loss relative to the embodiments of FIGS. 7, 17, and/or 18, for example. For optical modes of the typical sizes described herein, for example, the recurrence distance may be on the order of about 10 to 20 μm in length, although this length range may vary widely depending on the specific characteristics of the device and integrated waveguides.

Implementation of the multi-mode interference scheme described in the preceding paragraph requires waveguide segment 211 to be designed and fabricated so that the modal indices are known with accuracy and precision sufficient to enable sufficiently accurate calculation of the recurrence length. Accordingly, the thicknesses and/or widths of cladding material layers 206/208 and the transverse optical confinement properties thereof, must be designed and fabricated sufficiently accurately and precisely. Vertical optical confinement within waveguide segment 211, if present, may be provided in any suitable manner. Reflective layer 203 (metal, multi-layer, or other suitable reflective layer) may be employed for providing well-defined optical confinement from below waveguide segment 211. An upper reflective coating (not shown) may be deposited over upper cladding layer 206 for providing similarly well-defined optical confinement from above waveguide segment 211. Index contrast between upper cladding layer 206 and its surroundings (air, vacuum, encapsulation material, a lower-index secondary cladding layer, etc) may instead be relied upon for optical confinement from above, if sufficiently well-characterized for enabling sufficiently accurate calculation of modal indices. Index contrast between lower cladding layer 208 and a lower-index secondary cladding layer (between lower cladding 208 and substrate 102; not shown) may instead be relied on for optical confinement from below, if sufficiently well-characterized for enabling sufficiently accurate calculation of modal indices. Lateral optical confinement within waveguide segment 211, if present, may be provided in any suitable manner, such as reflective coatings applied to lateral surfaces of waveguide segment 211, index contrast between waveguide segment 211 and its surroundings (air, vacuum, encapsulation material, lateral secondary cladding material, etc), index contrast between medial and lateral portions of waveguide segment 211, and so forth, providing such lateral optical confinement is sufficiently well-characterized for enabling sufficiently accurate calculation of modal indices.

Multi-mode interference may also be exploited to form a mode expander. The incident optical mode may couple into multiple modes of the multimode waveguide segment, the incident superposition thus formed presumably being substantially smaller than the lowest-order modes of the superposition (at the incident end of the multi-mode waveguide segment). This incident superposition evolves spatially as it propagates along the multi-mode waveguide segment (as described hereinabove, due to differing modal propagation constants), and periodically recurs at regular spatial intervals along the multi-mode waveguide segment. Placing an incident end of a receiving waveguide (integrated waveguide 200 in the preceding examples) at one of these recurrence points is substantially equivalent to placing the incident end of the receiving waveguide in place of the incident end of the multi-mode waveguide segment, and may reduce or substantially eliminate diffractive losses (as already described hereinabove). At one or more points along a multi-mode waveguide segment between successive recurrences of the incident superposition, the modal superposition goes through a maximum transverse size. If an incident end of a receiving waveguide is placed at such a maximum, then the multi-mode waveguide segment acts as a mode expander. Since all modes of the superposition cannot be simultaneously spatial-mode matched with a single mode of the receiving waveguide, such a multi-mode-interference-based mode expander may not typically provide coupling efficiencies as large as those attainable using a single-mode, substantially adiabatic mode expander. However, a multi-mode interference-based mode expander may provide a given degree of mode expansion over a substantially shorter propagation length than an equivalent single-mode expander. Differing design constraints for a mode expander (smaller size vs. higher coupling efficiency) may dictate which type of beam expander might be employed (multi-mode vs. single mode). Adaptations described hereinabove for reducing or substantially eliminating leakage of an expanded optical mode from a waveguide into an underlying substrate may be implemented for a multi-mode expander as well.

Figure 20A:
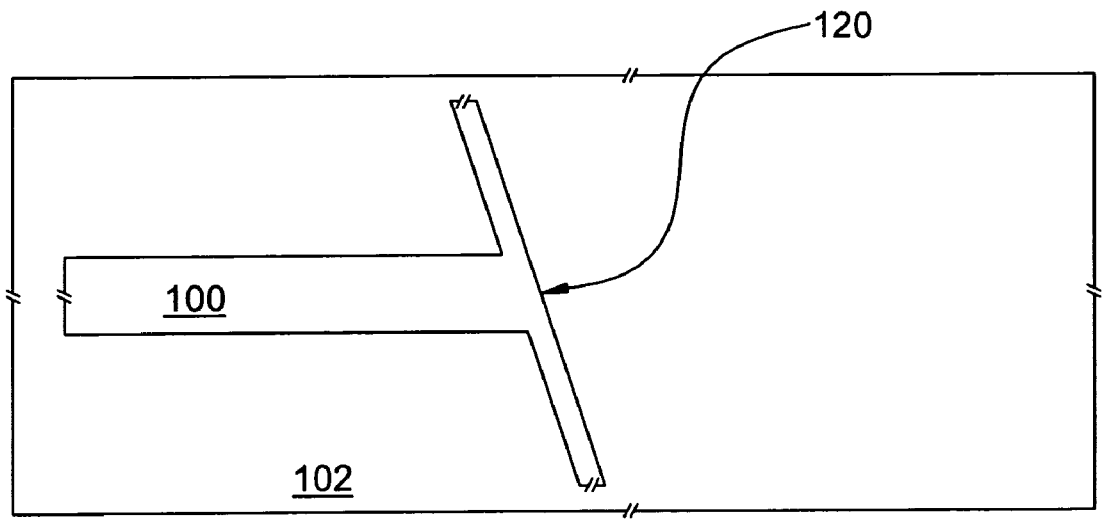
FIGS. 20A and 20B are top views of exemplary optical device waveguides with non-normal end faces.
Figure 20B:
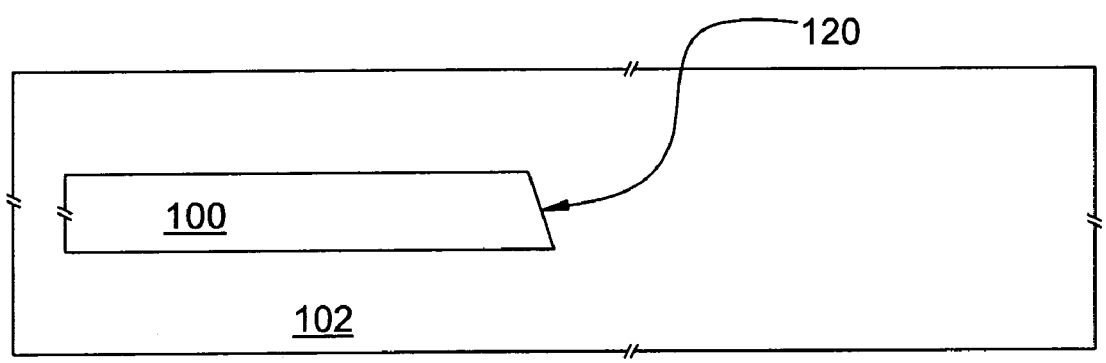
Figure 21A:
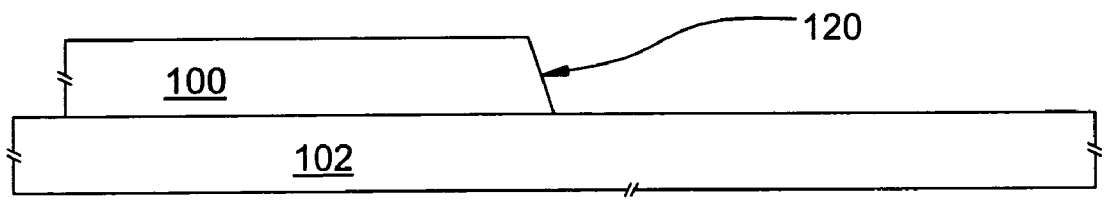
FIGS. 21A and 21B are side views of exemplary optical device waveguides with non-normal end faces.
Figure 21B:
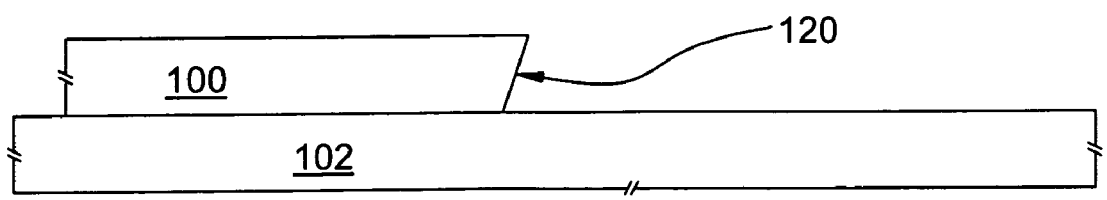
Figure 22:
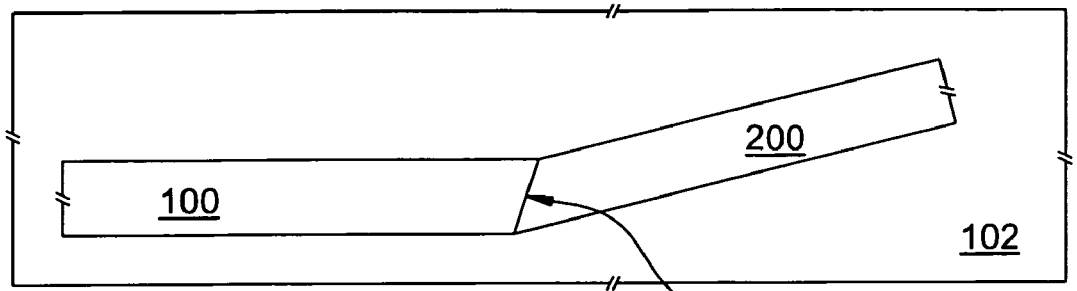
FIG. 22 is a top view of an exemplary optical device waveguide with a non-normal end face and integrated waveguide.
Figure 23A:
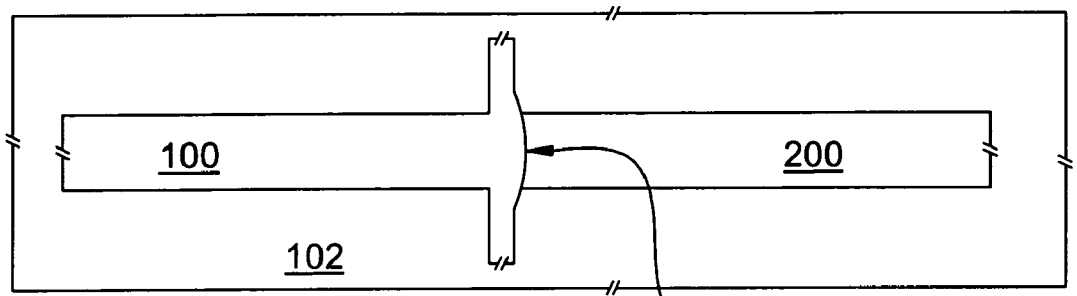
FIGS. 23A and 23B are top views of exemplary optical device waveguides with curved end faces and integrated waveguides.
Figure 23B:
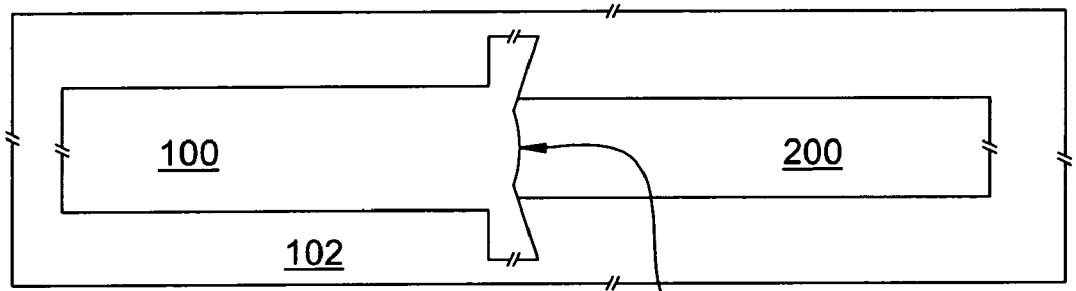
Figure 24:
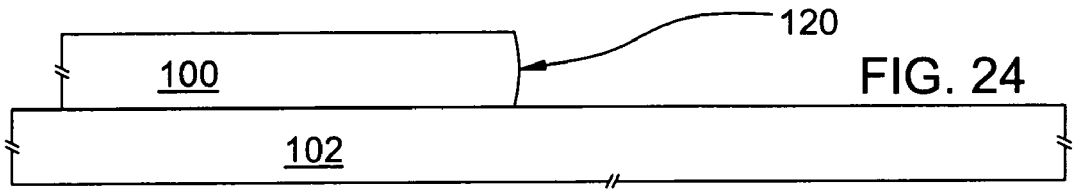
FIG. 24 is a side view of an exemplary optical device waveguide with a curved end face.

Diffractive optical loss from waveguide segment(s) lacking substantially complete transverse optical confinement may be reduced by suitable adaptation of the surface profile of device waveguide end face 120. Adaptation of the surface profile of device waveguide end face 120 may be implemented for achieving other purposes as well. Various surface profiles may be provided for end face 120. A substantially planar end face 120 may be provided, and the end face may be substantially vertical and substantially normal to the propagation direction supported at the end of the semiconductor device waveguide 100 (FIGS. 1A/1B). A planar end face 120 may be provided that is not normal to this propagation direction, if needed or desired, so that any reflection from the end face 120 does not propagate back through the device waveguide structure. This may be particularly relevant for reducing reflective feedback into a semiconductor laser waveguide from the end face. For many spatially-selective material processing techniques, such a non-normal substantially planar end face may be most readily provided tilted horizontally (FIGS. 20A/20B). Other spatially selective material processing techniques (including but not limited to anisotropic or directional etching, gray-scale lithography, or other suitable technique(s)) may be employed so as to form a non-normal substantially planar end face tilted in a vertical direction (FIGS. 21A/21B). A non-normal end face 120 may be provided tilted in both horizontal and vertical directions (not shown). If a non-normal end face 120 is provided for device waveguide 100, refraction at the end face must be accounted for when designing the proper position and orientation of integrated end-coupled waveguide 200. In general, if the end face 120 is non-normal, then the waveguides 100 and 200 will not be collinear (FIG. 22).

Figure 25:
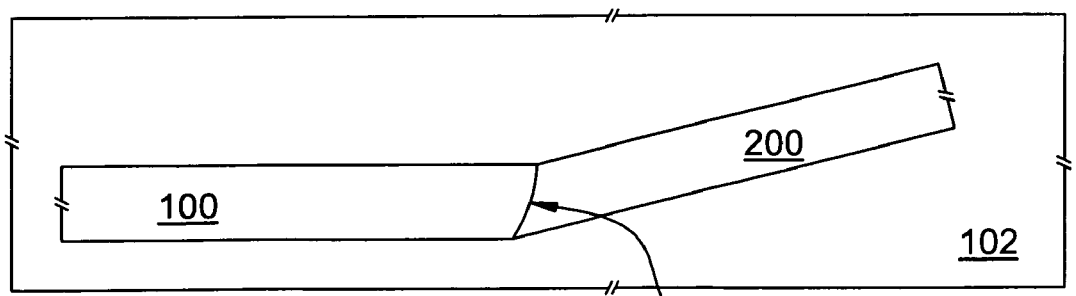
FIG. 25 is a top view of an exemplary optical device waveguide with a curved non-normal end face and integrated waveguide.
Figure 26:
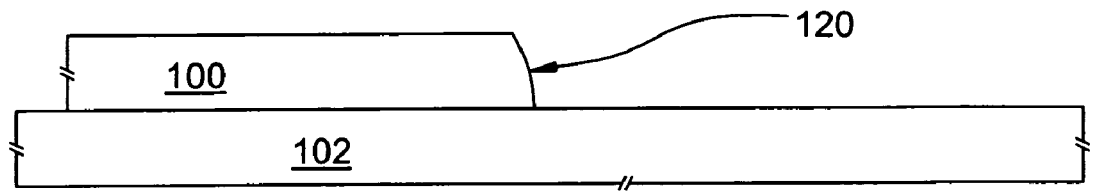
FIG. 26 is a side view of an exemplary optical device waveguide with a curved non-normal end face.
Figure 27:
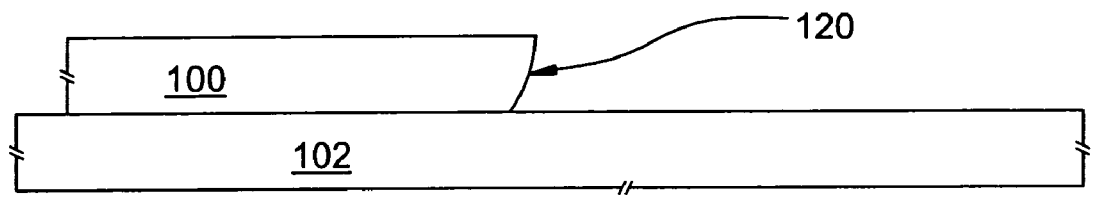
FIG. 27 is a side view of an exemplary optical device waveguide with a curved non-normal end face.
Figure 28:
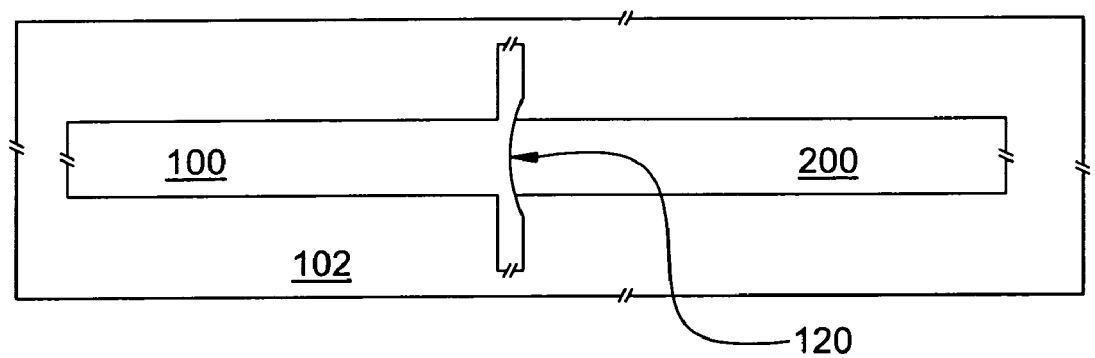
FIG. 28 is a top view of an exemplary optical device waveguide with a curved end face and integrated waveguide.
Figure 29:
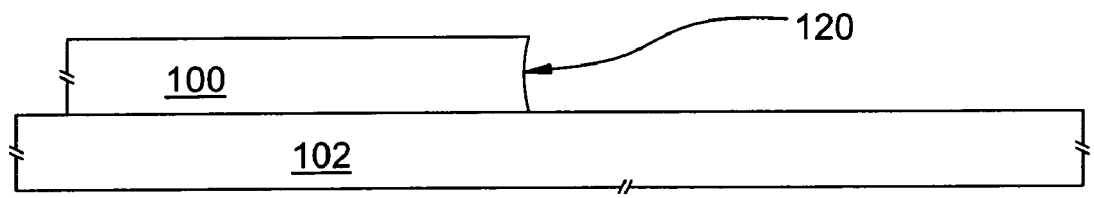
FIG. 29 is a side view of an exemplary optical device waveguide with a curved end face.

A device end face 120 may be employed wherein at least a portion of the end face is curved in at least one dimension, for altering the convergence/divergence properties of optical modes transmitted through and/or reflected from the device end face 120. For example, a convex device waveguide end face 120 may serve to reduce the divergence of, or to make convergent, an optical mode transmitted from the device waveguide 100 into an end-coupled integrated waveguide 200 of lower refractive index (FIGS. 23A, 23B, 24, 25, 26, and 27), thereby increasing optical end-coupling relative to a flat end face. Therefore, suitable design of such a convex waveguide end face may be employed to reduce or substantially eliminate diffractive optical loss from waveguide segments lacking substantially complete transverse optical confinement. In another example, such a convex end face may serve as a concave reflector for coupling a device optical mode back into the device (as a laser end mirror, for instance). In either of the preceding examples, the curved portion of the end face may be limited in transverse extent (FIG. 23B), so as to suppress end-coupling and/or reflective coupling of higher-order device optical modes. If needed or desired, lateral portions of the end face may also be tilted away from normal (as in FIG. 23B) or otherwise adapted for suppressing end-coupling and/or reflective coupling of such higher-order modes. In other examples, a concave end face 120 might be employed if appropriate (FIGS. 28 and 29). A curved end face 120 may be aligned substantially normal to the propagation direction supported at the end of the semiconductor device waveguide 100, in which case the adjacent ends of device waveguide 100 and integrated end-coupled waveguide 200 may be substantially collinear (FIGS. 23A, 23B, 24, 28, and 29). Alternatively, a curved end face 120 may be non-normal (tilted horizontally and/or vertically as in FIGS. 25, 26, and 27; see discussion hereinabove), in which case the device waveguide 100 and integrated end-coupled waveguide 200 would be non-collinear so as to compensate for refraction at non-normal end face 120 (FIG. 25). For many spatially-selective material processing techniques, a curved surface profile for end face 120 may be most readily provided curved in the horizontal dimension (FIGS. 23A, 23B, 24, 25, 28, and 29). Other spatially selective material processing techniques (including but not limited to anisotropic or directional etching, gray-scale lithography, or other suitable technique(s)) may be employed so as to form a curved surface profile for end face 120 curved in the vertical dimension (FIGS. 26, 27, and 29). A curved surface profile for end face 120 may be provided curved in both horizontal and vertical dimensions (not shown).

Multi-mode interference and a curved waveguide end face may be implemented together for reducing diffractive optical loss from waveguide segments lacking substantially complete transverse optical confinement. For example, diffractive optical loss in the vertical direction may be reduced or substantially eliminated using multi-mode interference, by suitable configuration of an intermediate multi-mode waveguide segment (as described hereinabove) along the vertical dimension. In addition, the waveguide end face may also be suitably curved in the horizontal dimension so as to reduce or substantially eliminate diffractive optical loss in the horizontal direction.

Figure 30:
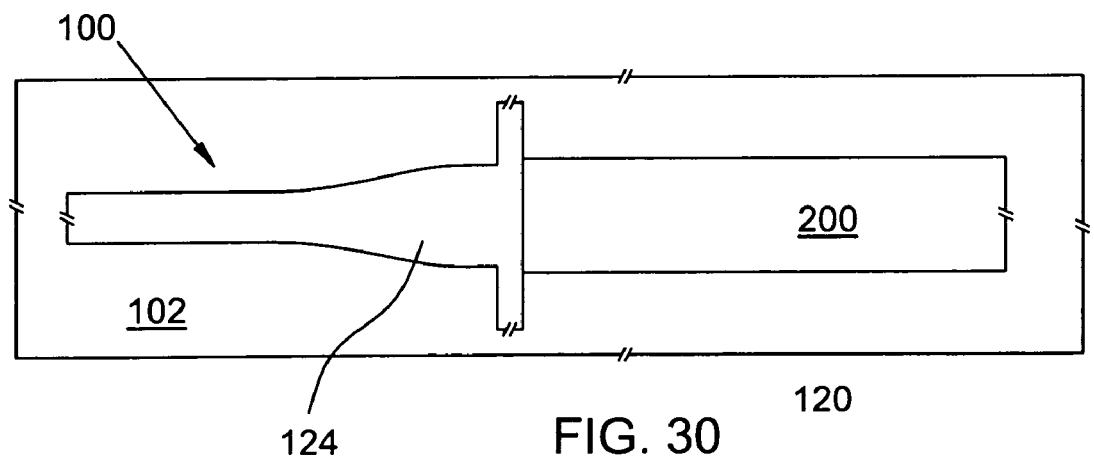
FIG. 30 is a top view of an exemplary optical device waveguide with a flared end segment and integrated waveguide.

In addition to, or instead of, a curved end face 120, device waveguide 100 may be provided with a flared end segment thereof 124 (FIG. 30). A flared end segment 124 for waveguide 100 may in some circumstances more readily enable substantial spatial mode matching with waveguide 200, either directly end-coupled (and perhaps including an intervening waveguide segments lacking substantially complete transverse optical confinement) or end-coupled though multi-mode interference (as described hereinabove). The resulting enlarged optical mode supported by the flared end of the device waveguide may be correspondingly less divergent upon propagation through waveguide segment(s) lacking substantially complete transverse optical confinement, with correspondingly less diffractive optical loss. The flared waveguide end should flare substantially adiabatically (i.e., sufficiently gradually so as to maintain coupling of optical power into unwanted waveguide modes at or below operationally acceptable levels). For many spatially-selective material processing techniques, a flared end 124 for device waveguide 100 may be more readily provided flared in the horizontal dimension (FIG. 30). Other spatially selective material processing techniques (including but not limited to anisotropic or directional etching, gray-scale lithography, or other suitable technique(s)) may be employed so as to form a flared end 124 for waveguide 100 flared in the vertical dimension (not shown). Device waveguide 100 may have a flared end 124 flared in both horizontal and vertical dimensions (not shown).

A variety of adaptations for the structure of device waveguide 100 and end face 120 thereof, and for integrated end-coupled waveguide 200, have been set forth hereinabove, which may be implemented singly or in combination for providing efficiency for optical end-transfer between waveguide 100 and 200 at or above an operationally acceptable level. An operationally acceptable level of optical end-transfer efficiency (i.e., sufficiently high efficiency, or equivalently, sufficiently low optical loss) may be determined by the performance required of a device in a particular application, as well as considerations of cost and complexity of manufacture. For example, in some instances more stringent optical device performance requirements may require/justify additional manufacturing steps, while in other instances device pricing pressures may require elimination of manufacturing steps at the expense of lowered device performance characteristics.

For purposes of the foregoing written description and/or the appended claims, "index" may denote the bulk refractive index of a particular material (also referred to herein as a "material index") or may denote an "effective index" $n_{eff}$, related to the propagation constant $\beta$ of a particular optical mode in a particular optical element by $\beta=2\pi n_{eff}/\lambda$. The effective index may also be referred to herein as a "modal index". As referred to herein, the term "low-index" shall denote any materials and/or optical structures having an index less than about 2.5, while "high-index" shall denote any materials and/or structures having an index greater than about 2.5. Within these bounds, "low-index" may refer to: silica ($SiO_x$), germano-silicate, boro-silicate, other doped silicas, and/or other silica-based materials; silicon nitride ($Si_xN_y$) and/or silicon oxynitrides ($SiO_xN_y$); other glasses; other oxides; various polymers; and/or any other suitable optical materials having indices below about 2.5. "Low-index" may also include optical fiber, optical waveguides, planar optical waveguides, and/or any other optical components incorporating such materials and/or exhibiting a modal index below about 2.5. Similarly, "high-index" may refer to materials such as semiconductors, IR materials, and/or any other suitable optical materials having indices greater than about 2.5, and/or optical waveguides of any suitable type incorporating such material and/or exhibiting a modal index greater than about 2.5. The terms "low-index" and "high-index" are to be distinguished from the terms "lower-index" and "higher-index", also employed herein. "Low-index" and "high-index" refer to an absolute numerical value of the index (greater than or less than about 2.5), while "lower-index" and "higher-index" are relative terms indicating which of two particular materials has the larger index, regardless of the absolute numerical values of the indices.

The term "optical waveguide" (or equivalently, "waveguide") as employed herein shall denote a structure adapted for supporting one or more optical modes. Such waveguides shall typically provide confinement of a supported optical mode in two transverse dimensions while allowing propagation along a longitudinal dimension. The transverse and longitudinal dimensions/directions shall be defined locally for a curved waveguide; the absolute orientations of the transverse and longitudinal dimensions may therefore vary along the length of a curvilinear waveguide, for example. Examples of optical waveguides may include, without being limited to, various types of optical fiber and various types of planar waveguides. The term "planar optical waveguide" (or equivalently, "planar waveguide") as employed herein shall denote any optical waveguide that is provided on a substantially planar substrate. The longitudinal dimension (i.e., the propagation dimension) shall be considered substantially parallel to the substrate. A transverse dimension substantially parallel to the substrate may be referred to as a lateral or horizontal dimension, while a transverse dimension substantially perpendicular to the substrate may be referred to as a vertical dimension. Examples of such waveguides include ridge waveguides, buried waveguides, semiconductor waveguides, other high-index waveguides ("high-index" being above about 2.5), silica-based waveguides, polymer waveguides, other low-index waveguides ("low-index" being below about 2.5), core/clad type waveguides, multi-layer reflector (MLR) waveguides, metal-clad waveguides, air-guided waveguides, vacuum-guided waveguides, photonic crystal-based or photonic bandgap-based waveguides, waveguides incorporating electro-optic (EO) and/or electro-absorptive (EA) materials, waveguides incorporating non-linear-optical (NLO) materials, and myriad other examples not explicitly set forth herein which may nevertheless fall within the scope of the present disclosure and/or appended claims. Many suitable substrate materials may be employed, including semiconductor, crystalline, silica or silica-based, other glasses, ceramic, metal, and myriad other examples not explicitly set forth herein which may nevertheless fall within the scope of the present disclosure and/or appended claims.

One exemplary type of planar optical waveguide that may be suitable for use with optical components disclosed herein is a so-called PLC waveguide (Planar Lightwave Circuit). Such waveguides typically comprise silica or silica-based waveguides (often ridge or buried waveguides; other waveguide configuration may also be employed) supported on a substantially planar silicon substrate (often with an interposed silica or silica-based optical buffer layer). Sets of one or more such waveguides may be referred to as planar waveguide circuits, optical integrated circuits, or opto-electronic integrated circuits. A PLC substrate with one or more PLC waveguides may be readily adapted for mounting one or more optical sources, lasers, modulators, and/or other optical devices adapted for end-transfer of optical power with a suitably adapted PLC waveguide. A PLC substrate with one or more PLC waveguides may be readily adapted (according to the teachings of U.S. patent application Pub. Ser. No. 2003/0081902 and/or U.S. App. No. 60/466,799) for mounting one or more optical sources, lasers, modulators, photodetectors, and/or other optical devices adapted for transverse-transfer of optical power with a suitably adapted PLC waveguide (mode-interference-coupled, or substantially adiabatic, transverse-transfer; also referred to as transverse-coupling).

For purposes of the foregoing written description and/or appended claims, "spatially-selective material processing techniques" shall encompass epitaxy, layer growth, lithography, photolithography, evaporative deposition, sputtering, vapor deposition, chemical vapor deposition, beam deposition, beam-assisted deposition, ion beam deposition, ion-beam-assisted deposition, plasma-assisted deposition, wet etching, dry etching, ion etching (including reactive ion etching), ion milling, laser machining, spin deposition, spray-on deposition, electrochemical plating or deposition, electroless plating, photo-resists, UV curing and/or densification, micro-machining using precision saws and/or other mechanical cutting/shaping tools, selective metallization and/or solder deposition, chemical-mechanical polishing for planarizing, any other suitable spatially-selective material processing techniques, combinations thereof, and/or functional equivalents thereof. In particular, it should be noted that any step involving "spatially-selectively providing" a layer or structure may involve either or both of: spatially-selective deposition and/or growth, or substantially uniform deposition and/or growth (over a given area) followed by spatially-selective removal. Any spatially-selective deposition, removal, or other process may be a so-called direct-write process, or may be a masked process. It should be noted that any "layer" referred to herein may comprise a substantially homogeneous material layer, or may comprise an inhomogeneous set of one or more material sub-layers. Spatially-selective material processing techniques may be implemented on a wafer scale for simultaneous fabrication/processing of multiple structures on a common substrate wafer.

The term "optical device" or "semiconductor optical device" as used herein may denote a device providing optical functionality (passive and/or active) wherein at least a portion of the device comprises suitably configured semiconductor material(s). The terms "device", "optical device", and/or "semiconductor optical device" as used herein may denote only the semiconductor portion of an optical device, or may denote an overall optical device structure or assembly of which only a portion comprises semiconductor material(s) (and which may include an integrated end-coupled waveguide as described further hereinbelow). Which of these is intended is typically evident from the context in which the term appears. The term "semiconductor laser" as used herein may denote a semiconductor optical device adapted for providing optical gain upon electrical pumping (i.e., a laser gain medium), or may alternatively refer to an optical resonator (supporting longitudinal optical modes) with such a semiconductor optical gain medium included therein. Which of these is intended is typically evident from the context in which the term appears.

It should be noted that various components, elements, structures, and/or layers described herein as "secured to", "connected to", "mounted on", "deposited on", "formed on", "positioned on", etc., a substrate may make direct contact with the substrate material, or may make contact with one or more layer(s) and/or other intermediate structure(s) already present on the substrate, and may therefore be indirectly "secured to", etc, the substrate.

The phrase "operationally acceptable" appears herein describing levels of various performance parameters of optical components and/or optical devices, such as optical power transfer efficiency (equivalently, optical coupling efficiency), optical loss, undesirable reflection, and so on. An operationally acceptable level may be determined by any relevant set or subset of applicable constraints and/or requirements arising from the performance, fabrication, device yield, assembly, testing, availability, cost, supply, demand, and/or other factors surrounding the manufacture, deployment, and/or use of a particular optical component or assembly. Such "operationally acceptable" levels of such parameters may therefor vary within a given class of devices depending on such constraints and/or requirements. For example, a lower optical coupling efficiency may be an acceptable trade-off for achieving lower device fabrication costs in some instances, while higher optical coupling efficiency may be required in other instances in spite of higher fabrication costs. The "operationally acceptable" coupling efficiency therefore varies between the instances. Many examples of such trade-offs may be imagined, with correspondingly differing definitions of "operationally acceptable". Optical components, planar waveguides, and fabrication and/or assembly methods therefor as disclosed herein, and equivalents thereof, may therefore be implemented within tolerances of varying precision depending on such "operationally acceptable" constraints and/or requirements. Phrases such as "substantially spatial-mode-matched", "substantially index-matched", "so as to substantially avoid undesirable reflection", and so on as used herein shall be construed in light of this notion of "operationally acceptable" performance.

While particular examples have been disclosed herein employing specific materials and/or material combinations and having particular dimensions and configurations, it should be understood that many materials and/or material combinations may be employed in any of a variety of dimensions and/or configurations while remaining within the scope of inventive concepts disclosed and/or claimed herein. It should be pointed out that while wafer-scale processing sequences are set forth as examples, any or all of the processing sequences set forth herein, and/or equivalents thereof, may also be implemented for smaller sets of components, or for individual components, while remaining within the scope of the present disclosure and/or appended claims. It is intended that equivalents of the disclosed exemplary embodiments and methods shall fall within the scope of the present disclosure and/or appended claims. It is intended that the disclosed exemplary embodiments and methods, and equivalents thereof, may be modified while remaining within the scope of the present disclosure and/or appended claims.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: i) it is explicitly stated otherwise, e.g., by use of "either . . . or", "only one of . . . ", or similar language; or ii) two or more of the listed alternatives are mutually exclusive within the particular context, in which case "or" would encompass only those combinations involving non-mutually-exclusive alternatives.

What is claimed is:

1. A method, comprising:
    forming a semiconductor laser on a laser substrate, the laser including a laser waveguide segment;
    forming a laser end face at a distal end of the laser waveguide segment by reactive ion etching so as to leave an outwardly protruding portion of the laser end face extending along the laser substrate from a bottom portion of the laser end face;
    depositing waveguide cladding material on the substrate so as to form a waveguide lower cladding layer;
    depositing waveguide core material over the lower cladding layer so as to form a waveguide core; and
    depositing waveguide cladding material over the waveguide core material and the lower cladding layer so as to form a waveguide upper cladding layer, thereby forming a planar optical waveguide on the laser substrate and the laser end face, the planar optical waveguide being end-coupled at its proximal end to the laser waveguide segment through the laser end face, the end-coupled planar optical waveguide comprising the lower cladding layer, the waveguide core, and the upper cladding layer,
    wherein:
    the outwardly protruding portion of the laser end face extends beneath a proximal portion of the end-coupled waveguide; and
    at least one layer of the end-coupled waveguide decreases in thickness toward the laser end face, the outwardly protruding portion of the laser end face and the decreasing layer thickness together yielding a desired layer surface profile for at least one layer of the end-coupled waveguide.

2. The method of claim 1, wherein a lower cladding layer of the end-coupled waveguide decreases in thickness toward the laser end face, the outwardly protruding portion of the laser end face and the decreasing lower cladding layer thickness together yielding a substantially flat upper surface of the lower cladding layer above the protruding portion of the laser end face.

3. The method of claim 1, wherein a lower cladding layer of the end-coupled waveguide decreases in thickness toward the laser end face, the outwardly protruding portion of the laser end face and the decreasing lower cladding layer thickness together serving to position a proximal end of a core of the end-coupled waveguide for optical end-coupling with the laser.

4. The method of claim 1, wherein the laser comprises at least one III–V semiconductor material.

5. The method of claim 1, further comprising forming an optical coating between the laser end face and the end-coupled waveguide or between the laser substrate and at least a portion of the end-coupled waveguide.

6. The method of claim 5, further comprising forming a reflective coating between the laser end face and the end-coupled waveguide.

7. The method of claim 5, further comprising forming an anti-reflection coating between the laser end face and the end-coupled waveguide.

8. The method of claim 5, further comprising forming a reflective coating between the laser substrate and the end-coupled waveguide.

9. The method of claim 1, wherein the end-coupled waveguide comprises a low-index planar optical waveguide.

10. The method of claim 9, wherein the core material comprises silicon nitride or silicon oxynitride, and the cladding material comprises silica or doped silica.

11. The method of claim 10, wherein the core material or the cladding material is deposited by plasma-enhanced chemical vapor deposition.

12. The method of claim 10, further comprising depositing a doped silica core material layer so as to form a second core of the low-index waveguide.

13. The method of claim 9, further comprising adapting the low-index waveguide for optical transverse-coupling with another optical waveguide.

14. The method of claim 13, further comprising adapting the low-index waveguide for substantially adiabatic optical transverse-coupling with another optical waveguide.

15. The method of claim 9, wherein a proximal portion of the end-coupled waveguide includes waveguide cladding material between the laser end face and a proximal end of the waveguide core, or waveguide core material on the laser end face extending upward from the waveguide core away from the laser substrate.

16. The method of claim 15, wherein the core material or the cladding material is deposited by plasma-enhanced chemical vapor deposition.

17. The method of claim 1, wherein at least a portion of the laser end face is curved in at least one transverse dimension.

18. The method of claim 17, wherein a portion of the laser end face is curved in the horizontal dimension.

19. The method of claim 17, wherein the curved portion of the laser end face is convex.

20. The method of claim 17, wherein the curved portion of the laser end face serves to increase optical end-coupling between the laser waveguide segment and the end-coupled waveguide, relative to a substantially flat laser end face.

21. The method of claim 17, wherein the curved portion of the laser end face is limited in transverse extent so as to suppress higher-order laser optical modes.

22. The method of claim 17, wherein the curved portion of the laser end face serves to increase reflective optical coupling of a laser optical mode back into the laser waveguide segment, relative to a substantially flat laser end face.

23. An optical apparatus, comprising:
a semiconductor laser substrate;
a semiconductor laser formed on the laser substrate and including a laser waveguide segment terminating at a laser end face;
a planar optical waveguide formed on the laser substrate and the laser end face, the planar optical waveguide being end-coupled at its proximal end to the laser waveguide segment through the laser end face, the end-coupled planar optical waveguide including waveguide cladding and a waveguide core; and
a reflective optical coating between the laser substrate and at least a proximal portion of the end-coupled waveguide.

24. The apparatus of claim 23, further comprising a reflective optical coating between the laser end face and the end-coupled waveguide.

25. The apparatus of claim 23, further comprising an anti-reflection optical coating between the laser end face and the end-coupled waveguide.

26. The apparatus of claim 23, wherein:
the laser end face includes an outwardly protruding portion extending along the laser substrate from a bottom portion of the laser end face beneath a proximal portion of the end-coupled waveguide; and
at least one layer of the end-coupled waveguide decreases in thickness toward the laser end face, the outwardly protruding portion of the laser end face and the decreasing layer thickness together yielding a desired layer surface profile for at least one layer of the end-coupled waveguide.

27. The apparatus of claim 26, wherein a lower cladding layer of the end-coupled waveguide decreases in thickness toward the laser end face, the outwardly protruding portion of the laser end face and the decreasing lower cladding layer thickness together yielding a substantially flat upper surface of the lower cladding layer above the protruding portion of the laser end face.

28. The apparatus of claim 26, wherein a lower cladding layer of the end-coupled waveguide decreases in thickness toward the laser end face, the outwardly protruding portion of the laser end face and the decreasing lower cladding layer thickness together serving to position a proximal end of a core of the end-coupled waveguide for optical end-coupling with the laser.

29. The apparatus of claim 23, wherein the laser comprises at least one III-V semiconductor material.

30. The apparatus of claim 23, wherein the end-coupled waveguide comprises a low-index planar optical waveguide.

31. The apparatus of claim 30, wherein the low-index waveguide comprises a core and cladding, the core comprises silicon nitride or silicon oxynitride, and the cladding comprises silica or doped silica.

32. The apparatus of claim 30, wherein the low-index waveguide is adapted for optical transverse-coupling with another optical waveguide.

33. The apparatus of claim 32, wherein the low-index waveguide is adapted for substantially adiabatic optical transverse-coupling with another optical waveguide.

34. The apparatus of claim 30, wherein a proximal portion of the end-coupled waveguide includes waveguide cladding material between the laser end face and a proximal end of the waveguide core, or waveguide core material on the laser end face extending upward from the waveguide core away from the laser substrate.

35. An optical apparatus, comprising:
a semiconductor laser substrate;
a semiconductor laser formed on the laser substrate and including a laser waveguide segment terminating at a laser end face; and
a planar optical waveguide formed on the laser substrate and the laser end face, the planar optical waveguide being end-coupled at its proximal end to the laser waveguide segment through the laser end face, the end-coupled planar optical waveguide including waveguide cladding and a waveguide core,
wherein at least a portion of the laser end face is curved in the horizontal dimension.

36. The apparatus of claim 35, wherein the curved portion of the laser end face is convex.

37. The apparatus of claim 35, wherein the curved portion of the laser end face serves to increase optical end-coupling between the laser waveguide segment and the end-coupled waveguide, relative to a substantially flat laser end face.

38. The apparatus of claim 35, wherein the curved portion of the laser end face is limited in transverse extent so as to suppress higher-order laser optical modes.

39. The apparatus of claim 35, wherein the curved portion of the laser end face serves to increase reflective optical coupling of a laser optical mode back into the laser waveguide segment, relative to a substantially flat laser end face.

40. The apparatus of claim 35, wherein:
the laser end face includes an outwardly protruding portion extending along the laser substrate from a bottom portion of the laser end face beneath a proximal portion of the end-coupled waveguide; and
at least one layer of the end-coupled waveguide decreases in thickness toward the laser end face, the outwardly protruding portion of the laser end face and the decreasing layer thickness together yielding a desired layer surface profile for at least one layer of the end-coupled waveguide.

41. The apparatus of claim 40, wherein a lower cladding layer of the end-coupled waveguide decreases in thickness toward the laser end face, the outwardly protruding portion of the laser end face and the decreasing lower cladding layer thickness together yielding a substantially flat upper surface of the lower cladding layer above the protruding portion of the laser end face.

42. The apparatus of claim 40, wherein a lower cladding layer of the end-coupled waveguide decreases in thickness toward the laser end face, the outwardly protruding portion of the laser end face and the decreasing lower cladding layer thickness together serving to position a proximal end of a core of the end-coupled waveguide for optical end-coupling with the laser.

43. The apparatus of claim 35, wherein the laser comprises at least one III-V semiconductor material.

44. The apparatus of claim 35, wherein the end-coupled waveguide comprises a low-index planar optical waveguide.

45. The apparatus of claim 44, wherein the low-index waveguide comprises a core and cladding, the core comprises silicon nitride or silicon oxynitride, and the cladding comprises silica or doped silica.

46. The apparatus of claim 44, wherein the low-index waveguide is adapted for optical transverse-coupling with another optical waveguide.

47. The apparatus of claim 46, wherein the low-index waveguide is adapted for substantially adiabatic optical transverse-coupling with another optical waveguide.

48. The apparatus of claim 44, wherein a proximal portion of the end-coupled waveguide includes waveguide cladding material between the laser end face and a proximal end of the waveguide core, or waveguide core material on the laser end face extending upward from the waveguide core away from the laser substrate.

49. A method, comprising:
    forming a semiconductor laser on a laser substrate, the laser including a laser waveguide segment terminating at a laser end face;
    forming a reflective optical coating on at least a portion of the substrate adjacent the laser end face;
    depositing waveguide cladding material on the substrate so as to form a waveguide lower cladding layer;
    depositing waveguide core material over the lower cladding layer so as to form a waveguide core; and
    depositing waveguide cladding material over the waveguide core material and the lower cladding layer so as to form a waveguide upper cladding layer, thereby forming a planar optical waveguide on the laser substrate and the laser end face, the planar optical waveguide being end-coupled at its proximal end to the laser waveguide segment through the laser end face, the end-coupled planar optical waveguide comprising the lower cladding layer, the waveguide core, and the upper cladding layer,
    wherein the reflective optical coating is positioned between the laser substrate and at least a proximal portion of the end-coupled waveguide.

50. The method of claim 49, further comprising forming a reflective coating between the laser end face and the end-coupled waveguide.

51. The method of claim 49, further comprising forming an anti-reflection coating between the laser end face and the end-coupled waveguide.

52. The method of claim 49, wherein:
    the laser end face includes an outwardly protruding portion extending along the laser substrate from a bottom portion of the laser end face beneath a proximal portion of the end-coupled waveguide; and
    at least one layer of the end-coupled waveguide decreases in thickness toward the laser end face, the outwardly protruding portion of the laser end face and the decreasing layer thickness together yielding a desired layer surface profile for at least one layer of the end-coupled waveguide.

53. The method of claim 52, wherein a lower cladding layer of the end-coupled waveguide decreases in thickness toward the laser end face, the outwardly protruding portion of the laser end face and the decreasing lower cladding layer thickness together yielding a substantially flat upper surface of the lower cladding layer above the protruding portion of the laser end face.

54. The method of claim 52, wherein a lower cladding layer of the end-coupled waveguide decreases in thickness toward the laser end face, the outwardly protruding portion of the laser end face and the decreasing lower cladding layer thickness together serving to position a proximal end of a core of the end-coupled waveguide for optical end-coupling with the laser.

55. The method of claim 49, wherein the laser end face is formed by reactive ion etching.

56. The method of claim 49, wherein the laser comprises at least one III-V semiconductor material.

57. The method of claim 49, wherein the end-coupled waveguide comprises a low-index planar optical waveguide.

58. The method of claim 57, wherein the core material comprises silicon nitride or silicon oxynitride, and the cladding material comprises silica or doped silica.

59. The method of claim 58, wherein the core material or the cladding material is deposited by plasma-enhanced chemical vapor deposition.

60. The method of claim 57, further comprising adapting the low-index waveguide for optical transverse-coupling with another optical waveguide.

61. The method of claim 60, further comprising adapting the low-index waveguide for substantially adiabatic optical transverse-coupling with another optical waveguide.

62. The method of claim 57, wherein a proximal portion of the end-coupled waveguide includes waveguide cladding material between the laser end face and a proximal end of the waveguide core, or waveguide core material on the laser end face extending upward from the waveguide core away from the laser substrate.

63. A method, comprising:
    forming a semiconductor laser on a laser substrate, the laser including a laser waveguide segment terminating at a laser end face;
    depositing waveguide cladding material on the substrate so as to form a waveguide lower cladding layer;
    depositing waveguide core material over the lower cladding layer so as to form a waveguide core; and
    depositing waveguide cladding material over the waveguide core material and the lower cladding layer so as to form a waveguide upper cladding layer, thereby forming a planar optical waveguide on the laser substrate and the laser end face, the planar optical waveguide being end-coupled at its proximal end to the laser waveguide segment through the laser end face, the end-coupled planar optical waveguide comprising the lower cladding layer, the waveguide core, and the upper cladding layer,
    wherein at least a portion of the laser end face is curved in the horizontal dimension.

64. The method of claim 63, wherein the curved portion of the laser end face is convex.

65. The method of claim 63, wherein the curved portion of the laser end face serves to increase optical end-coupling between the laser waveguide segment and the end-coupled waveguide, relative to a substantially flat laser end face.

66. The method of claim 63, wherein the curved portion of the laser end face is limited in transverse extent so as to suppress higher-order laser optical modes.

67. The method of claim 63, wherein the curved portion of the laser end face serves to increase reflective optical coupling of a laser optical mode back into the laser waveguide segment, relative to a substantially flat laser end face.

68. The method of claim 63, wherein:
the laser end face includes an outwardly protruding portion extending along the laser substrate from a bottom portion of the laser end face beneath a proximal portion of the end-coupled waveguide; and
at least one layer of the end-coupled waveguide decreases in thickness toward the laser end face, the outwardly protruding portion of the laser end face and the decreasing layer thickness together yielding a desired layer surface profile for at least one layer of the end-coupled waveguide.

69. The method of claim 68, wherein a lower cladding layer of the end-coupled waveguide decreases in thickness toward the laser end face, the outwardly protruding portion of the laser end face and the decreasing lower cladding layer thickness together yielding a substantially flat upper surface of the lower cladding layer above the protruding portion of the laser end face.

70. The method of claim 68, wherein a lower cladding layer of the end-coupled waveguide decreases in thickness toward the laser end face, the outwardly protruding portion of the laser end face and the decreasing lower cladding layer thickness together serving to position a proximal end of a core of the end-coupled waveguide for optical end-coupling with the laser.

71. The method of claim 63, wherein the laser end face is formed by reactive ion etching.

72. The method of claim 63, wherein the laser comprises at least one III-V semiconductor material.

73. The method of claim 63, wherein the end-coupled waveguide comprises a low-index planar optical waveguide.

74. The method of claim 73, wherein the core material comprises silicon nitride or silicon oxynitride, and the cladding material comprises silica or doped silica.

75. The method of claim 74, wherein the core material or the cladding material is deposited by plasma-enhanced chemical vapor deposition.

76. The method of claim 73, further comprising adapting the low-index waveguide for optical transverse-coupling with another optical waveguide.

77. The method of claim 76, further comprising adapting the low-index waveguide for substantially adiabatic optical transverse-coupling with another optical waveguide.

78. The method of claim 73, wherein a proximal portion of the end-coupled waveguide includes waveguide cladding material between the laser end face and a proximal end of the waveguide core, or waveguide core material on the laser end face extending upward from the waveguide core away from the laser substrate.

* * * * *